(12) United States Patent
Kim et al.

(10) Patent No.: US 9,022,632 B2
(45) Date of Patent: May 5, 2015

(54) LED PACKAGE AND A BACKLIGHT UNIT UNIT COMPRISING SAID LED PACKAGE

(75) Inventors: Geun-Young Kim, Seoul (KR); Tomohisa Onishi, Suwon (KR); Jung-Hun Lee, Seoul (KR); Young-Taek Kim, Hwaseong (KR); Jong-Jin Park, Daejeon (KR); Mi-Jeong Yun, Daejeon (KR); Young-Sam Park, Seoul (KR); Hun-Joo Hahm, Seongnam (KR); Hyung-Suk Kim, Suwon (KR); Seong-Yeon Han, Gwangju (KR); Do-Hun Kim, Seoul (KR); Dae-Yeon Kim, Suwon (KR); Dae-Hyun Kim, Ulsan (KR); Jung-Kyu Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 879 days.

(21) Appl. No.: 13/002,419

(22) PCT Filed: Jul. 3, 2009

(86) PCT No.: PCT/KR2009/003659
§ 371 (c)(1),
(2), (4) Date: Mar. 29, 2011

(87) PCT Pub. No.: WO2010/002226
PCT Pub. Date: Jan. 7, 2010

(65) Prior Publication Data
US 2011/0199787 A1 Aug. 18, 2011

(30) Foreign Application Priority Data

| Jul. 3, 2008 | (KR) | 10-2008-0064367 |
| Jul. 25, 2008 | (KR) | 10-2008-0072564 |
| Sep. 23, 2008 | (KR) | 10-2008-0093102 |
| Oct. 24, 2008 | (KR) | 10-2008-0104721 |
| Oct. 24, 2008 | (KR) | 10-2008-0104722 |
| Jan. 13, 2009 | (KR) | 10-2009-0002788 |
| Jan. 23, 2009 | (KR) | 10-2009-0006340 |
| Jul. 3, 2009 | (KR) | 10-2009-0060886 |

(51) Int. Cl.
*G09F 13/04* (2006.01)
*G09F 13/08* (2006.01)
(Continued)

(52) U.S. Cl.
CPC ........ *G02B 6/0023* (2013.01); *G02F 1/133606* (2013.01); *G02F 2001/133601* (2013.01);
(Continued)

(58) Field of Classification Search
USPC ......... 362/97.3, 613, 612, 616; 257/678, 684, 257/693, 696, 730, 734
See application file for complete search history.

(56) References Cited

U.S. PATENT DOCUMENTS 5,706,177 A * 1/1998 Nather et al. .................. 361/768
6,060,729 A * 5/2000 Suzuki et al. .................... 257/99
(Continued)

FOREIGN PATENT DOCUMENTS

| CN | 1423347 A | 6/2003 |
| JP | 2001-185763 A | 7/2001 |

(Continued)

OTHER PUBLICATIONS

"Surround_Definition" accessed at http://www.merriam-webster.com/dictionary/surround on Jun. 18, 2014.*
(Continued)

*Primary Examiner* — Ismael Negron
*Assistant Examiner* — Erin Kryukova
(74) *Attorney, Agent, or Firm* — Sughrue Mion, PLLC

(57) ABSTRACT

A light emitting diode (LED) package includes: a main body mounted on a substrate; a light emitting diode that is mounted in the main body and emits light; and a lead frame exposed to allow the main body to be selectively top-mounted or side-mounted. A backlight unit includes: a light guide plate configured to allow a light source to proceed to a liquid crystal panel; a light emitting diode (LED) mounted in a main body mounted on a substrate and generating a light source; and an LED package having a lead frame exposed to allow the main body to be selectively top-mounted or side-mounted, and being mounted on the light guide plate.

32 Claims, 71 Drawing Sheets

(51) Int. Cl.
*F21V 7/04* (2006.01)
*H01L 23/02* (2006.01)
*H01L 23/48* (2006.01)
*F21V 8/00* (2006.01)
*G02F 1/1335* (2006.01)
*H01L 33/48* (2010.01)
*H01L 33/58* (2010.01)

(52) U.S. Cl.
CPC ... *G02F2001/133607* (2013.01); *H01L 33/486* (2013.01); *H01L 33/58* (2013.01); *H01L 2224/48091* (2013.01); *H01L 2224/48227* (2013.01); *H01L 2224/48137* (2013.01); *H01L 2924/01322* (2013.01); *H01L 2924/3025* (2013.01)

(56) References Cited

U.S. PATENT DOCUMENTS

| | | | |
|---|---|---|---|
| 6,344,689 B1 * | 2/2002 | Suzuki et al. | 257/731 |
| 6,480,389 B1 * | 11/2002 | Shie et al. | 361/707 |
| 6,486,543 B1 * | 11/2002 | Sano et al. | 257/684 |
| 6,561,680 B1 * | 5/2003 | Shih | 362/294 |
| 6,603,148 B1 * | 8/2003 | Sano et al. | 257/98 |
| 6,680,568 B2 * | 1/2004 | Fujiwara et al. | 313/501 |
| 6,864,567 B2 * | 3/2005 | Yu | 257/676 |
| 6,995,510 B2 * | 2/2006 | Murakami et al. | 313/512 |
| 7,080,933 B2 | 7/2006 | Chen et al. | |
| 7,138,667 B2 * | 11/2006 | Barnett et al. | 257/99 |
| 7,157,853 B2 * | 1/2007 | Imai et al. | 313/512 |
| 7,186,013 B2 | 3/2007 | Jeong et al. | |
| 7,188,988 B2 | 3/2007 | Koganezawa | |
| 7,205,575 B2 * | 4/2007 | Chin et al. | 257/88 |
| 7,311,431 B2 * | 12/2007 | Chew et al. | 362/613 |
| 7,413,334 B2 | 8/2008 | Baba | |
| 8,189,135 B2 * | 5/2012 | Bae et al. | 349/61 |
| 2002/0163001 A1 * | 11/2002 | Shaddock | 257/79 |
| 2003/0107316 A1 | 6/2003 | Murakami et al. | |
| 2004/0008952 A1 | 1/2004 | Kragl | |
| 2004/0065894 A1 | 4/2004 | Hashimoto et al. | |
| 2005/0280017 A1 | 12/2005 | Osho et al. | |
| 2006/0054912 A1 | 3/2006 | Murakami et al. | |
| 2006/0221638 A1 * | 10/2006 | Chew et al. | 362/613 |
| 2007/0080337 A1 * | 4/2007 | Sorg | 257/13 |
| 2007/0126356 A1 * | 6/2007 | Tanda et al. | 313/512 |
| 2007/0145403 A1 | 6/2007 | Tomioka et al. | |
| 2007/0170563 A1 * | 7/2007 | Chen | 257/678 |
| 2008/0048201 A1 | 2/2008 | Kim et al. | |
| 2008/0121921 A1 | 5/2008 | Loh et al. | |
| 2008/0230790 A1 * | 9/2008 | Seko et al. | 257/89 |
| 2008/0266896 A1 | 10/2008 | Chang | |
| 2009/0273732 A1 | 11/2009 | Shimura et al. | |
| 2009/0273733 A1 | 11/2009 | Shimura et al. | |
| 2009/0316074 A1 | 12/2009 | Tomiyoshi | |

FOREIGN PATENT DOCUMENTS

| | | |
|---|---|---|
| JP | 2001-511956 A | 8/2001 |
| JP | 2003-152225 A | 5/2003 |
| JP | 2003-174200 A | 6/2003 |
| JP | 2004-520612 A | 7/2004 |
| JP | 2006-080251 A | 3/2006 |
| JP | 2006-237141 A | 9/2006 |
| JP | 2006-287032 A | 10/2006 |
| JP | 2007-096325 A | 4/2007 |
| KR | 10-0634189 B1 | 10/2006 |
| KR | 10-0719282 B1 | 5/2007 |
| KR | 10-2007-0098193 A | 10/2007 |
| KR | 10-2007-0104149 A | 10/2007 |
| KR | 10-0778278 B1 | 11/2007 |
| WO | WO 99/31738 A2 | 6/1999 |
| WO | WO 2007/073062 A1 | 6/2007 |

OTHER PUBLICATIONS

Office Action dated Nov. 30, 2011, issued by the USPTO in corresponding U.S. Appl. No. 12/204,260.
Communication issued Aug. 29, 2012 by the State Intellectual Property Office of the People's Republic of China in counterpart Chinese Application No. 200980134881.3.
Communication dated Sep. 13, 2011, issued by the Japanese Patent Office in corresponding Japanese Patent Application No. 2008-241769.
Written Opinion from the International Searching Authority issued on Mar. 2, 2010 in corresponding International Patent Application No. PCT/KR2009/003659.
Communication dated Feb. 22, 2013 issued by the Taiwanese Patent Office in counterpart Taiwanese Application No. 098122738.
Communication dated Mar. 14, 2011, issued by the Korean Intellectual Property Office in counterpart Korean Patent Application No. 10-2009-0060886.
International Search Report (PCT/ISA/210), issued Mar. 2, 2010 in PCT/KR2009/003659.

* cited by examiner

|   | 1 | 0 |
|---|---|---|
| 0 | 1/2 | 0 |
| 1 | 1/2+1/2 | 1/2 |

FIG. 70A

|   | 1 | 0 | 1/2 |   |
|---|---|---|-----|---|
| 0 | 1/3+1/6 | 1/6+1/6 | 1/6+1/6+1/3 | 1/2 |
| 1 | 1/3+1/3 | 1/3+1/6 | 1/3+1/6+1/3 | 0 |
| 1/2 | 1/3+1/6 | 1/6+1/6 | 1/3+1/6+1/6 | 0 |
|   | 0 | 1/2 | 1 |   |

FIG. 70B

LED PACKAGE AND A BACKLIGHT UNIT UNIT COMPRISING SAID LED PACKAGE

TECHNICAL FIELD

The present invention relates to an LED package and a backlight unit having the LED package and, more particularly, to an LED package including an LED light source that emits light externally so as to be used as an illumination unit, and a backlight unit including the LED package and a light guide plate.

BACKGROUND ART

In general, a backlight unit has many advantages in that it is light, thin, driven with low power consumption, implements high resolution, and the like. Thus, currently, CRTs used in display devices are being replaced by liquid crystal displays (LCDs) including a backlight unit.

The backlight unit emits light and provides it to a liquid crystal panel. The liquid crystal panel may adjust light transmittance provided from the backlight unit to display an image.

In general, an LED package mounted in the backlight unit may be divided into an edge type (side view method) LED package and a direct type (top view method) LED package according to where the LED package is mounted in the backlight.

Here, the edge type LED package has a structure in which an LED is installed at the side of a light guide plate. In this case, the LED is mounted to be perpendicular to a substrate to allow light emitted from the LED to be emitted toward the substrate.

The direct type LED package has a structure in which an LED is mounted to be horizontal to a substrate. Namely, a plurality of lamps are disposed on a lower surface of a light guide plate to allow light to be emitted toward a front surface of the light guide plate.

Thus, LED packages are manufactured according to their intended purposes, not allowing for compatible use (i.e., interchangeability), so a technique for a compatible LED package that can be used interchangeably according to intended purpose is required.

DISCLOSURE

Technical Problem

An aspect of the present invention provides an LED package that can be used interchangeably as an edge type (side view type) and a direct type (direct type) and a backlight unit having a structure allowing for local dimming by using such an LED package.

Technical Solution

According to an aspect of the present invention, there is provided an LED package including: a main body mounted on a substrate; an LED that is mounted in the main body and emits light; and a lead frame exposed to allow the main body to be selectively top-mounted or side-mounted.

The lead frame may include: a top electrode electrically connected with the substrate to allow the LED to face a front surface of the substrate; a bent portion integrally formed with the top electrode and bent toward a different side from the top electrode; and a side electrode formed at an end portion of the bent portion and electrically connected to the substrate to allow the LED to be mounted to be perpendicular to the substrate.

The side electrode may be mounted at one side of the main body.

The top electrode may be formed in an elongated manner on a lower surface of the main body.

The top electrode may be mounted at one side of the main body.

The side electrode may be formed in an elongated manner on the other side of the main body to increase a mounting area with the board.

According to another aspect of the present invention, there is provided an LED package including: a main body mounted on a substrate; an LED mounted in the main body; a lead frame electrically connected with the LED; and a contact portion formed on the surface of the main body and providing a mounting area to be mounted on the substrate.

The lead frame may be exposed to allow the main body to be side-mounted or top-mounted.

The lead frame may include: a top electrode electrically connected with the substrate to allow the LED to face a front surface of the substrate; a bent portion integrally formed with the top electrode and bent toward a different side from the top electrode; and a side electrode formed at an end portion of the bent portion and electrically connected to the substrate to allow the LED to be mounted to be perpendicular to the substrate.

The side electrode may be mounted at one side of the main body.

The top electrode may be formed in an elongated manner on a lower surface of the main body to increase a mounting area with the board.

The top electrode may be mounted at one side of the main body.

The side electrode may be formed in an elongated manner on the other side of the main body to increase a mounting area with the board.

The contact portion may be formed at a central portion of the main body.

The contact portion may be mounted at the side of the main body and having an end bent toward the substrate.

The contact portion and the lead frame may be integrally formed.

The lead frame may be bent to be dented inwardly to have a receiving portion for receiving the LED chip therein.

According to another aspect of the present invention, there is provided a backlight unit including: a light guide plate configured to allow a light source to proceed to a liquid crystal panel; an LED mounted in a main body mounted on a substrate and generating a light source; and an LED package having a lead frame exposed to allow the main body to be selectively top-mounted or side-mounted, and being mounted on the light guide plate.

The lead frame may include: a top electrode electrically connected with the substrate to allow the LED to face a front surface of the substrate; a bent portion integrally formed with the top electrode and bent toward a different side from the top electrode; and a side electrode formed at an end portion of the bent portion and electrically connected to the substrate to allow the LED to be mounted to be perpendicular to the substrate.

The backlight unit may further include a contact portion formed on the surface of the main body and providing a mounting area to be mounted on the substrate.

The contact portion and the lead frame may be integrally formed.

The contact portion may be formed at a central portion of the main body.

The contact portion may be mounted at the side of the main body and have an end portion bent toward the substrate.

A plurality of light guiding plates are integrally formed.

The backlight unit may further include: a reflection plate disposed at a lower portion of the light guide plate.

The backlight unit may further include: an optical sheet disposed at an upper portion of the light guide plate.

DESCRIPTION OF DRAWINGS

FIG. 57b is a partial perspective view showing the light guide plate of FIG. 51a;

FIG. 58b is a partial perspective view showing the light guide plate of FIG. 52a;

FIG. 70 illustrates the principle of local dimming implemented in the backlight unit according to an exemplary embodiment of the present invention;

MODE FOR INVENTION

Figure 1:
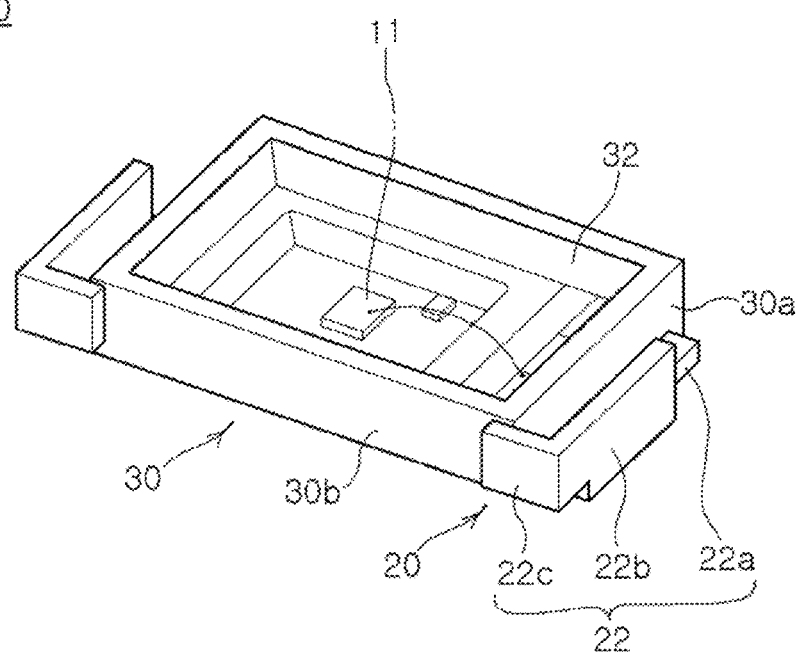
FIG. 1 is a perspective view of an LED package according to a first exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

An LED package and a backlight unit according to exemplary embodiments of the present invention will now be described with reference to FIGS. 1 to 119.

<LED Package>

Figure 2:
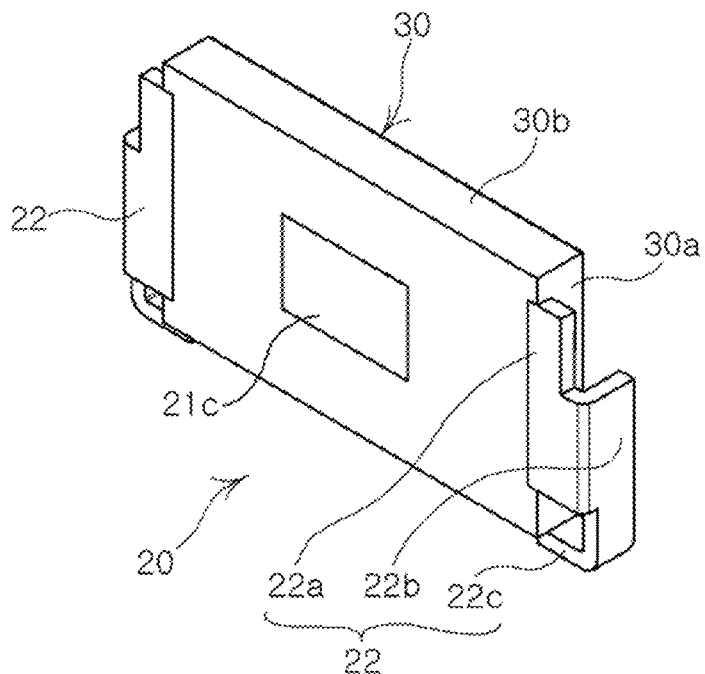
FIG. 2 is a perspective view showing a rear surface of the LED package of FIG. 1.
Figure 3:
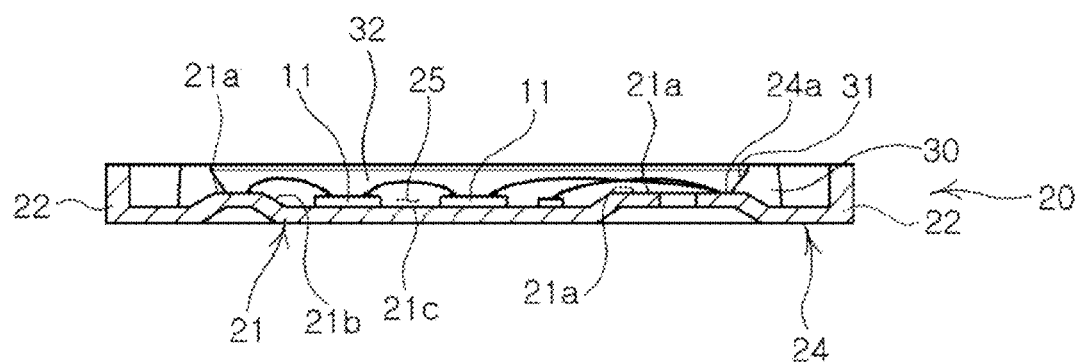
FIG. 3 is a sectional view of the LED package of FIG. 1.

FIG. 1 is a perspective view of an LED package according to a first exemplary embodiment of the present invention, FIG. 2 is a perspective view showing a rear surface of the LED package of FIG. 1, and FIG. 3 is a sectional view of the LED package of FIG. 1.

With reference to FIGS. 1 to 3, an LED package 10 includes an LED chip 11, a lead frame 20, and a main body 30.

The LED chip 11, a semiconductor device emitting light by current applied thereto, may include a yellow phosphor, green and red phosphors, or yellow, green, and red phosphors in a blue LED chip to implement white light.

The yellow, green, and red phosphors are excited in order to emit yellow light, green light, and red light, and such yellow light, green light, and red light wavelengths are mixed with a portion of blue light emitted from the blue LED chip in order to output white light.

As the blue LED chip, a generally used group III nitride-based semiconductor may be used. As the nitride-based semiconductor substrate, one of sapphire, spinel ($MgAl_2O_4$), SiC, Si, ZnO, GaAs, GaN substrates may be selected.

The LED chip 11 is an n type nitride semiconductor layer, on which an active layer is formed. The active layer may have one or more quantum well layers which may be made of InGaN and GaN.

A V-shaped distorted structure may be formed on the section of the n type GaN-based semiconductor layer. The V-shaped distorted structure may include both a flat growth surface and a sloped growth surface.

The active layer may further include at least one quantum barrier layer, and the quantum barrier layer may be made of InGaN, GaN, or AlGaN. Here, a band gap of the quantum barrier layer is larger than the quantum well layer.

A p type nitride semiconductor layer is formed on the active layer, including a p type super lattice layer and a p type GaN-based semiconductor layer. Here, the p type super lattice layer may have a multi-layer repetition structure having GaN/InGaN-based, AlGaN/GaN-based, AlGaN/GaN/In-Gan-based layers.

The p type nitride semiconductor layer may include a p type super lattice layer, a p type GaN layer formed on the p type super lattice layer, and a p type GaN contact layer formed on the p type GaN layer.

A transparent electrode and a bonding electrode may additionally be formed on the p type nitride semiconductor layer. The transparent electrode may be a transmissive oxide conductive layer.

Figure 4:
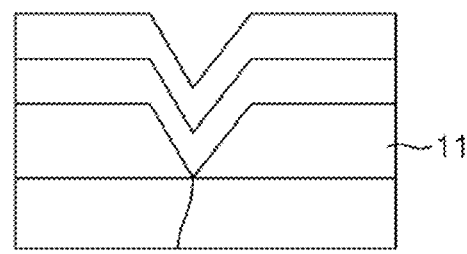
FIG. 4 is a schematic sectional view showing a V-shaped distorted structure formed at an LED layer within an LED chip.

FIG. 4 is a schematic sectional view showing a V-shaped distorted structure formed at an LED layer within an LED chip.

The V-shaped distorted structure may be formed continually on at least one of the n type semiconductor layer, the active layer, and the p type semiconductor layer. The V-shaped distorted structure may be formed around a threading dislocation, and an ESD effect can be improved by preventing a current leakage due to the threading dislocation by increasing resistance at the region. In addition, the V-shaped distorted structure makes the semiconductor surface have an irregular structure, and accordingly, the luminance can be improved.

Namely, the threading dislocation is generated due to the lattice mismatching between the sapphire substrate and the GaN semiconductor formed on the sapphire substrate, and current is concentrated to the threading dislocation when static electricity is applied, causing a current leakage. Thus, various researches have been conducted to reduce damage due to ESD by reducing the threading location causing a leakage current.

Namely, in the present invention, the V-shaped distorted structure is arbitrarily formed around the threading dislocation to increase resistance at the region where the threading dislocation exists to cut off current concentrated thereto to thus improve resistance to ESD. In this case, the V-shaped distorted structure layer may be formed at a low growth temperature of 600° C. to 900° C. or through a chemical etching and re-growth process. The thickness of the blue LED chip completed thusly may be adjusted to have the overall thickness ranging from 50 um to 400 um through a polishing or etching method.

The phosphor may include a fluorescent material, one of wavelength conversion unit among a YAG-based, TAG-based, silicate-based, sulfide-based, and nitride-based phosphor that can convert light generated from the LED chip 11 into white light.

The YAG and TAG-based fluorescent material may be selected from among (Y, Tb, Lu, Sc, La, Gd, Sm)3(Al, Ga, In, Si, Fe)5(O, S)12:Ce and used, and the silicate-based phosphor may be selected from among (Sr, Ba, Ca, Mg)$_2$SiO4: (Eu, F, Cl).

In addition, the sulfide-based phosphor may be selected from among (Ca,Sr)S:Eu, (Sr, Ca,Ba)(Al,Ga)2S4:Eu, and the nitride-based phosphor may be at least one of (Sr, Ca, Si, Al, O)N:Eu (e.g., CaAlSiN4:Eu β-SiAlON:Eu) or Ca-α SiAlON:Eu-based (Ca$_x$,M$_y$)(Si,Al)12(O,N)16, wherein M is at least one of Eu, Tb, Yb, and Er, satisfies 0.05<(x+y)<0.3, 0.02<x<0.27 and 0.03<y<0.3, and is selected from phosphor components and used.

The red phosphor may use a nitride-based phosphor including N (e.g., CaAlSiN3:Eu). The nitride-based phosphor has a better reliability, with respect to external environmental factors such as heat, moisture, and the like, than that of the sulfide-based phosphor, and has a little possibility of discoloration.

In particular, it has a high phosphor excitation efficiency at a dominant wavelength of the blue LED chip limited to a particular range (425 nm to 460 nm) in order to obtain a high reproductivity. Other nitride-based phosphors or sulfide-based phosphors such as Ca$_2$Si$_5$N$_8$:Eu may be used as the red phosphor.

As for the green phosphor, a nitride-based phosphor of β-SiAlON:Eu, or a silicate-based phosphor of (Ba$_x$,Sr$_y$,Mg$_z$)SiO$_4$:Eu$^{2+}$, F, Cl (0<x, y=2, 0=z=2, 0 ppm=F, Cl=5000000 ppm) may be used. Such nitride-based or silicate-based phosphors also have a high excitation efficiency at the dominant wavelength range (425 nm to 460 nm) of the blue LED chip.

Preferably, the half amplitude (F WHN) of the blue LED chip ranges from 10 nm to 50 nm, that of the green phosphor ranges from 30 nm to 150 nm, and that of the blue phosphor ranges from 50 nm to 200 nm. By allowing each light source to have the half amplitude at the above-described range, white light of better color uniformity and better color quality can be obtained.

In particular, because the dominant wavelength and half amplitude of the blue LED chip are limited to the range of 425 nm to 460 nm and 10 nm to 50 nm, respectively, the efficiency of the CaAlSiN$_3$:Eu red phosphor and the β-SiAlON:Eu-based or the (Ba$_x$,Sr$_y$,Mg$_z$)SiO$_4$:Eu$^{2+}$, F, Cl (0<x, y=2, 0=z=2, 0 ppm=F, Cl=5000000 ppm)-based green phosphor can be drastically improved.

The blue LED chip may be changed to an ultraviolet (UV) LED chip having a dominant wavelength range of about 380 nm to 425 nm, and in this case, in order to output white light, at least blue, green and red phosphor must be included in the phosphor 122.

(Ba, Sr, Ca)$_5$(PO$_4$)$_3$Cl:(Eu$^{2+}$, Mn$^{2+}$) or Y$_2$O$_3$:(Bi$^{3+}$, Eu$^{2+}$) may be selected as the blue phosphor, or YAG-based, TAG-based, Silicate-based, Sulfide-based or Nitride-based phosphors may be selected as the green and red phosphors.

Meanwhile, the white LED for outputting white light may be also generated without using phosphors. For example, a second quantum well layer generating a different wavelength (e.g., yellow light) may be additionally formed at an upper portion and/or lower portion of a first quantum well layer to create an LED chip that emits white light in combination with the blue light.

The quantum well layer may have a multi-quantum well structure, and the first and second quantum well layers may be formed by adjusting the amount of InGaN and In used to form the well layer.

If the first quantum well layer emits light in the UV region (380 nm to 425 nm), the amount of the active layer s In may be adjusted such that the second quantum well layer emits blue light and the third quantum well layer emits yellow light.

Figure 5A:
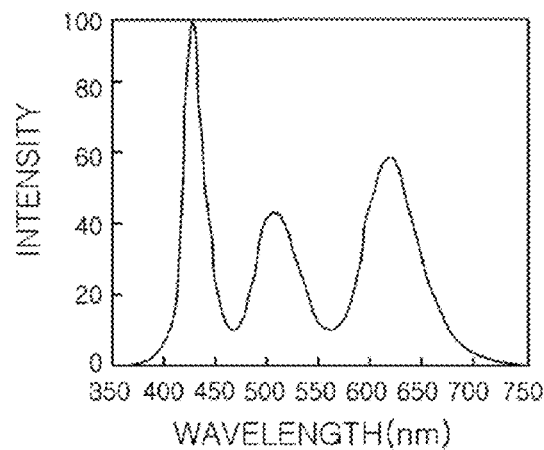
FIG. 5a illustrates an emission spectrum of a white LED according to an exemplary embodiment of the present invention.

FIG. 5a illustrates an emission spectrum of a white LED according to an exemplary embodiment of the present invention. The emission spectrum of FIG. 5a is obtained from a white LED using the combination of the blue LED and nitride-based red phosphor of AAlSiN$_3$:Eu (A: at least one selected from among Ba, Sr, and Ca) and silicate-based green phosphor of A$_2$SiO$_4$:Eu (A: at least one selected from among Ba, Sr, and Ca).

As shown in FIG. 5a, unlike the related art, the emission spectrum has a sufficient intensity of light even in the red and green wavelength region. In particular, a long wavelength visible light region of 600 nm or larger has a sufficiently high intensity of light. In addition, the emission spectrum has blue, green, and red region (RGB region) emission wavelength peaks within 425 nm to 460 nm, 500 nm to 550 nm, 600 nm to 650 nm, and compared with the blue region emission peak, the relative strength of the green region emission peak accounts for about 40% and that of the red region emission peak account for about 60%. Such primary color region emission peaks and their corresponding relative intensities contribute to the implementation of a very high level of color reproductivity (See FIG. 6).

Figure 5B:
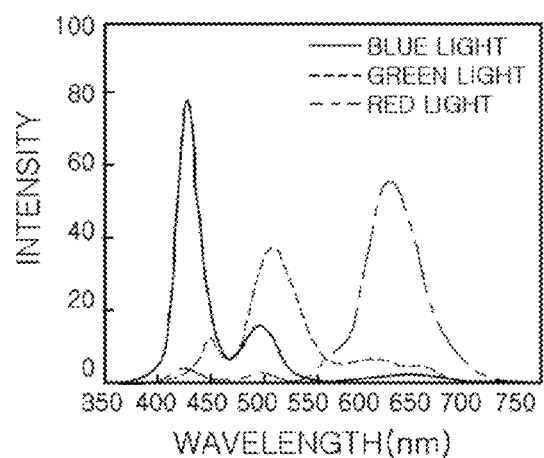
FIG. 5b illustrates spectrums obtained by separating white light having the emission spectrum of FIG. 5a by using blue, green and red color filters.

FIG. 5b illustrates spectrums obtained by separating white light having the emission spectrum of FIG. 5a by using blue, green and red color filters. As shown in FIG. 5b, compared with the white light spectrum (See FIG. 5a) before separation, the spectrums (blue light, green light, and red light spectrums) separated by the respective three primary color filters have substantially similar emission peaks and relative intensities at their peaks. Namely, the blue, green and red light spectrums obtained after the respective color filter transmissions, merely undergoing a neglectable emission peak shift, have substantially the same peak values as the emission peaks (425 nm to 460 nm, 500 nm to 550 nm, and 600 nm to 650 nm) of the RGB regions of the white light before filter transmission. In addition, after the color filter transmissions, the relative intensity at each peak is substantially the same as the relative intensity at each peak. Thus, various color representations very close to natural colors can be made by using the light of the three primary colors obtained after color filter transmissions.

Figure 6:
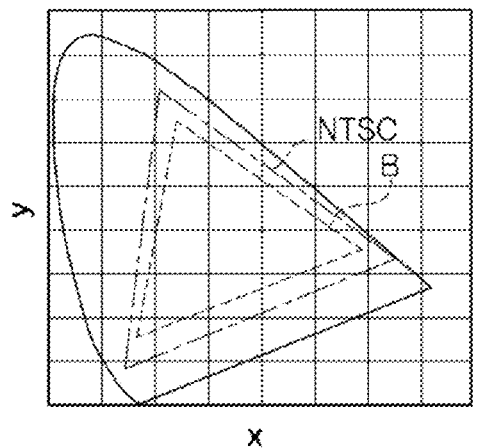
FIG. 6 illustrates a chromaticity diagram showing color reproduction of an LCD in which the white LED element is used for an LCD backlight.

The graph of FIG. 6 is a chromaticity diagram of CIE 1931 color coordinate system, showing the color reproductivity of an LCD display with a backlight unit employing the white LED having the emission spectrum of FIG. 5a. As shown in FIG. 6, when the backlight is implemented with the white light of FIG. 5a, the LCD display accomplishes a considerably large triangular color coordinate region (B) when compared with that of the related art. The triangular color coordinate region (B) exhibits color reproductivity of about 80% compared with NTSC, an increase of about 20% compared with the color reproductivity (55% to 65%) of the related art, which indicates the significant improvement in the level of color reproductivity.

The nitride-based red phosphor of AAlSiN$_3$:Eu (A: at least one selected from among Ba, Sr, and Ca) and silicate-based green phosphor of A$_2$SiO$_4$:Eu (A: at least one selected from among Ba, Sr, and Ca) which are used by being combined with the blue LED may be used in various compositions as necessary. For example, by changing a composition ratio in which at least a portion of Ca in the red phosphor is substituted by at least one of Sr and Ba, the red emission peak of the white light or the relative intensity at the red emission peak can be adjusted within a certain range.

Figure 7:
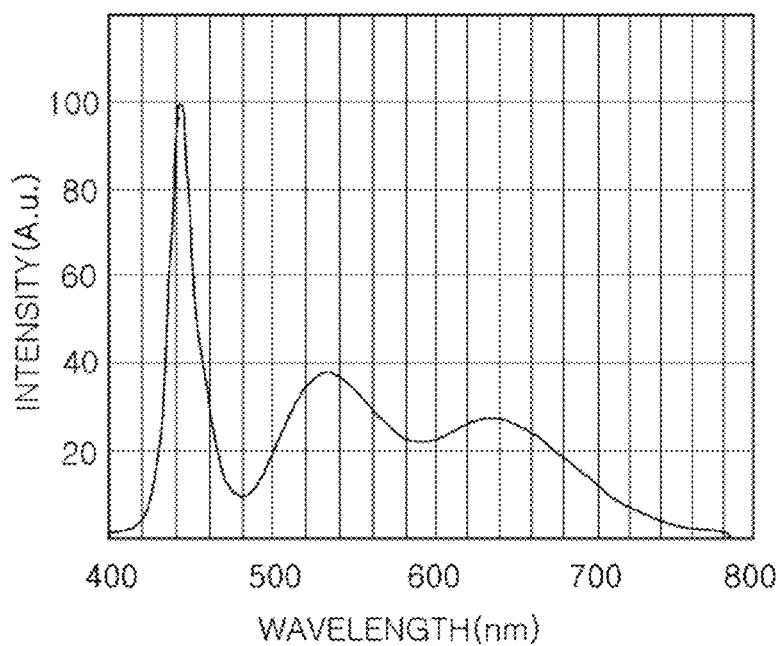
FIG. 7 illustrates emission spectrums of a white LED element according to another exemplary embodiment of the present invention.

FIG. 7 illustrates the emission spectrums of a white LED element according to another exemplary embodiment of the present invention. In particular, the spectrum of FIG. 7 is obtained from a white LED which uses SrAlSiN$_3$:Eu as a red phosphor and Sr$_{0.4}$Ba$_{1.6}$SiO$_4$:Eu as a green phosphor along with the InGaN-based blue LED element. As shown in FIG. 7, the emission peak may be slightly changed and the intensity at the peak may be changed according to the composition change. However, the emission peak having relative intensity of more than 20% is still shown in the long wavelength visible light region of 600 nm or larger, contributing to the improvement in the level of color reproductivity. In this manner, the white light outputted according to the combination of the nitride-based red phosphor of AAlSiN$_3$:Eu (A: at least one selected from among Ba, Sr, and Ca) and silicate-based green phosphor of A$_2$SiO$_4$:Eu (A: at least one selected from among Ba, Sr, and Ca) can improve the color reproductivity of the LCD display by more than 10% compared with the related art white light using the yellow phosphor.

Figure 8A:
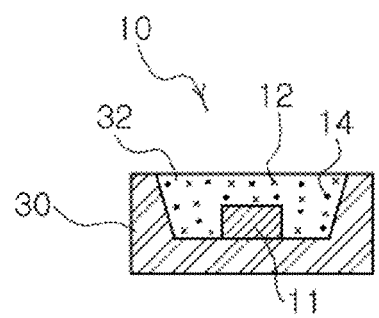
FIG. 8a schematically demonstrates a sectional structure of the white LED element according to an exemplary embodiment of the present invention.

FIG. 8a schematically demonstrates a sectional structure of the white LED element according to an exemplary embodiment of the present invention. With reference to FIG. 8a, the white LED device 10 includes a main body 30 with a reflection cup formed at a central portion thereof and a blue LED 11 mounted on the bottom surface of the reflection cup. A transparent resin encapsulant 32 encapsulating the blue LED 11 is formed within the reflection cup. The resin encapsulant 32 may be made of, for example, a silicon resin or an epoxy resin. Powder particles of nitride-based red phosphor 12 of AAlSiN$_3$:Eu (A: at least one selected from among Ba, Sr, and Ca) and silicate-based green phosphor of A$_2$SiO$_4$:Eu (A: at least one selected from among Ba, Sr, and Ca) and powder particles of silicate-based green phosphor 14 of A$_2$SiO$_4$:Eu (A: at least one selected from among Ba, Sr, and Ca) are uniformly distributed within the resin encapsulant 32. A conductor (not shown) for connecting a lead or the like is formed on the bottom surface of the reflection cup and is connected with an electrode of the blue LED 11 via wire bonding or flip chip bonding.

Blue light emitted from the blue LED 11 excites the nitride-based red phosphor 12 of AAlSiN$_3$:Eu and the silicate-based green phosphor 14 of A$_2$SiO$_4$:Eu, so red light and green light are emitted from the phosphors 12 and 14. The red phosphor 12 may be excited by green light emitted from the silicate-based green phosphor 14.

The nitride-based red phosphor 12 of AAlSiN$_3$:Eu and the silicate-based green phosphor 14 of A$_2$SiO$_4$:Eu can be excited at a wavelength of 425 nm to 460 nm with a relatively high efficiency, so the emission wavelength peak of the blue LED 11 is preferably within the range of about 425 nm to 460 nm. In addition, in order to optimize the level of color reproductivity, the emission peaks of the nitride-based red phosphor 12 and the silicate-based green phosphor 14 are preferably within the range of about 500 nm to 550 nm and 600 nm to 650 nm, respectively.

The white LED device 10 is good in terms of the stability of the phosphor material, as well as exhibiting the improved levels of color reproductivity as described above. The nitride-based red AAlSiN$_3$:Eu phosphor and the silicate-based green A$_2$SiO$_4$:Eu phosphor used as the red and green phosphors 12 and 14 are not only relatively resistant to temperature and moisture but also create little degradation in their reactions to a hardener such as Pt added to the resin encapsulant 32. Actually, when an operational reliability test is performed at a high temperature and with high moisture levels, the nitride-based red AAlSiN$_3$:Eu phosphor and the silicate-based green A$_2$SiO$_4$:Eu phosphor shows higher stability compared with the related art sulfide-based phosphor.

Figure 8B:
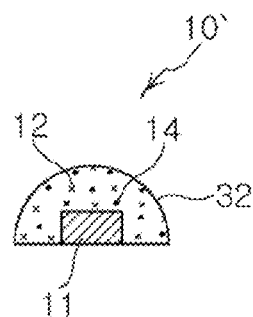
FIG. 8b illustrates a white LED element according to another exemplary embodiment of the present invention.

FIG. 8b illustrates a white LED element according to another exemplary embodiment of the present invention. With reference to FIG. 8b, a white LED device 10 includes a resin encapsulant 32 having a convex lens shape, e.g., forming a hemispherical lens, and the blue LED 11 encapsulated by the resin encapsulant 32. The above-described nitride-based phosphor 12 and the silicate-based green phosphor 14 are distributed within the resin encapsulant 32. In this exemplary embodiment, there is no package body having a reflection cup, but a very wide beam angle can be implemented and the blue LED 11 can be directly mounted on a circuit board.

Figure 9:
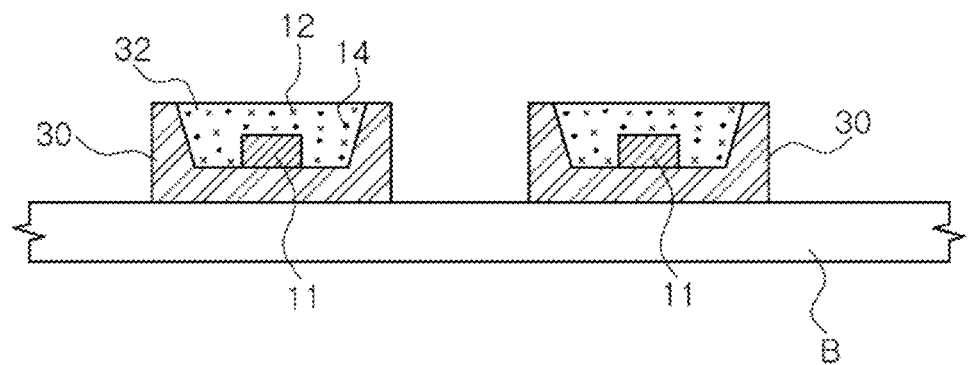
FIG. 9 is a side sectional view schematically demonstrating a light source module for a backlight according to an exemplary embodiment of the present invention.
Figure 10:
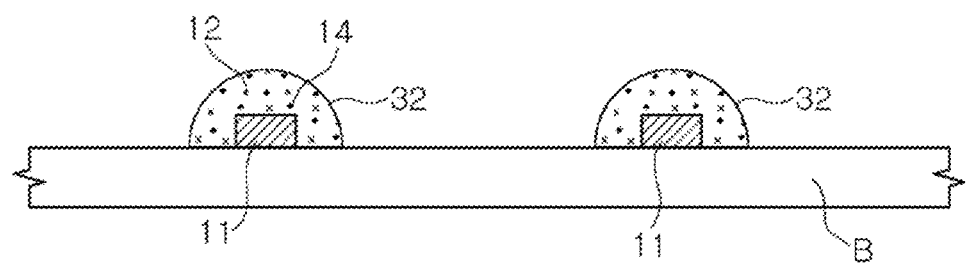
FIG. 10 is a sectional view schematically demonstrating a light source module for a backlight according to another exemplary embodiment of the present invention.

FIGS. 9 and 10 are side sectional views schematically demonstrating a light source module for a backlight according to exemplary embodiments of the present invention. The light source module, a light source unit of an LCD backlight unit, may be coupled with various optical members (a diffusion plate, a light guide plate, a reflection plate, a prism sheet, and the like) to form a backlight assembly.

With reference to FIG. 9, the light source module for the LCD backlight includes a board (B) and a plurality of white LED package 10 arrays mounted on the board. An electric conductor pattern (not shown) may be formed on the board (B) to contact with the LED package 10.

As described above with reference to FIG. 8a, each white LED package 10 includes the blue LED chip 11 mounted within the reflection cup and the resin encapsulant 32 encapsulating the blue LED chip 11, and the nitride-based red phosphor 12 and the silicate-based green phosphor 14 are distributed within the resin encapsulant.

With reference to FIG. 10, the light source module for an LCD backlight includes the board (B) and an array of a plurality of white LED packages 10. In this exemplary embodiment, the blue LED 10 is directly mounted on the board (B) in a chip-on-board (COB) manner. Each white LED package 10 is configured as described above with reference to FIG. 8b. Because each of the white LED package 10 has the hemispherical lens (resin encapsulant 32) without a reflection wall, each white LED package 10 can have a wide beam angle. The wide beam angle of each white light source can contribute to a reduction in the size (thickness or width) of the LCD display.

The white LED package 10 includes the blue (B) LED chip 11, the green (G) phosphor 14, and the red (R) phosphor 12. The green phosphor 14 and the red phosphor 12 are excited by the blue LED chip 11 to emit green light and red light, respectively, and the green light and the red light wavelengths are mixed with a partial blue light emitted from the blue LED chip 11 to output white light.

In particular, in the present exemplary embodiment of the present invention, the blue LED chip 11 is directly mounted on the board (B), and the phosphors 12 and 14 are distributedly (preferably, uniformly) mixed within the resin encapsulant 32 encapsulating the LED chip 11. The resin encapsulant 32 may have a hemispherical shape serving as, for example, a sort of lens, and may be made of a silicon resin or a hybrid resin. Because the LED chip 11 is directly mounted on the board (B) in the COB manner, a wider beam angle can be easily obtained from each white LED.

An electrode pattern or a circuit pattern (not shown) is formed on the board (B), and the circuit pattern is connected with an electrode of the LED chip 11, through wire bonding or flip chip bonding, for example. Because the white light source module includes the plurality of white LED packages 10', it can form a surface light source or a linear light source of a desired area, and as such, the white light source module can be advantageously used as a light source of a backlight unit of the LCD display.

The inventors of the present invention implement maximum level of color reproductivity from the combination of the green and red phosphors and the blue LED chip by limiting the dominant wavelength of the blue LED chip 11 and the color coordinates (CIE 1931 color coordinate system basis) to a particular range or a region.

In detail, in order to obtain the maximum color reproductivity from the combination of the blue LED chip-green phosphor and the red phosphor, the dominant wavelength of the blue LED chip 11 ranges from 425 nm to 460 nm, the color coordinates of the red light emitted by the red phosphor 12 after being excited by the blue LED chip 11 are within a region encompassed by four vertexes of (0.5448, 0.4544), (0.7079, 0.2920), (0.6427, 0.2905) and (0.4794, 0.4633) based on the CIE 1931 (x,y) color coordinate system, and the color coordinates of the green light emitted by the green phosphor after being excited by the blue LED chip 11 are within a region encompassed by four vertexes of (0.1270, 0.8037), (0.4117, 0.5861), (0.4197, 0.5316) and (0.2555, 0.5030) based on the CIE 1931 color coordinate system.

Figure 11:
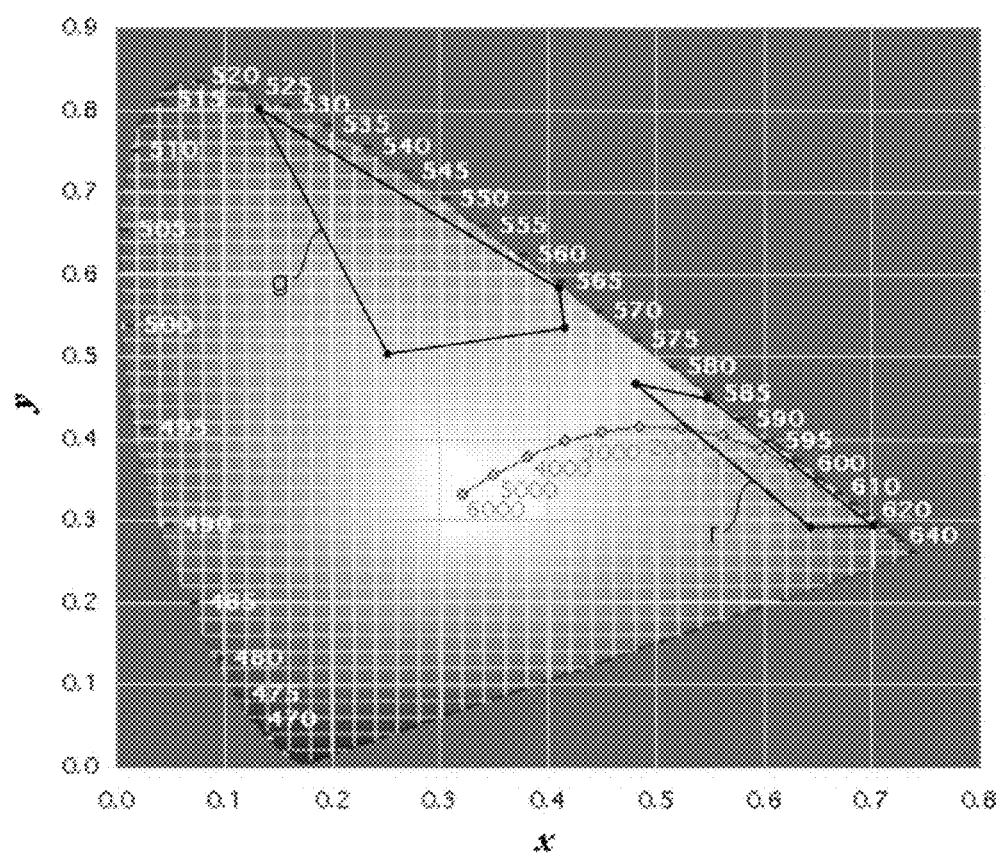
FIG. 11 is a graph showing a color coordinate region of red and green phosphors.

For reference, the color coordinate regions of the red and green phosphors are illustrated in FIG. 11. As shown in FIG. 11, an irregular quadrilateral (r) formed by four vertexes of (0.5448, 0.4544), (0.7079, 0.2920), (0.6427, 0.2905) and (0.4794, 0.4633), and an irregular quadrilateral (g) formed by four vertexes of (0.1270, 0.8037), (0.4117, 0.5861), (0.4197, 0.5316) and (0.2555, 0.5030) are displayed on the CIE 1931 chromaticity diagram. As mentioned above, the red phosphor and the green phosphor are selected such that their color coordinates are positioned within the irregular quadrilateral (r and g).

Here, the dominant wavelength is a main wavelength value obtained from a curve formed by integrating the spectrum graph of the output light (of the blue LED chip) measured by equipment and a luminosity curve, which is a wavelength value in consideration of the luminosity factor of human beings. Such a dominant wavelength corresponds to a wavelength value of a point at which a straight line connecting a central value (0.333, 0.333) of the CIE 1976 color coordinate system and the color coordinate value measured by the equipment meets the outline of the CIE 1976 chromaticity diagram. In this case, it should be noted that the peak wavelength, which is differentiated from the dominant wavelength, is the wavelength with the highest energy intensity. That is, the peak wavelength refers to a wavelength value indicating the highest intensity in a spectrum graph of the output light measured by the equipment regardless of visibility.

By limiting the dominant wavelength of the blue LED chip 11 to the range of 425 nm to 460 nm, by limiting the red phosphor 12 represented by $Sr_xBa_yCa_zAlSiN_3$:Eu ($0=x,y$, $z=2$) into the irregular quadrilateral formed by the four vertexes of (0.5448, 0.4544), (0.7079, 0.2920), (0.6427, 0.2905) and (0.4794, 0.4633) based on the color coordinates (based on CIE 1931 color coordinate system), and limiting the green phosphor 14 represented by the four vertexes of (0.1270, 0.8037), (0.4117, 0.5861), (0.4197, 0.5316) and (0.2555, 0.5030) based on the same color coordinates as the red phosphor 12, the LCD display employing the white light source module in the backlight unit can exhibit high color reproductivity of a very wide color coordinate region including substantially all the s-RGB region on the CIE 1975 chromaticity diagram (See FIG. 11). Such a high degree of color reproductivity has not been achieved by the combination of the blue LED chip and the red and green phosphors in the related art.

When an LED chip and red and green phosphors beyond the dominant wavelength range and the color coordinates region are used, the levels of color reproductivity or the color quality of the LCD display are degraded. In the related art, in order to obtain white light, the dominant wavelength of the blue LED chip, used together with the red phosphor and the green phosphor, is generally 460 nm or larger. However, in the present exemplary embodiment, because the blue light of a shorter wavelength than that of the related art and the red and green phosphors having the color coordinates within the quadrangular region are used, a high level of color reproductivity, which the related art fails to achieve, can be obtained.

In the present exemplary embodiment, because the dominant wavelength range of the blue light (LED chip) and the color coordinates region of the green and red light (phosphors) are limited, a greater level of color reproductivity than in the case of the combination of the blue LED chip and the yellow phosphor as in the related art, can be obtained, a better level of color reproductivity than that of the combination of the blue LED chip and the green and red phosphors as proposed in the related art can be achieved, and the overall light efficiency, including phosphor efficiency, can be enhanced.

In addition, in the present exemplary embodiment, unlike the related art white light source module using the red, green and blue LED chips, the required number of LED chips can be reduced and the types of LED chips used can be reduced only to one type of chip (i.e., a blue LED chip).

Accordingly, the package manufacturing cost can be reduced and the driving circuit can be simplified. In particular, in the case of fabricating an additional circuit to prevent an increase in contrast or a screen image drag (i.e., motion blur), the circuit configuration can be simpler. Moreover, because white light in a unit area is implemented through the single LED chip 11 and the phosphor-contained resin encapsulant 32 encapsulating the LED chip 11, the level of color uniformity can be better than the case where the red, green and blue LED chips are used.

Figure 13:
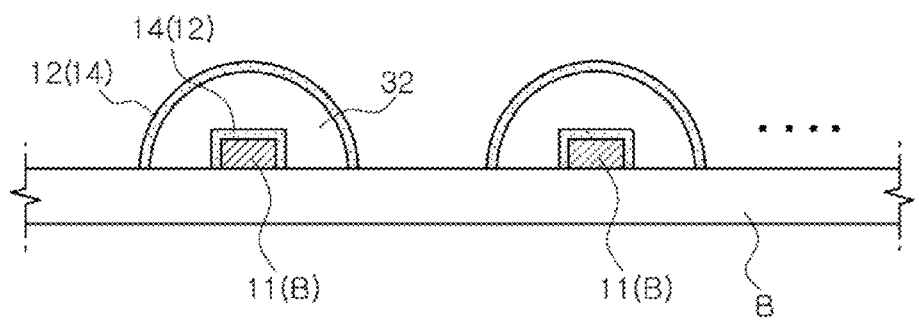
FIG. 13 is a sectional view schematically demonstrating a white light emitting device and a white light source having the same according to another exemplary embodiment of the present invention.

FIG. 13 is a sectional view schematically demonstrating a white light emitting device and a white light source module having the same according to another exemplary embodiment of the present invention. In the exemplary embodiment of FIG. 13, the blue LED chip 11 is directly mounted on the board (B) in the COB manner, and the blue LED chip 11 and red and green phosphors excited by the blue LED chip 11 form a white light emitting device of a unit area. In order to maximize the level of color reproductivity, the blue LED chip 11 and the red and green phosphors have the above-mentioned dominant wavelength and color coordinates range (namely, the dominant wavelength range of 425 nm to 460 nm, the irregular quadrilateral formed by the four vertexes of (0.5448, 0.4544), (0.7079, 0.2920), (0.6427, 0.2905) and (0.4794, 0.4633), and the irregular quadrilateral formed by the four vertexes of (0.1270, 0.8037), (0.4117, 0.5861), (0.4197, 0.5316) and (0.2555, 0.5030) on the CIE 1931 chromaticity diagram).

In the present exemplary embodiment, the red and green phosphors are provided in the form of phosphor films 12 and 14, rather than being distributedly mixed within the resin encapsulant. In detail, as shown in FIG. 13, the green phosphor film 14, including a green phosphor, is deposited to be a thin layer on the surface of the blue LED chip 11, on which the hemispherical transparent resin encapsulant 32 is formed. The red phosphor film 12, including a red phosphor, is coated on the surface of the resin encapsulant 32. The positions of the green phosphor film and the red phosphor film 12 may be reversed. Namely, the red phosphor film 12 may be coated on the LED chip 11, and the green phosphor film 14 may be coated on the resin encapsulant 32. The green phosphor film 14 and the red phosphor film 12 may be formed of, for example, resin films containing phosphor particles, respectively. As the phosphor contained in the phosphor films 12 and 14, above-mentioned nitride-based, sulfide-based, or silicate-based phosphor may be used.

As stated above, with the presence of the green (or red) phosphor film 14 or 12, the transparent resin encapsulant 32, and the red (or green) phosphor film 12 or 14, the color uniformity of the output white light can be further improved. If the green and red phosphor (powder mixture) is simply distributed within the resin encapsulant, the phosphors could not be uniformly distributed due to the difference of specific gravity between the phosphors in the course of a resin hardening process, having the possibility that the layers are separated, which leads to a degradation of the color uniformity within the single white light emitting device. However, in the exemplary embodiment as shown in FIG. 13, because the green phosphor film 14 and the red phosphor film 12 separated by the resin encapsulant 32 are used, blue light emitted at various angles from the blue LED chip 11 can be absorbed relatively uniformly or transmitted via the phosphor films 12 and 14, obtaining increased uniformity of white light overall (an additional enhancement of color uniformity).

In the exemplary embodiment illustrated in FIG. 13, because the phosphor films 12 and 14 separated by the transparent resin encapsulant 32 are used, the loss of light due to phosphors can be reduced. If the phosphor powder mixture is distributedly mixed within the resin encapsulant, secondary light (green light or red light) which has already been wavelength-converted by phosphors is diffused by the phosphor particles on a light path to possibly cause the loss of light. However, in the exemplary embodiment of FIG. 13, the secondary light which has been converted by the thin green or red phosphor film 14 or 12 is transmitted through the transparent resin encapsulant 32 or discharged to the outer side of the light emitting device, so the loss of light by the phosphor particles can be reduced.

Also, in the exemplary embodiment of FIG. 13, by using the dominant wavelength of the blue LED chip and the color coordinates of the green and red phosphors within the above-mentioned range, the white light source module used for the backlight unit of the LCD display can exhibit high color reproductivity including almost all of the s-RGB region. In addition, the number of LED chips and the fabrication cost of the driving circuits and packages can be reduced, having the effect of reducing the unit cost. Of course, the half amplitude of the blue, green and red light can be limited to the above-mentioned range.

Figure 15:
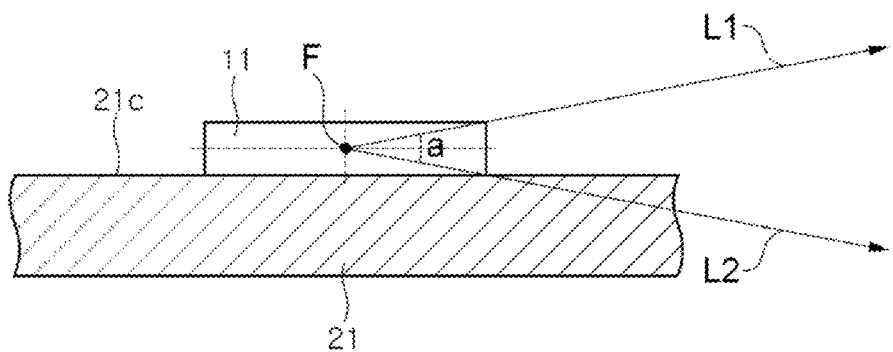
FIG. 15 is a schematic view showing light characteristics of an LED chip of FIG. 3.

In the exemplary embodiments of the present invention as described above, each LED chip is directly mounted on the circuit board in the COB manner, but the present invention is not limited thereto. For example, the LED chip may be mounted on a package body mounted on the circuit board. Exemplary embodiments using a separate package body are illustrated in FIG. 15.

Figure 14:
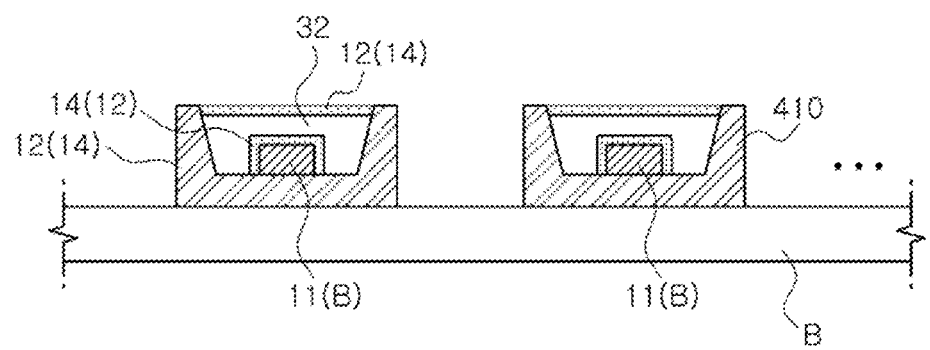
FIG. 14 is a sectional view schematically demonstrating a white light emitting device and a white light source having the same according to another exemplary embodiment of the present invention.

FIG. 14 is a sectional view schematically demonstrating a white light emitting device and a white light source having the same according to another exemplary embodiment of the present invention. With reference to FIG. 14, each white light emitting device includes a package body 30 having a reflection cup and a blue LED chip 11 mounted within the reflection cup.

In the present exemplary embodiment, red and green phosphors are provided in the form of phosphor films, rather than being distributedly mixed within a resin encapsulant. Namely, the green (or red) phosphor film 12 or 14 is deposited to be thin on the surface of the blue LED chip 11, on which the transparent resin encapsulant 32 is formed. The red (or green) phosphor film 12 or 14 is coated on the surface of the resin encapsulant 32.

Just as in the exemplary embodiment of FIG. 13, the green phosphor film 14 and the red phosphor film 12 separated by the resin encapsulant 32 are used, such that superior color uniformity levels can be obtained. In addition, just as in the above-described exemplary embodiments, because the dominant wavelength of the blue LED chip within the afore-mentioned range and the color coordinates of the red and green phosphors are used, high levels of color reproductivity, including almost every portion of the s-RGB region, can be achieved.

Figure 12:
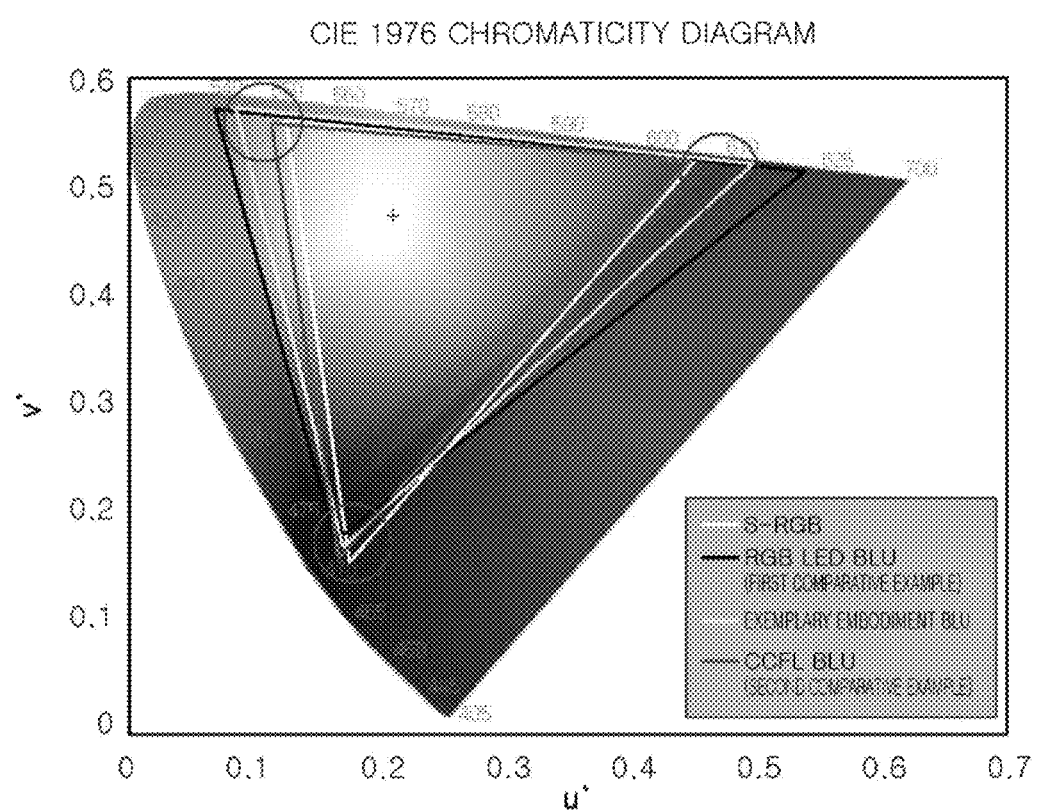
FIG. 12 is a graph of CIE 1976 chromaticity diagram showing color coordinate ranges obtained by a white light source module according to an exemplary embodiment of the present invention and that of a comparative example.

FIG. 12 is a CIE 1976 chromaticity graph showing color coordinates ranges obtained when the white light source module according to an exemplary embodiment of the present invention and that of a comparative example are used for a backlight unit of the LCD display.

With reference to FIG. 12, as described above, the white light source module according to an exemplary embodiment of the present invention is a light source module emitting white light through the combination of the blue LED and the green and red phosphors (See FIG. 9). In the white light source module according to an exemplary embodiment of the present invention, the blue LED chip has a dominant wavelength (in particular, a dominant wavelength of 445 nm) within the range of 425 nm to 460 nm, and the red phosphor emits red light having color coordinates within the irregular quadrilateral area formed by four vertexes of (0.5448, 0.4544), (0.7079, 0.2920), (0.6427, 0.2905) and (0.4794, 0.4633) and the green phosphor emits green light having color coordinates within the irregular quadrilateral area formed by four vertexes of (0.1270, 0.8037), (0.4117, 0.5861), (0.4197, 0.5316) and (0.2555, 0.5030).

The white light source module according to a first comparative example compared with the exemplary embodiment of the present invention is a light source module emitting white light through the combination of the red, green, and blue LED chips. Also, the white light source module according to a second comparative example is a light source module emitting white light with a conventionally used cold cathode fluorescent lamp (CCFL).

In the chromaticity diagram of FIG. 12, there are shown a color coordinates region of the LCD display in which the light source module is used in the backlight unit and a color coordinates region of an LCD display in which the light source module according to the first and second comparative examples is used in a backlight unit. As shown in FIG. 12, the LCD display using the backlight unit implements a very wide color coordinates region including almost every portion of the s-RGB region. Such a high degree of color reproductivity has not been achieved by the combination of the blue LED chip and the red and green phosphors proposed in the related art.

The LCD display using the backlight unit (RGB LED BLU) according to the first comparative example uses LED chips as red, green and blue light sources, implementing a wide color coordinates region. However, as shown in FIG. 12, the LCD display using the RGB LED BLU has shortcomings in that it cannot properly display the blue portion of the s-RGB region. In addition, if three primary colors are implemented with LED chips, respectively, without using phosphors, color uniformity would be degraded compared with the exemplary embodiment of the present invention and the number of required LED chips would increase to raise the cost of fabrication. In particular, an additional circuit configuration for increasing contrast or local dimming would be complicated, and the cost for configuring the circuit would sharply increase.

As shown in FIG. 12, the LCD display using the BLU (CCFL BLU) according to the second comparative example has a color coordinates area with a relatively narrow area and inferior color reproductivity compared with that of the BLU of the exemplary embodiment of the present invention and the BLU of the first comparative example using the LED. In addition, the CCFL BLU is not environment-friendly and a circuit configuration for improving the performance of BLU such as local dimming, contrast adjustment, and the like, is difficult or impossible to realize.

In the exemplary embodiments as described above, the nitride-based red phosphor of $(Sr,Ba, Ca)AlSiN_3$:Eu, and the silicate-based green phosphor of $(Sr,Ba, Ca)_2SiO_4$:Eu exist in the state of being distributed within the resin encapsulant, but the present invention is not limited thereto. That is, for example, the red and green phosphors may be provided in the form of a film (phosphor film or films) formed on the surface of the blue LED. In this case, two types of phosphors may be mixedly included within a single phosphor film, or each phosphor may exist separately in each layer.

The lead frame 20 may include a first lead part 21 and a second lead part 24 which are separated. The first lead part 21 includes the bottom surface 21c on which the LED chip 11 is mounted, a side wall face 21b slantingly extending upward from the bottom surface 21c, and a flat face 21a horizontally extending from the side wall face 21b, and a terminal part 22 bent and extending from one end portion of the flat face 21a and exposed to one side of the main body 30.

With such a structure, the first lead part 21 forms a cavity 25 having a recess structure by the bottom surface 21c and the side wall face 21b, and the LED chip 11 is received in the cavity 25. Here, although not shown, the LED chip 11 may be electrically connected with the bottom surface 21c by a conductive member, e.g., a solder ball or wire.

The second lead part 24 includes a flat face 24a spaced apart by a certain distance from the other end portion of the flat face 21a in a facing manner and electrically connected with the LED chip 11 by a wire W, and a terminal part 22 bent and extending from the flat face 24a and exposed to the opposite side of the main body 30.

The main body 30 receives the lead frame 20 and serves as a frame to support the lead frame 20 and the LED chip 11 such that they can be stably electrically connected. In this case, the main body 30 includes an opening 31 exposing a cavity including the LED chip 11.

Namely, the bottom surface 21c and the side wall face 21b are exposed through the opening 31, and the bottom surface 21c is additionally exposed through a lower end face of the main body 30 to effectively release heat, generated from the LED chip 11, from the main body 30.

Each terminal part 22 of the first and second lead parts 21 and 24 may penetrate both sides of the main body 30 so as to be drawn out and exposed. In this case, each terminal part 22 may be downwardly bent so as to be positioned on the same horizontal line as the lower end face of the main body 30. A detailed structure will be described later.

A sealing member 32 may be provided at the opening 31 of the main body 30 and additionally include the phosphor. Here, the sealing member 32 may have a single layer structure. Alternatively, the sealing member 32 may have a multilayer structure in which layers have a different refractive index in order to improve light efficiency. In order to effectively discharge light from the LED chip 11, a lower layer of the sealing member 32 may have a refractive index smaller than that of an upper layer.

Although not shown, a reflection film may be provided on the surface of the lead frame 20 in order to increase a level of light reflexibility. The reflection film may be made of a metal with a good level of light reflexibility. For example, the reflection film may be made of Ag or Al.

The reflection film may be formed through plating or by additionally stacking a thin film, through which a level of light extraction efficiency of the LED package can be further increased.

Preferably, a plurality of the LED chip 11 may be mounted on the bottom surface such that they are connected in parallel, and a Zener (not shown) may be further mounted to be electrically connected with the LED chip 11 to prevent static electricity.

The design of the cavity according to an exemplary embodiment of the present invention will now be described with reference to FIGS. 3 and 15 to 17.

Figure 16:
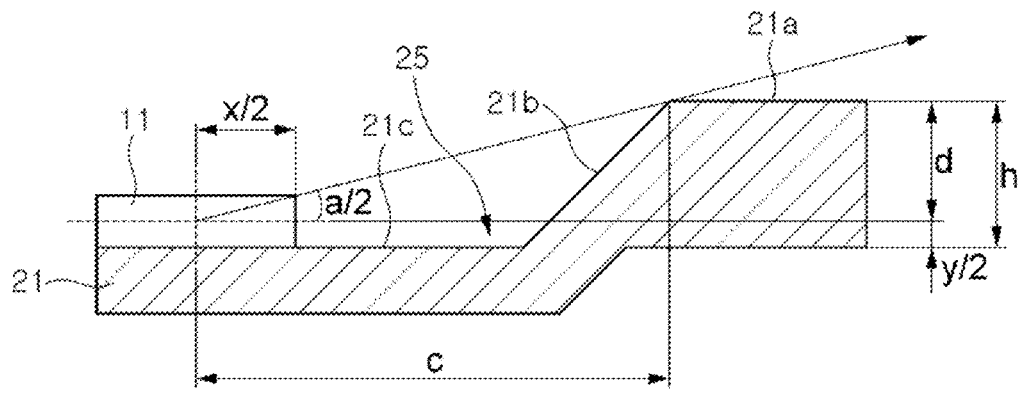
FIG. 16 is an enlarged sectional view explaining the design of a lead frame.
Figure 17:
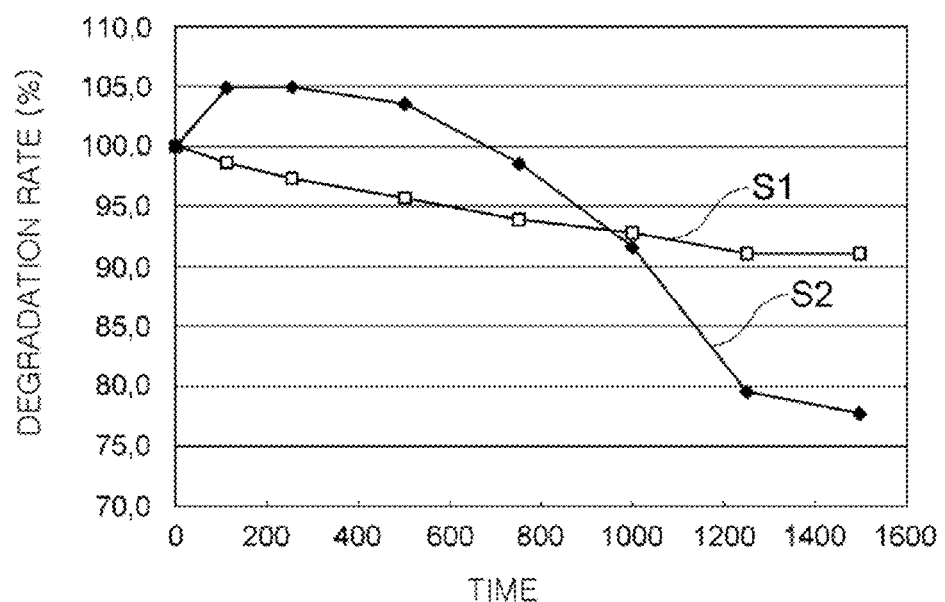
FIG. 17 is a graph of the results of a test of high temperature load reliability carried out in an LED package according to the form of the lead frame.

FIG. 15 is a schematic view showing light characteristics of the LED chip of FIG. 3, FIG. 16 is an enlarged sectional view explaining the design of a lead frame, and FIG. 17 is a graph of the results of a test of high temperature load reliability carried out in the LED package according to the form of the lead frame.

As shown in FIG. 15, the LED chip 11 may be a rectangular parallelepiped light source having a general structure. However, the present invention is not limited thereto, and the LED chip 11 may have various other shapes such as a regular hexahedron light source or a trapezoid regular hexahedron light source. In this case, when current is applied to the LED chip 11, light formed from the LED chip 11 may be discharged from the upper surface and the side surface of the LED chip 11.

Here, when light formed at the center (F) of the LED chip 11 is discharged from the side surface of the LED chip 11, the light may be distributed in the space (a) between the angle of a first light beam L1 that passes through the upper corner of the LED chip 11 and the angle of a second light beam L2 that passes through the lower corner of the LED chip 11.

Among the light beams (i.e., light rays) generated from the side of the LED chip 11, light beams directing to the lower portion of the lead frame 20 are reflected to be discharged upwardly. In this case, however, a portion of the light beams directed toward the upper portion of the lead frame 20 among the light beams generated from the side of the LED chip 11 may be directly irradiated to the main body 30 and degrade the main body 30.

In order to avoid such a problem, the depth of the cavity 25 may be adjusted to prevent light generated from the side of the LED chip 11 from directing toward the main body 30, and in this case, the depth of the cavity may be adjusted to allow at least the first light beam L1 to pass through the upper corner of the cavity 25.

Accordingly, the light generated from the side of the LED chip 11 can be mostly irradiated to the side wall face 21b of the lead frame 20. This is because the light that passes through the upper corner of the LED chip 11, namely, the first light beam L1, is the outermost light beam discharged from the side of the LED chip 11. Here, the upper corner of the cavity 25 is where the side wall face 21b and the flat face 21a are brought into contact with each other.

The depth of the cavity 25 as shown in FIG. 16 should satisfy Equation 2 shown below:

$$h=d+y/2 \qquad \text{[Equation 2]}$$

Here, 'h' is the depth of the cavity 25, 'd' is the length of a region in which the light beams discharged to the upper portion of the lead frame 20 among the light beams generated from the side of the LED chip 11 can be irradiated to the side wall face 21b of the lead frame, and 'y' is the height of the chip 11.

The depth (d) of the region in which light is irradiated to the side wall face 21b of the lead frame 20 can be obtained by Equation 3 shown below:

$$\tan(a/2)=y/x=d/c, d=y/x \times c, \qquad \text{[Equation 3]}$$

Here, 'x' is the width of the LED chip 11, and 'c' is the width of the cavity 25.

Accordingly, the depth (h) of the cavity 25 satisfies Equation 1 shown below:

$$h=y/x \times c+y/2 \qquad \text{[Equation 1]}$$

Here, 'h' is the depth of the cavity 25, 'x' is the width of the LED chip 11, 'y' is the height of the LED chip 11, and 'c' is the width of the cavity 25.

FIG. 17 is the graph of the results of a test of high temperature load reliability carried out in an LED package according to the form of the lead frame 20.

As shown in FIG. 17, it is noted that an LED package S1 including the lead frame having the cavity has a smaller degradation rate than an LED package S2 having a flat lead frame.

Thus, by including the cavity in the lead frame, degradation of the main body by light from the LED chip can be prevented. In addition, by stably designing the cavity depth, degradation of the main body can be more effectively prevented.

One or more LED chips may be mounted by adjusting the number of the lead frames, and in this case, the LED chips each may implement light which is the same or different from each other.

As illustrated, the terminal part 22 is exposed through the both sides of the main body 30 to electrically connect the LED chip 11 to the board.

The terminal part 22 may include a top electrode 22a exposed from the main body 30, a bent portion 22b, and a side electrode 22c.

The top electrode 22a extends from the flat face 21a of the first lead part 21 and the flat face 24a of the second lead part 24 so as to be fixedly exposed from both sides of the main body 30.

In this case, the top electrode 22a is bent to be downwardly sloped from the flat faces 21a and 24a so as to be at a level with a lower surface of the main body 30. Accordingly, when the lower surface of the main body 30 is mounted on the board (B), the top electrode 22a is electrically connected with the board (B).

In the present invention, top mounting may refer to horizontally mounting the LED package on the board such that the top electrode 22a and the board (B) are electrically connected.

The bent portion 22b extends from an end portion of the top electrode 22a and is bent toward the front side of the main body 30.

The side electrode 22c is vertically bent from one side of the bent portion and extends so as to be horizontal to the side 30b in a longer side direction at a right angle to the side 30a in a shorter side direction of the main body 30.

Namely, based on the main body having the rectangular parallelepiped structure, the top electrode 22a and the bent portion 22b are provided at the short-side directional side 30a of left and right sides, and the side electrode 22c is provided at the longer-side directional side 30b at a right angle with the shorter-side directional side 30a.

Accordingly, in case of the edge type in which the main body 30 of the LED package is vertically mounted on the board (B), the side electrode 22c is electrically connected with the board (B).

The side electrode 22c may have various lengths depending on the length of the longer-side directional side 30b of the main body 30.

Figure 18A:
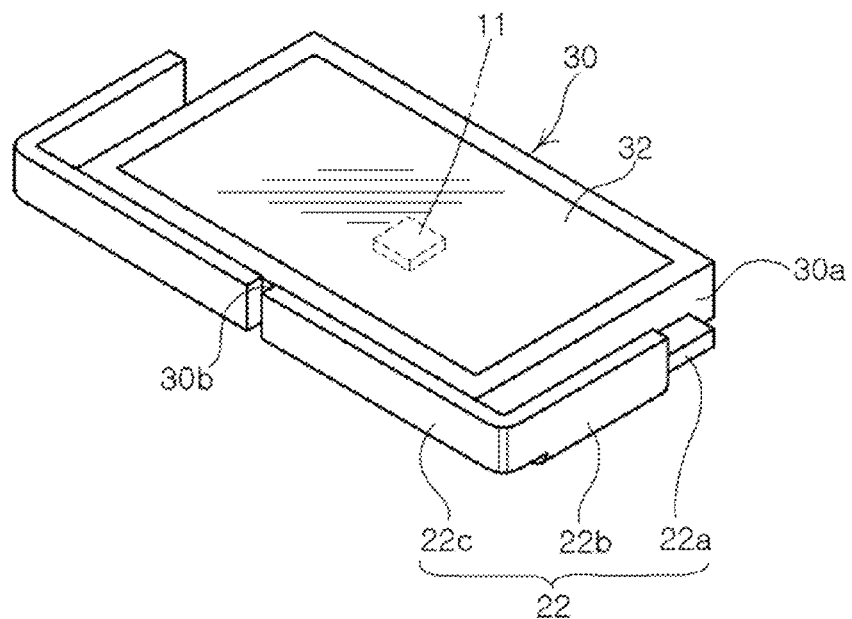
FIG. 18 schematically shows a modification of a side electrode.
Figure 18B:
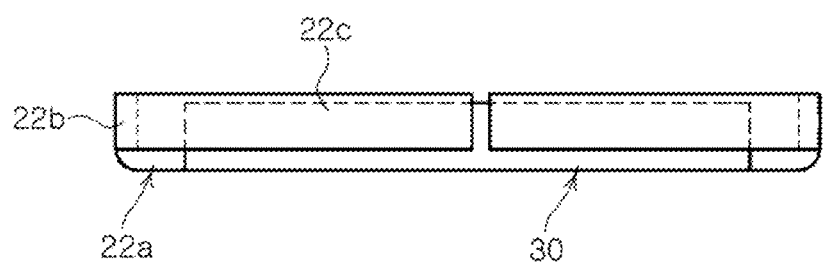

Namely, as shown in FIG. 1, the side electrode 22c may be formed at a portion near the corner where the shorter side directional side 30a and the longer side directional side 30b meet, or as shown in FIGS. 18a and 18b the both side electrodes 22c may be formed in an elongated manner such that they become close along the longer-side directional length 30b of the main body. In this case, a contact area with the board (B) can be increase by the side electrode 22c formed in an elongated manner, allowing the LED package to be stably mounted and increasing the effect of releasing heat generated from the LED chip 11.

In an exemplary embodiment of the present invention, the side mounting may refer to vertically mounting the LED package on the board (B) such that the side electrode 22c is electrically connected with the board (B).

The top electrode 22a, the bent portion 22b, and the side electrode 22c may be integrally formed to be fabricated through pressing or the like, and the lead frame 20 may be made of a material (e.g., Cu) having good heat conduction characteristics to effectively release heat generated by the LED chip 11.

Figure 19:
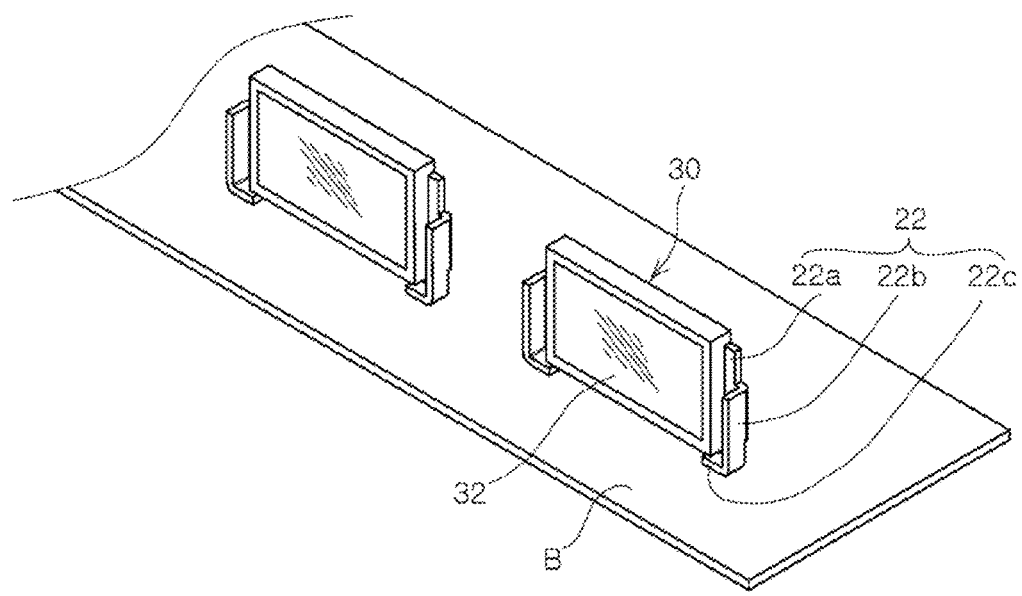
FIG. 19 is a partial perspective view showing how an edge type (side view type) LED package is mounted according to a first exemplary embodiment of the present invention.
Figure 20:
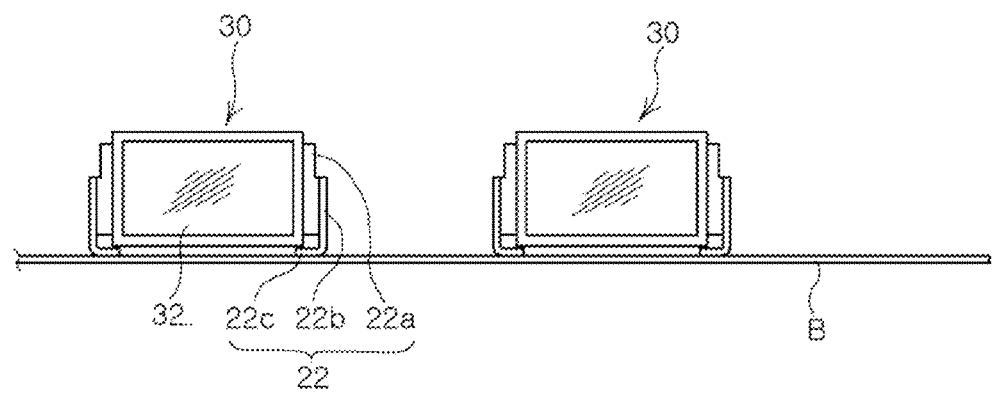
FIG. 20 is a front view of the LED package of FIG. 19.
Figure 21:
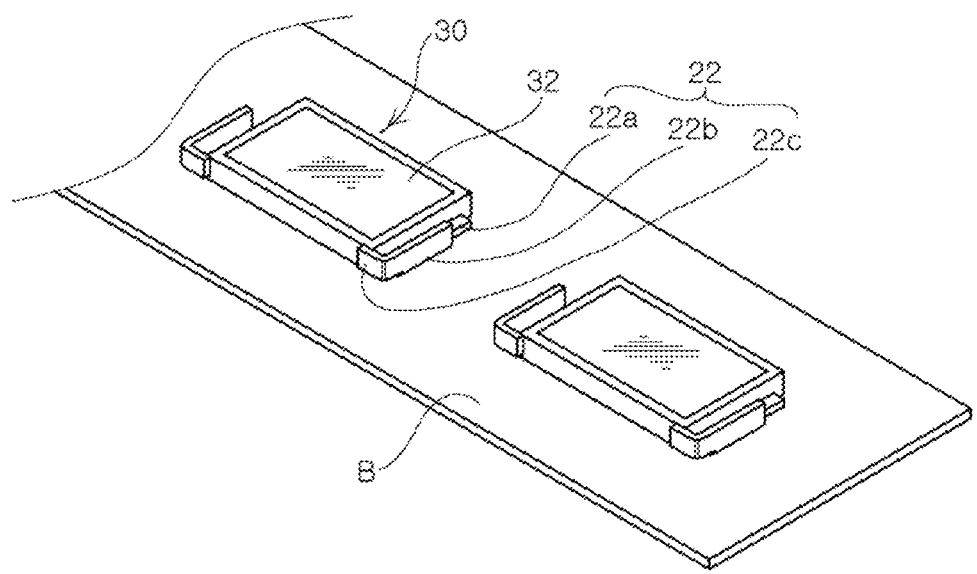
FIG. 21 is a partial perspective view showing how a direct type (top view type) LED package is mounted.

FIG. 19 is a partial perspective view showing how an edge type (side view type) LED package is mounted according to a first exemplary embodiment of the present invention, FIG. 20 is a front view of the LED package of FIG. 19, and FIG. 21 is a partial perspective view showing how a direct type (top view type) LED package is mounted.

With reference to FIGS. 19 and 20, the LED package is electrically mounted on the board (B) through the side electrode 22c connected to the main body 30. Accordingly, as shown in FIG. 20, the main body 30 and the board (B) are connected such that the LED chip 11 is disposed to be perpendicular to the board (B). Through such a structure, the LED package can be installed at the side of a light guide plate (not shown).

Also, the LED package may be electrically connected with the board (B) through the top electrode 22a provided in parallel along the lower surface of the main body 30, and through this structure, the LED chip 11 may be disposed to direct emissions to the upper portion of the board (B).

Accordingly, the LED package according to the present exemplary embodiment of the present invention can be commonly used both as an edge type LED package and the direct type LED package by means of the lead frame 20 with the top electrode 22a, the bent portion 22b, and the side electrode 22c, having the advantages in that the shape of the lead frame 20 can be simplified, a unit cost for fabrication of a mold can be lowered, and the common use of the LED package allows for freedom of package design.

In addition, because the side electrode 22c, the bent portion 22b, and the top electrode 22a are integrally formed, the LED package fabrication is facilitated.

Figure 22:
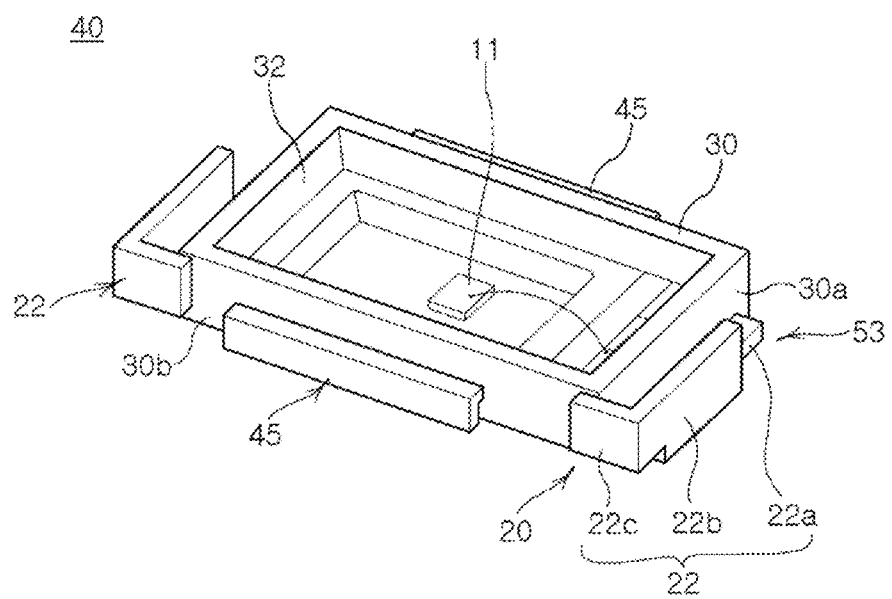
FIG. 22 is a perspective view of an LED package according to a second exemplary embodiment of the present invention.
Figure 23:
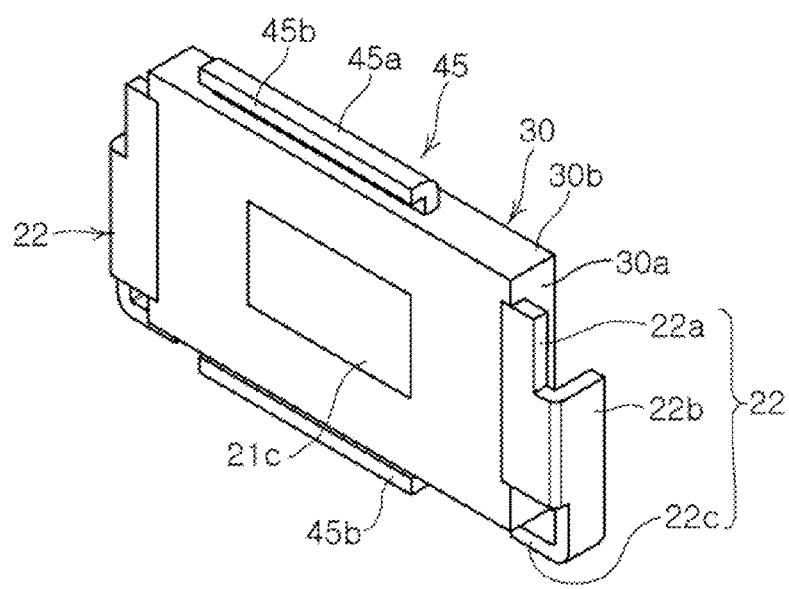
FIG. 23 is a perspective view of a rear side of the LED package of FIG. 22.

FIG. 22 is a perspective view of an LED package according to a second exemplary embodiment of the present invention, and FIG. 23 is a perspective view of a rear side of the LED package of FIG. 22.

An LED package 40 according to the second exemplary embodiment of the present invention as illustrated in FIGS. 22 and 23 includes substantially the same elements as that of the first exemplary embodiment as illustrated in FIGS. 1 to 11, so a detailed description of the elements will be omitted and the configuration of a contact part 45 will be mainly described.

The contact part 45, extending from the flat face 21a of the first lead part 21, passes through the longer side directional side 30b of the main body so as to be exposed.

Namely, the terminal part 22, extending from the flat face 21a of the first lead part 21, is exposed from the shorter side directional side 30a of the main body 30, while the contact part 45 is exposed from the longer side directional side 30b perpendicularly to the terminal part 22.

Like the terminal part 22, the contact part 45 may be integrally formed with the first lead part 21, and accordingly, the contact part 45 may be a portion of the lead frame 20.

As illustrated, the contact parts 45 may be provided at both sides of the main body 30, but the present invention is not limited thereto. That is, the contact part 45 may be provided at only one side of the main body 30 and, in this case, the contact part 45 may be provided along the side mounted on the board (B) in the case of side mounting.

An end portion of the contact part 45 may be bent toward the lower surface, namely, to the rear surface, of the main body 30. Accordingly, when the main body 30 is mounted, in case of the side mounting, the contact part may be mounted such that a face 45a bent at a right angle is in contact with the board (B), and in the case of top mounting, the contact part may be mounted such that an end portion 45b is in contact with the board (B).

In this manner, a wider contact area can be obtained in mounting the LED package 40 on the board (B), providing a stable mounting structure and effectively releasing heat through the increased contact area with the substrate. In addition, as heat generated from the LED chip can be additionally released through the contact area exposed from the main body, heat releasing efficiency can be enhanced.

Figure 24A:
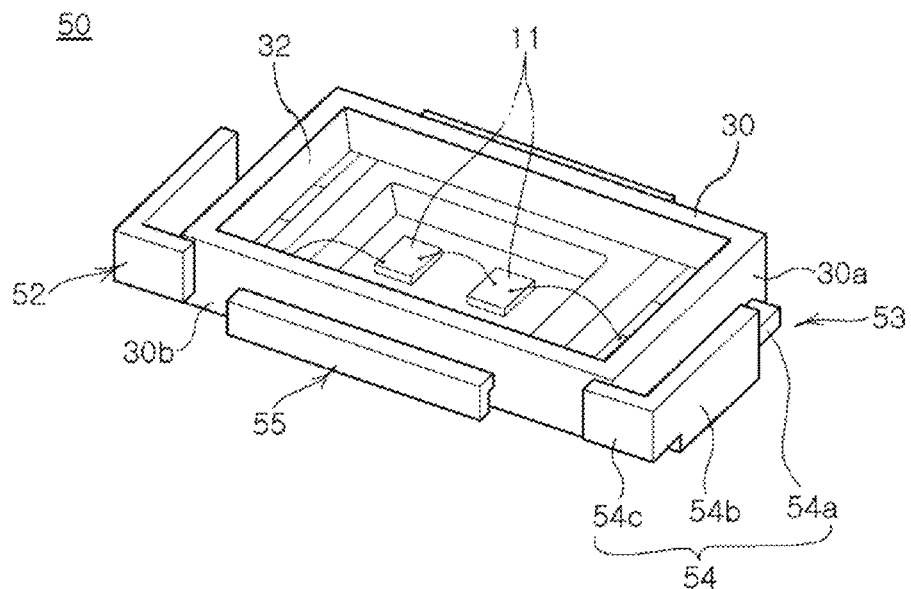
FIG. 24a is a perspective view of an LED package according to a third exemplary embodiment of the present invention.
Figure 24B:
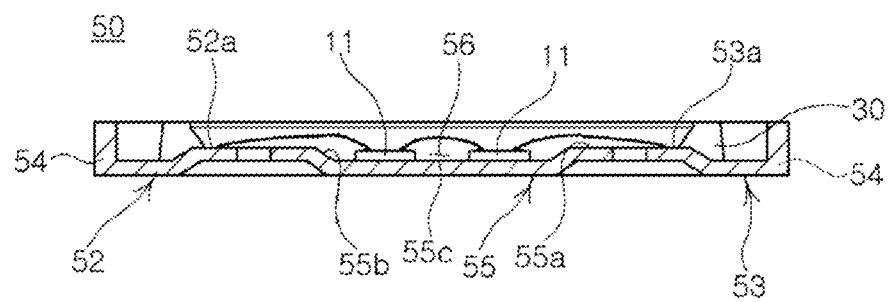
FIG. 24b is a sectional view of the LED package according to the third exemplary embodiment of the present invention.

FIG. 24a is a perspective view of an LED package according to a third exemplary embodiment of the present invention, and FIG. 24b is a sectional view of the LED package according to the third exemplary embodiment of the present invention.

With reference to FIGS. 24a and 24b, an LED package 50 includes LED chips 11, a lead frame 51, a main body 30, and a contact part 55.

In the third exemplary embodiment illustrated in FIGS. 24a and 24b, the elements of the LED package are substantially the same as those of the second exemplary embodiment illustrated in FIGS. 22 and 23.

In this case, a detailed configuration of the lead frame and the contact part is different from that of the second exemplary embodiment, so a description of the repeated configuration as the above-mentioned exemplary embodiment will be omitted and only the configuration of the lead frame 51 and the contact part 55 will be described.

In the present exemplary embodiment, the contact part 55 includes a bottom surface 55c on which the LED chip 10 is mounted, a side wall face 55b slantingly extending upwardly from the bottom surface 55c, and a flat face 55a horizontally extending from the side wall face 55b.

Accordingly, the contact part 55 forms a cavity 56 in a recess structure by the bottom surface 55c and the side wall face 55b, and the LED chip 11 is received within the cavity 56. The flat face 55a penetrates the longer-side directional side 30b of the main body 30 so as to be exposed, and an exposed end portion thereof may be bent toward the lower surface, namely, the rear surface, of the main body 30.

The contact part 55 is provided at a central portion of the main body 30 such that the cavity 54 including the LED chip 11 is exposed from the opening of the main body 30. Lead frames 51 are provided at both sides of the contact part 55 and electrically connected with the LED chips 11.

The lead frame 51 includes first and second lead parts 52 and 53 spaced apart from the contact part 55, and the first and second lead parts 52 and 53 are provided on the shorter-side directional side 30a of the main body 30.

The first and second lead parts 52 and 53 include flat faces 52a and 53a spaced apart by a certain distance from the flat face 55a of the contact part 55, facing each other, and electrically connected with the LED chip by wire, and a terminal part 54 bent and extending from the flat faces so as to be exposed from the short side directional side 30a of the main body 30, respectively.

Each terminal part 54 of the first and second lead parts 52 and 53 may penetrate the both sides of the main body so as to be drawn out and exposed, and each terminal part 54 may be downwardly bent so as to be positioned at the same level with the lower surface of the main body 30.

The terminal part 54 may include a top electrode 54a, a bent portion 54b, and a side electrode 54c. Its detailed structure is substantially the same as the former exemplary embodiment as illustrated in FIGS. 1 and 2, so a repeated description will be omitted.

When the contact part 55 is formed to be separated from the lead frame 51, the contact part 55 may play the same role as the lead frame 51. For example, when the contact part 55 has a positive electrode, both the first lead part 52 and the second lead part 53 have a negative electrode, and the LED chip 111 may be mounted on the contact part 55 through a conductive adhesive and the like.

The contact part 55 may simply allow the LED chip 11 to be mounted thereon and serve as a heat sink for releasing heat, and in this case, the first and second lead parts 52 and 53 have different electrodes, and the LED chip 11 is mounted on the contact part 55 through a non-conductive adhesive or the like.

An LED package according to a fourth exemplary embodiment of the present invention will now be described with reference to FIGS. 25 to 27.

Figure 25:
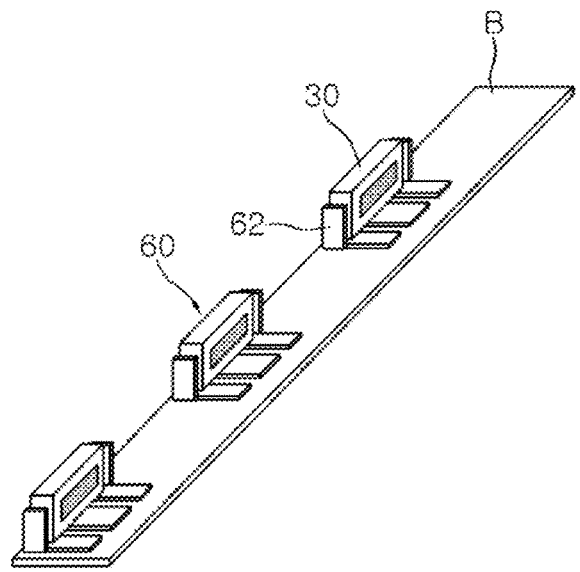
FIG. 25 is a perspective view showing a state of an LED package according to a fourth exemplary embodiment of the present invention.
Figure 26:
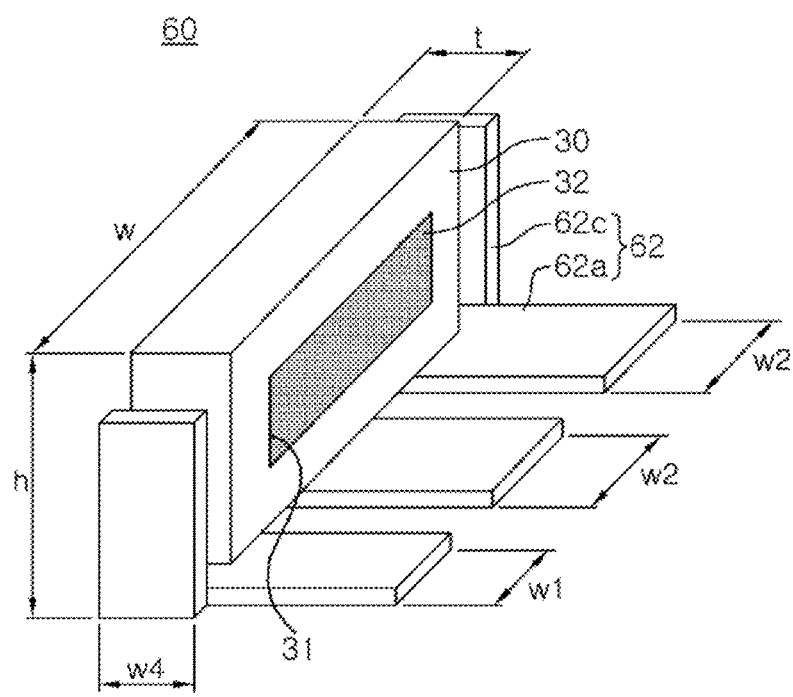
FIG. 26 is an enlarged perspective view showing the LED package of FIG. 25.
Figure 27:
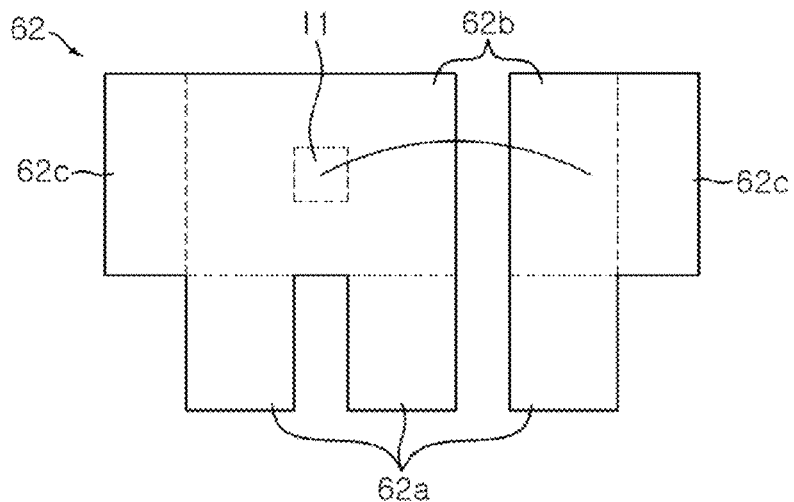
FIG. 27 is a plan view showing a lead frame of the LED package of FIG. 26.

FIG. 25 is a perspective view showing a state of the LED package according to a fourth exemplary embodiment of the present invention, FIG. 26 is an enlarged perspective view showing the LED package of FIG. 25, and FIG. 27 is a plan view showing a lead frame of the LED package of FIG. 26.

With reference to FIGS. 25 to 27, an LED package 60 includes a pair of lead frame 62 having a first lead part 62a tightly mounted on the board (B) and a second lead part 62b extending from the first lead part 62a and being perpendicular to the board (B), the LED chip 11 mounted on the second lead part 62b and providing light, and a main body 30 surrounding the periphery of the second lead part 62b on which the LED chip 11 is mounted and having an opening 31 to provide light from the LED chip 11 to a light guide plate.

The LED chip 11 mounted on the second lead part 62b of the lead frame 62 is electrically connected with the second lead part 62b through a conductive wire. However, in the present invention, the structure in which the LED chip 11 mounted on the second lead part 62b of the lead frame 62 is flip chip-bonded is not excluded, so such conductive wire is not necessarily required.

If the LED chip 11 is a blue LED, the LED package 60 may include a sealing member 32 formed at the opening to provide white light. In this case, the sealing member 32 may include a yellow phosphor. For example, the sealing member 32 may be formed by injecting a gel type epoxy resin containing a YAG-based yellow phosphor or a gel type silicon resin containing the YAG-based yellow phosphor into the opening 31 of the main body 30 and then UV hardening or thermosetting it.

A detailed configuration of the phosphor contained in the sealing member 32 has been already described above, so its description will be omitted.

In the present exemplary embodiment, the lead frame 62 of the LED package 60 may be modified in various manners. In this case, a major technical feature of the present invention is that when light provided from the LED chip 11 proceeds at a level with the bottom surface of the board (B) in the separation type backlight unit, the first lead part 62a is formed to be level with the light proceeding direction, tightly and fixedly attached on the board (B) and the second lead part 62b formed to extend from the first lead part 62a such that it is perpendicular to the bottom surface of the board (B).

The lead frame 62 according to the present invention additionally includes third lead parts 62c formed on outer sides of the second lead parts 62b disposed in parallel and having a width w4 which is the same as or smaller than the thickness (t) of the main body 30. The third lead parts 62c are positioned on the side of the package main body 30 to further increase the heat dissipation efficiency of the LED chip 11. Here, if the thickness (t) of the main body 30 is 5 mm, the width (w4) of the third lead parts 62c formed on the outer sides of the second lead part 62b may be equal to 5 mm or less.

In addition, the separation type backlight unit according to the present invention has the advantage of making the backlight unit thinner in terms of structure. That is, the width (W) of the main body 30 may be increased while lowering the height of the second lead part 62b, specifically, the height (h) of the main body 30 in order to increase the size of the LED chip 11 in the direction perpendicular to the light proceeding direction to thereby maintain the same or larger amount of light as or than that of the related art. In addition, through free designing, such as forming the main body such that the widths (w1, w2, and w3) of the first lead parts 62a constituting the lead frame 62 and the overall width (w1 to w3) from one side to the other side of the first lead part 62a are larger than the width (W) of the main body 30, the heat dissipation effect can be further improved.

Through the structure of the first lead part 62a having the wide widths w1, w2, and w3, the LED package 60 can be quickly and smoothly assembled by an automated assembly process (e.g., SMT) when mounted on the board (B). Thus, the assembly process time duration can be shortened to increase production yield. For example, the first lead part 62a of the lead frame 62 is tightly fixed with the board (B) through a recess formed to allow wire to be exposed from the board (B) and solder filled in the recess.

Accordingly, the first lead part 62a of the lead frame 62 serves as an electrode to which voltage is applied, and at the same time, it serves to smoothly release heat through a lower cover (not shown) provided at a lower side by increasing the unit area being in contact with the board (B).

An LED package according to a fifth exemplary embodiment of the present invention will now be described with reference to FIGS. 28 to 30.

Figure 28:
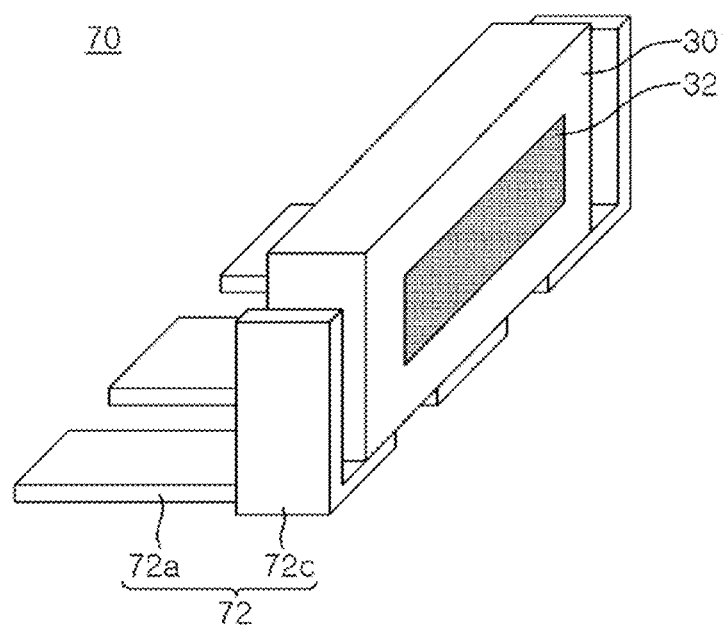
FIG. 28 is a perspective view of a modification of the LED package of FIG. 26.
Figure 29:
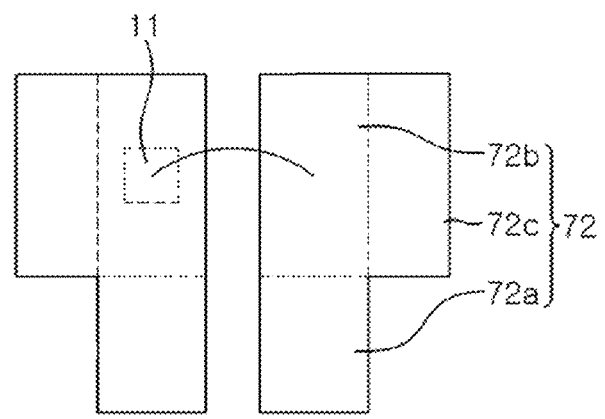
FIG. 29 is a plan view of a lead frame of a modification of the LED package of FIG. 28.

FIG. 28 is a perspective view of a modification of the LED package of FIG. 26, and FIG. 29 is a plan view of a lead frame of a modification of the LED package of FIG. 28.

As shown in FIG. 28, compared with the LED package illustrated in FIG. 26, an LED package 70 according to the fifth exemplary embodiment of the present invention is configured such that a first lead part 72a of a lead frame 72 is formed in the opposite direction from the light proceeding direction based on the LED chip 11 mounted on the opening of the main body 30 and providing light. In detail, the first lead part 72a of the lead frame 72 is formed to be bent in the opposite direction from the direction in which light provided from the LED chip 11 mounted on the second lead part 72b formed to be perpendicular to the bottom surface of the board proceeds.

Such a modification in structure may be made according to a design convenience of the LED package including the lead frame 72, may be made for the convenience of an assembly process in mounting the LED package 70 on the board (B), or may be made to improve luminance by removing an element that may be introduced to the light guide plate as light provided from the LED package 60 provided at one side of the light guide plate is interfered with by the first lead part 62a of the lead frame 62 disposed in the light proceeding direction.

Except for the fact that the first lead part 72a of the lead frame 72 is formed in the opposite direction from the light proceeding direction, the LED package according to the fifth exemplary embodiment is not greatly different from the above-described content, so a detailed description thereof will be replaced by the content of the LED package 60 as described above.

In addition, as shown in FIG. 29, the lead frame 72 includes a first read part 72a fixedly attached to the board (B) and a second lead part 72b extending to be perpendicular to the first lead part 72a, on which the LED chip 11 is mounted. The first lead part 72a may be formed as a pair of lead frames including only two first lead parts 72a.

Figure 30:
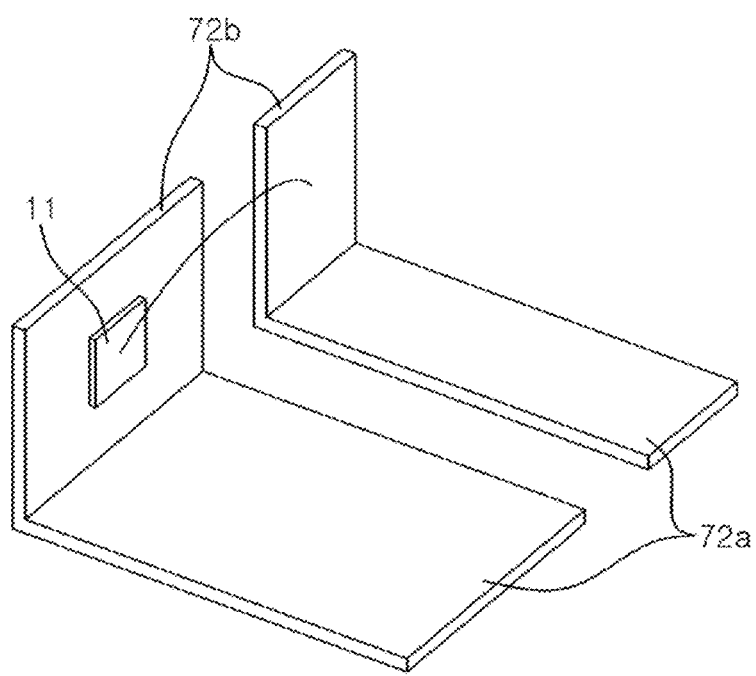
FIG. 30 is a perspective view of a modification of the lead frame in FIG. 28.

Also, in an exemplary embodiment of the present invention, as shown in FIG. 30, a pair of lead frames 72 may be formed including only the second lead parts 72b on which the LED chip 11 is mounted and the first lead parts 72a formed to be perpendicular to the second lead parts 72b and tightly fixed to the board (B).

An LED package according to a sixth exemplary embodiment of the present invention will now be described with reference to FIGS. 74 and 75.

Figure 74:
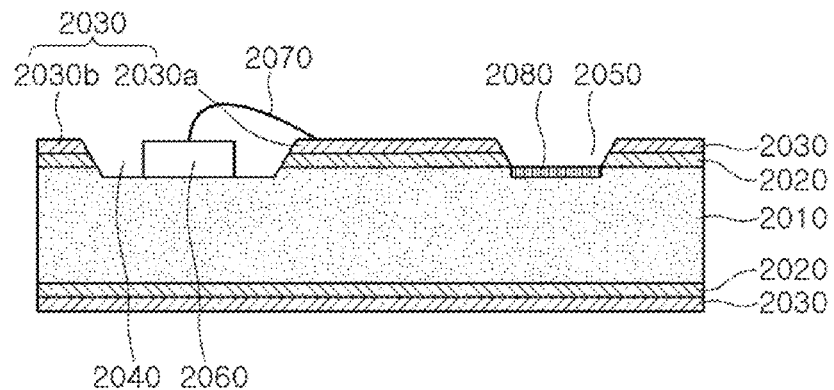
FIGS. 74 to 119 illustrate the LED packages in accordance with the sixth embodiment to the eleventh embodiment of the present invention.
Figure 75:
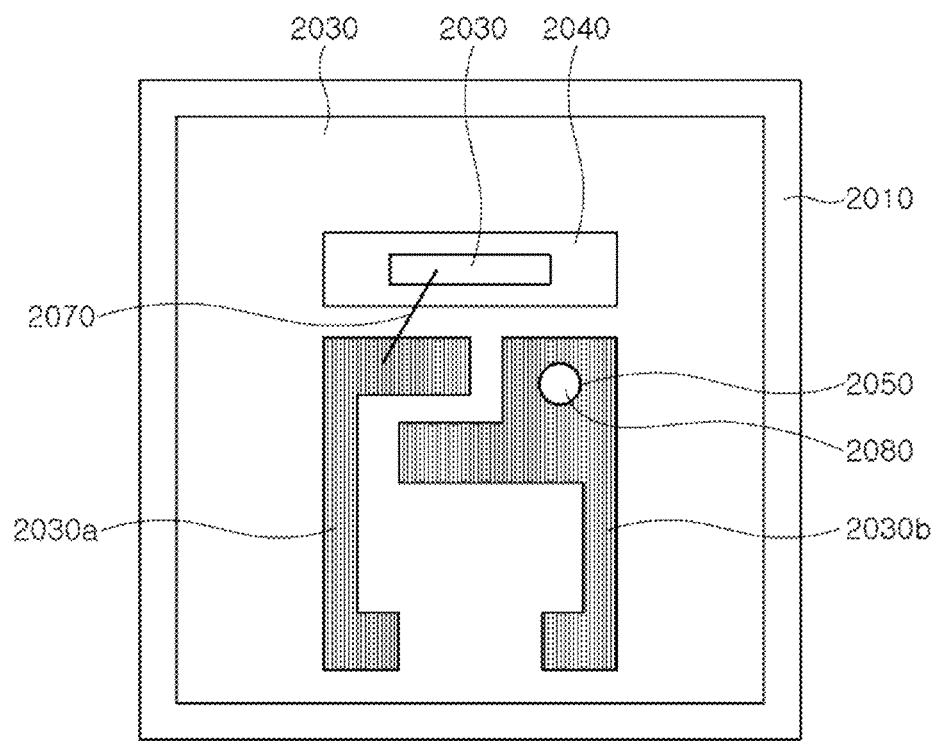

FIG. 74 is a cross-sectional view showing a structure of the light emitting device package in accordance with the sixth exemplary embodiment of the present invention and FIG. 75 is a plane-view of FIG. 74.

As shown in FIG. 74 and FIG. 75, the LED package includes a metal core 2010, an insulating layer 2020 formed on the metal core 2010 and a metal layer 2030 formed on the insulating layer 2020.

The insulating layer 2020 and the metal layer 2030 may be formed only on a top surface of the metal core 2010, however, as shown in the drawing, be formed on both the top surface and a bottom surface of the metal core 2010.

A first cavity 2040 is formed to expose the top surface of the metal core 2010 by removing parts of the metal layer 2030 and the insulating layer 2020. The first cavity 2040 supplies a space for mounting a light emitting device 2060 and may be formed through a processing method such as mechanical processing or etching or the like.

Herein, the metal layer 2030 may have a first electrode 2030a and a second electrode 2030b electrically separated from each other on positions adjacent to the first cavity 2040.

The light emitting device 2060 is directly mounted on the top surface of the metal core 2010 exposed by the first cavity 2040.

The metal core 2010 may be made of material with a high thermal conductivity, for example, a metal such as aluminum (Al) or the like.

The insulating layer 2020 as an oxide film layer ($Al_2O_3$) may be formed through anodizing treatment on the metal core 2010 made of the Al or a conventional insulating layer such as a polymer based insulating layer or the like may be formed on a surface of the metal core 2010, however, it is preferable to form the oxide film layer ($Al_2O_3$) capable of realizing low thermal resistance by having a relatively high thermal conductivity and a thin thickness.

The Al is easily obtainable metal material at a comparatively low cost and further has a very high thermal conductivity. Further, the oxide film layer ($Al_2O_3$) obtained through the anodizing treatment also has the relatively high thermal conductivity of approximately 10~30 W/mK.

Therefore, the metal core 2010 can have a high heat discharging performance in comparison with a PCB (Printed Circuit Board) or an MCPCB (Metal Core Printed Circuit Board) made of conventional polymer material. Moreover, a process for anodizing the Al is a comparatively easy process and reduces process cost and time.

The light emitting device 2060 as a light source device for generating light such as a light emitting diode is directly mounted on the top surface of the metal core 2010 to be connected.

And, the light emitting device 2060 and the metal layer 2030 placed on a position adjacent to the first cavity 2040, for example, a first electrode 2030a may be electrically connected through a bonding wire 2070.

Through the above described construction, the light emitting device 2060 electrically connected to the metal core 2010 and the first electrode 2030a on the insulating layer 2020 is operated to discharge light outside by being applied with power through the metal core 2010 and the first electrode 2030a.

That is, in the LED package in accordance with the present embodiment, the light emitting device 2060 has a vertical electrode structure, one electrode (not shown) of the light emitting device 2060 is directly connected to the metal core 2010 and the other electrode (not shown) thereof is connected to the adjacent metal layer 2030 through the bonding wire 2070.

Therefore, it is preferable that when the metal core has electrically (+) polarity, a portion of the metal layer 2030a wire-bonded to the light emitting device 2060 has electrically (−) polarity.

As described above, the LED package in accordance with the present embodiment directly mounts the light emitting device 2060 on the metal core 2010 made of Al with the high thermal conductivity, thereby effectively discharging heat generated from the light emitting device 2060 to the outside through the metal core 2010.

Further, the metal core 2010 is used not only as a substrate mounting the light emitting device 2060 but also as one electric passage applying power to the light emitting device 2060, thereby reducing a manufacturing cost by simplifying components and manufacturing processes of the LED package.

At this time, on a position apart from the first cavity mounting the light emitting device 2060 at a predetermined distance, a second cavity 2050 is formed by removing parts of the metal layer 2030 and the insulating layer 2020 to expose the top surface of the metal core 2010.

The second cavity 2050 is an opened part to play a role of a package by electrically connecting the metal core 2010 to the outside, thereby electrically connecting the device to the outside through a connector or other connection method.

A conductive layer 2080 for electrical connection to the outside may be formed on the top surface of the metal core 2010 in the second cavity 2050. The conductive layer may be made of Au, Ag, Ni or Cu, and so on.

The conductive layer 2080 may be a metal plating layer formed in a plating method or high-temperature cured metal paste.

As described above, because the LED package in accordance with the sixth embodiment directly mounts the light emitting device 2060 on top surface of the metal core 2010, a heat discharging performance thereof is improved to be applicable to a high heat generating device and further an entire structure and a manufacturing process thereof are simplified to reduce a cost.

Figure 76:
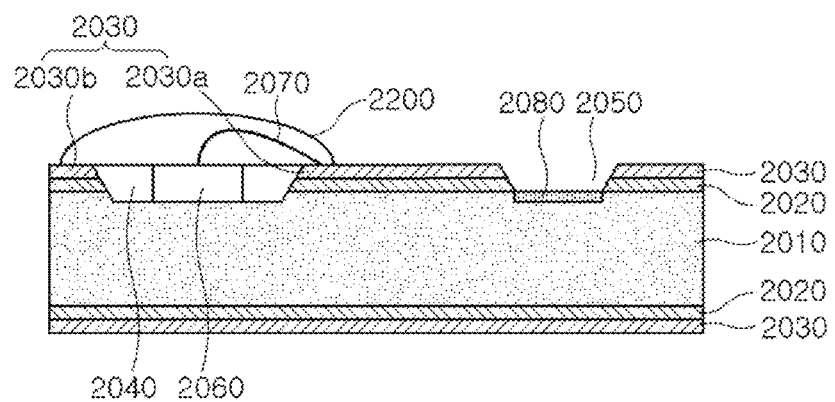
Figure 77:
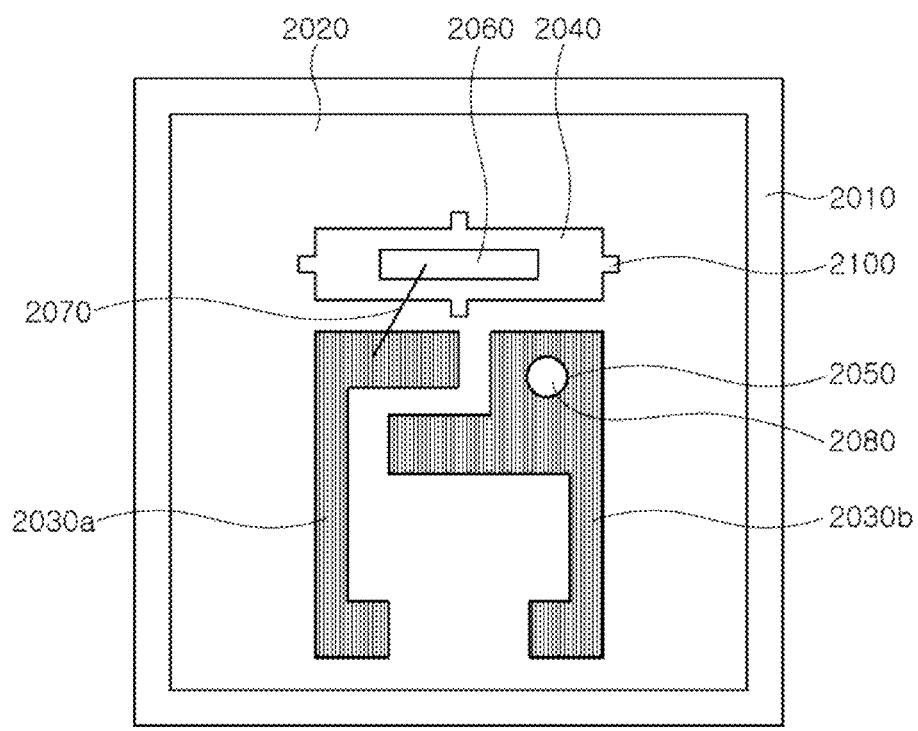
Figure 78:
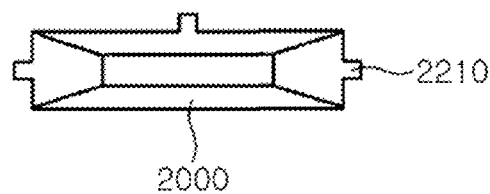

Herein, FIG. 76 is a cross-sectional view showing a structure of the LED package including a cap in accordance with the sixth embodiment of the present invention, FIG. 77 is a plan-view showing the structure of the LED package including grooves for fixing the cap in FIG. 76, and FIG. 78 is a view showing an example of the cap.

In the light emitting device package in accordance with the sixth embodiment of the present invention, as shown in FIG. 76, a cap 2200 may be formed on an upper part of the first cavity 2040 mounting the light emitting device 2060.

The cap 2200 may be a protection cap for protecting the light emitting device 2060 or a lens.

At this time, as shown in FIG. 77, on positions adjacent to the first cavity 2040 mounting the light emitting device 2060, grooves 2100 are further formed by removing parts of the metal layer 2030 and the insulating layer 2020 to expose the top surface of the metal core 2010.

The grooves 2100 are to easily array and fix a position of the cap 2200 and the present invention is not limited to the number and the positions of the grooves 2100.

And, as shown in FIG. 78, protrusions 2210 formed on a circumferential portion of the cap 2200 are inserted into the grooves 2100 and the cap 2200 can be coupled to the upper part of the first cavity 2040.

As described above, when forming the cap 2200 on the upper part of the light emitting device 2060, it is possible to easily array a position of the cap 2200 and also stably fix not to move the cap 2200 by forming the grooves 2100 to expose the metal core 2010 and inserting the protrusions 2210 formed on the circumferential portion of the cap 2200 into the grooves 2100.

A modified embodiment of the sixth embodiment will be described with reference to FIG. 79. Only, description for the same construction of the modified embodiment as that of the sixth embodiment will be omitted and only different construction thereof from that of the sixth embodiment will be described in detail.

Figure 79:
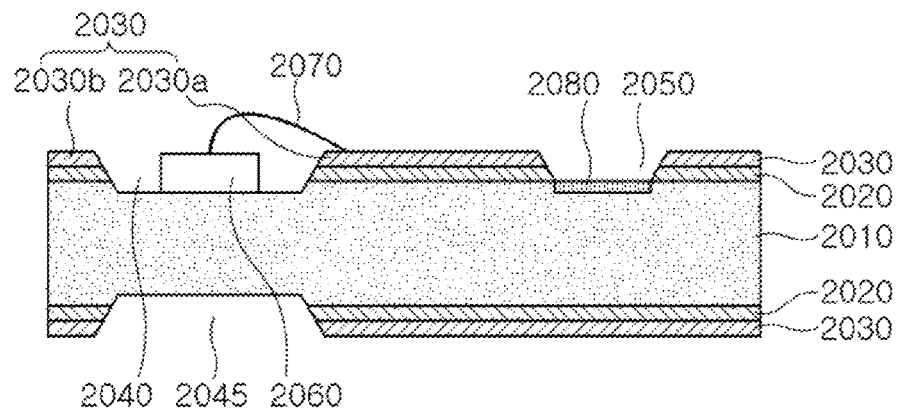

FIG. 79 is a cross-sectional view showing a modified embodiment of the LED package in accordance with the sixth embodiment.

In accordance with the modified embodiment of the sixth embodiment, most of construction of the LED package is the same as that of the above-described LED package in accordance with the sixth embodiment, only as shown in FIG. 79, there is difference from the LED package in accordance with the sixth embodiment in that a third cavity 2045 to expose a bottom surface of the metal core 2010 is formed by removing parts of the insulating layer and the metal layer sequentially formed on the bottom surface of the metal core 2010.

The third cavity 2045 is preferably formed on a position corresponding to the first cavity to expose the top surface of the metal core 2010.

In accordance with the modified embodiment of the sixth embodiment, the LED package is capable of preventing warpage or deformation of the metal core 2010 through the third cavity 2045 formed on the position vertically corresponding to the first cavity 2040 as well as obtaining the same operation and effect as those of the LED package in accordance with the sixth embodiment.

Hereinafter, a method of manufacturing the LED package in accordance with the sixth embodiment of the present invention will be described in detail with reference to FIG. 80 to FIG. 85.

FIG. 80 to FIG. 85 are cross-sectional views sequentially showing the method of manufacturing the LED package in accordance with the sixth embodiment.

Figure 80:
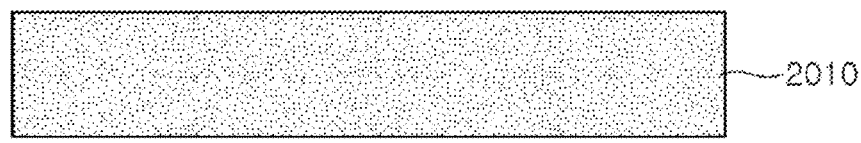

First of all, as shown in FIG. 80, a metal core 2010 is supplied. The metal core may be made of aluminum or the like.

Figure 81:
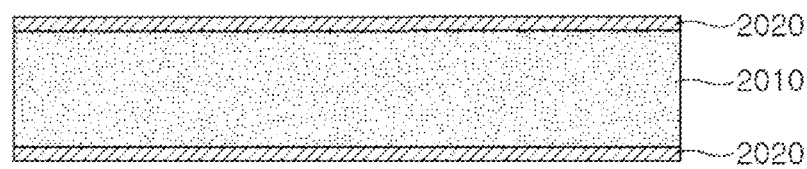

Then, as shown in FIG. 81, insulating layers 2020 are formed on the metal core 2010. The insulating layers 2020 may be formed through anodizing treatment on both a top surface and a bottom surface of the metal core 2010 as shown in the drawing or only on the top surface of the metal core 2010.

Figure 82:
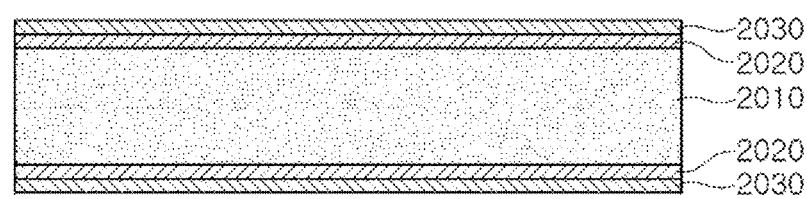

Then, as shown in FIG. 82, metal layers 2030 are formed on the insulating layers 2020. The metal layers 2030 like the insulating layers 2020 may be formed on both an upper part and a lower part of the metal core 2010 or only on the upper part of the metal core.

Figure 83:
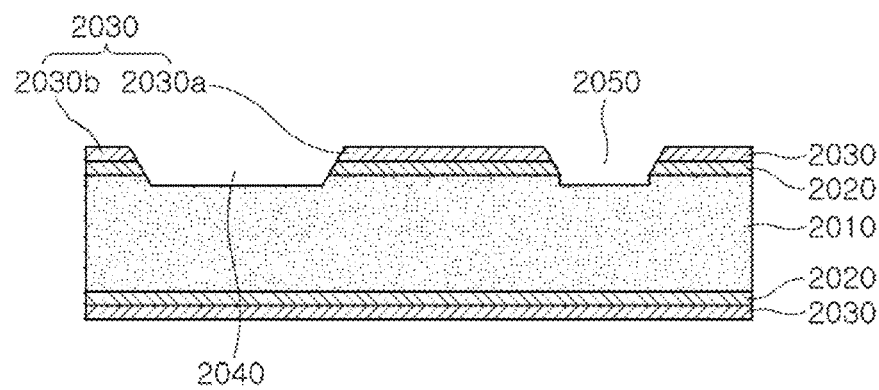

Then, as shown in FIG. 83, a first cavity 2040 to expose the top surface of the metal core 2010 is formed by removing parts of the metal layer 2030 and the insulating layer 2020. Herein, after forming the first cavity 2040, a second cavity 2050 to expose the top surface of the metal core is formed on a position apart from the first cavity 2040 at a predetermined distance by removing parts of the metal layer 2030 and the insulating layer 2020. The second cavity 2050 may be simultaneously formed when the first cavity 2040 is formed.

Figure 84:
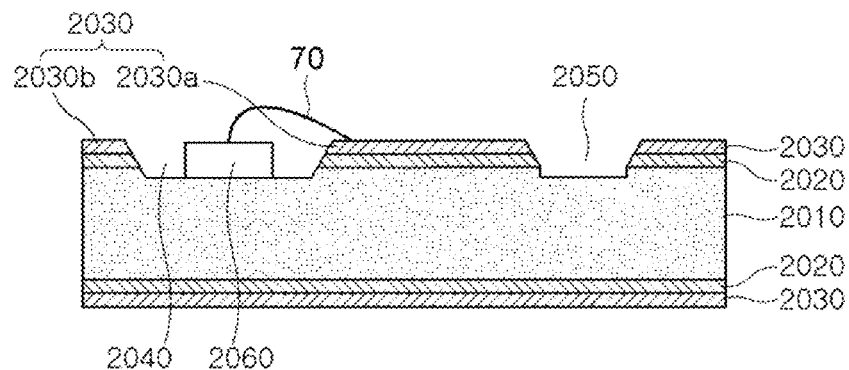

Then, as shown in FIG. 84, a light emitting device 2060 with a vertical electrode structure is directly mounted on the top surface of the metal core 2010 in the first cavity 2040, and then the light emitting device 2060 and the metal layer 2030 placed on a position adjacent to the first cavity 2040 are electrically connected through a bonding wire 2070.

Figure 85:
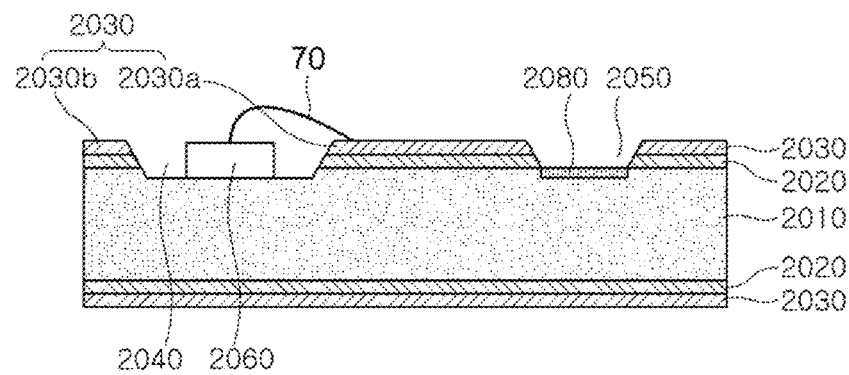

Then, as shown in FIG. 85, a conductive layer 2080 is formed on the top surface of the metal core 2010 in the second cavity 2050. The conductive layer 2080 may be made of Au, Ag, Ni or Cu or the like. Further, the conductive layer 2080 may be a metal plating layer formed in a plating method or high-temperature cured metal paste.

Meanwhile, as described above, when forming the insulating layer 2020 and the metal layer 2030 on the bottom surface of the metal core 2010 as well as the top surface thereof, although not shown in the drawings, a third cavity (referring to a reference numeral '2045' in FIG. 79) may be formed by removing parts of the metal layer 2030 and the insulating layer 2020 formed on the bottom surface of the metal core 2010 to expose the bottom surface of the metal core 2010 on a position corresponding to the first cavity 2040. In this case, it is possible to prevent warpage or deformation of the metal core 2010 through the third cavity 2045.

Then, a cap 2200 may be formed on an upper part of the first cavity 2040 mounting the light emitting device 2060. When forming the cap 2200, grooves 2100 may be further formed on a position adjacent to the first cavity 2040 by removing parts of the metal layer 2030 and the insulating layer 2020 to expose the top surface of the metal core 2010.

Then, the cap with protrusions 2210 formed on a circumferential portion is coupled to the upper part of the first cavity 2040. At this time, it is preferable to insert the protrusions formed on the cap 2200 into the grooves 2100.

Hereinafter, a LED package in accordance with a seventh embodiment of the present invention will be described in detail with reference to FIG. 86. Only, description for the same construction of the seventh embodiment as that of the sixth embodiment will be omitted and only different construction thereof from that of the sixth embodiment will be described in detail.

Figure 86:
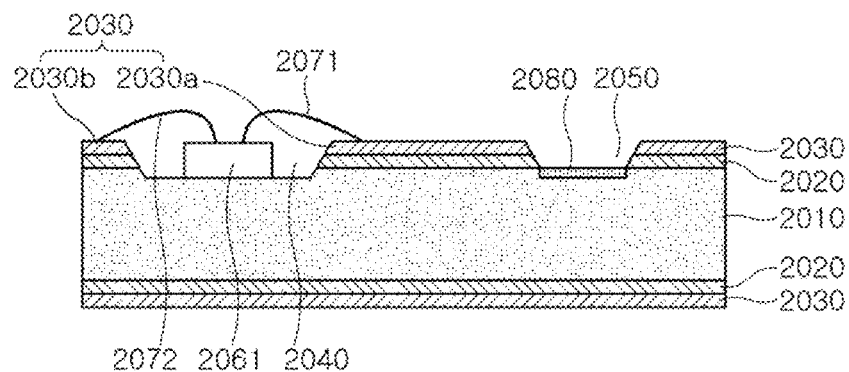

FIG. 86 is a cross-sectional view showing a structure of the LED package in accordance with the seventh embodiment of the present invention.

As shown in FIG. 86, in accordance with the seventh embodiment, most of construction of the LED package is the same as that of the LED package in accordance with the sixth embodiment, only there is difference from the LED package in accordance with the sixth embodiment in that a light emitting device 2061 has a parallel electrode structure not the vertical structure package, one electrode (not shown) of the light emitting device 2061 is electrically connected to a first electrode 2030*a* of a metal layer 2030 through a first boding wire 2071 and the other electrode (not shown) thereof is electrically connected to a second electrode 2030*b* electrically separated from the first electrode 2030*a* through a second bonding wire 2072.

That is, in accordance with the seventh embodiment of the present invention, the LED package includes a metal core 2010, an insulating layer 2020 formed on the metal core 2010, the metal layer 2030 formed on the insulating layer 2020 and having the a first electrode 2030*a* and a second electrode 2030*b* electrically separated from each other, a first cavity 2040 formed by removing parts of the metal layer 2030 and the insulating layer 2020 to expose the top surface of the metal core 2010 and the light emitting device 2061 with the parallel electrode structure directly mounted on the top surface of the metal core 2010 in the first cavity 2040.

The metal core 2010 may be aluminum or the like and the insulating layer 2020 may be composed of an oxide film layer ($Al_2O_3$) or the like formed through anodizing treatment.

As described above, the light emitting device 2061 is connected to the first electrode 2030a through the first bonding wire 2071 and to the second electrode 2030b through the second bonding wire 2072.

It is preferable that the first electrode 2030a and the second electrode 2030b electrically connected to the light emitting device 2061 are placed on a position adjacent to the first cavity 2040 mounting the light emitting device 2061 to facilitate a wire bonding process.

The light emitting device 2061 is operated to discharge light to the outside by being applied with power through the first and second electrodes 2030a and 2030b of the metal layer 2030. Therefore, it is preferable that when the first electrode 2030a has electrically (−) polarity, the second electrode 2030b has electrically (+) polarity.

On a position apart from the first cavity 2040 at a predetermined distance, a second cavity 2050 is formed by removing parts of the metal layer 2030 and the insulating layer 2020 to expose the top surface of the metal core 2010.

A conductive layer 2080 for electrical connection to the outside may be formed on the top surface of the metal core 2010 in the second cavity and made of Au, Ag, Ni or Cu or the like. The conductive layer 2080 may be a metal plating layer formed in a plating method or high-temperature cured metal paste.

And, although not shown in the drawing, in accordance with the seventh embodiment of the present invention like the modified embodiment of the sixth embodiment, the light emitting device package may further include an insulating layer 2020 and a metal layer 2030 sequentially formed on a bottom surface of the metal core 2010 and having a third cavity (referring to a reference numeral '2045' in FIG. 79) to expose the bottom surface of the metal core 2010 on a position corresponding to the first cavity 2040.

Further, in accordance with the seventh embodiment of the present invention like the above mentioned sixth embodiment of the present invention, the LED package may further include grooves 2100 to expose the top surface of the metal core 2010 on positions adjacent to the first cavity 2040 by removing parts of the metal layer 2030 and the insulating layer 2020. And, protrusions 2210 formed on a circumferential portion of the cap 2200 are inserted into the grooves 2100 and the cap 2200 can be coupled to an upper part of the first cavity 2040.

In accordance with the seventh embodiment of the present invention, the LED package is capable of improving a heat discharging performance and simplifying an entire structure and a manufacturing process by directly mounting the light emitting device 2061 on the top surface of the metal core 2010 with a high thermal conductivity.

A modified embodiment of the seventh embodiment will be described with reference to FIG. 87. Only, description for the same construction of the modified embodiment as that of the seventh embodiment will be omitted and only different construction thereof from that of the seventh embodiment will be described in detail.

Figure 87:
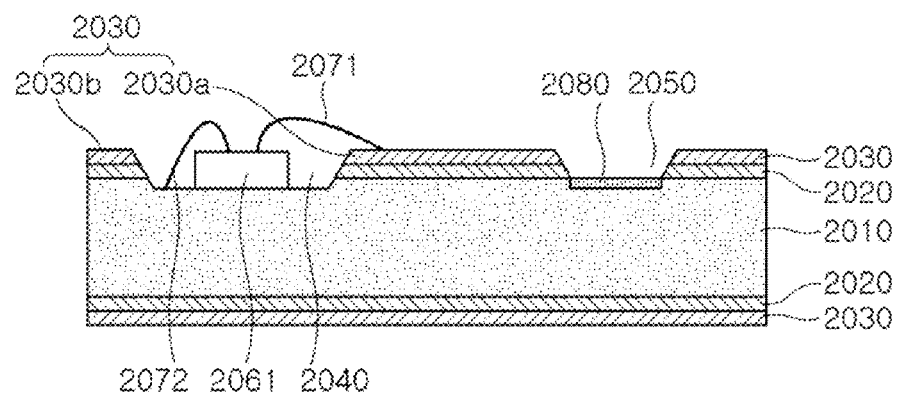

FIG. 87 is a cross-sectional view showing a modified embodiment of the LED package in accordance with the seventh embodiment of the present invention.

As shown in FIG. 87, in accordance with of the modified embodiment of the seventh embodiment of the present invention, most of construction of the LED package is the same as that of the above-mentioned LED package in accordance with the seventh embodiment, only there is difference from the LED package in accordance with the seventh embodiment in that one electrode (not shown) of a light emitting device 2061 with a parallel electrode structure is electrically connected to a first electrode 2030a through a first bonding wire 2071 and the other electrode (not shown) thereof is electrically connected to a metal core 2010 exposed by a first cavity 2040 through a second bonding wire 2072.

At this time, it is preferable that when the metal core 2010 has electrically (+) polarity, the first electrode 2030a has electrically (−) polarity.

And, although not shown in the drawing, in accordance with the modified embodiment of the seventh embodiment like the above-mentioned modified embodiment of the sixth embodiment, the LED package may further include an insulating layer 2020 and a metal layer 2030 sequentially formed on a bottom surface of the metal core 2010 and having a third cavity (referring to a reference numeral '2045' in FIG. 79) to expose the bottom surface of the metal core 2010 on a position corresponding to the first cavity 2040.

Further, as described above, in accordance with the modified embodiment of the seventh embodiment of the present invention, the LED package may further include grooves 2100 formed on positions adjacent to the first cavity 2040 to expose the top surface of the metal core 2010, and a cap 2200 coupled to an upper part of the first cavity 2040 by inserting protrusions 2210 formed on a circumferential portion of the cap 2200 into the grooves 2100.

In accordance with the modified embodiment of the seventh embodiment of the present invention, the LED package is capable of improving a heat discharging performance by discharging heat generated from the light emitting device 2061 directly mounted on the metal core 2010 to the outside through the metal core.

Further, the metal core is used as one electric passage applying power to the light emitting device 2061 and therefore components and manufacturing processes of the LED package are simplified to reduce a cost.

Hereinafter, a method of manufacturing the LED package in accordance with the seventh embodiment of the present invention will be described in detail with reference to FIG. 80 to FIG. 83, FIG. 86 and FIG. 87. Only, description for the same construction of the seventh embodiment as that of the sixth embodiment will be omitted and only different construction thereof from that of the sixth embodiment will be described in detail.

First of all, as shown in FIG. 80, a metal core 2010 is supplied, and then, as shown in FIG. 81, insulating layers 2020 are formed on the metal core 2010.

Then, as shown in FIG. 82, metal layers 2030 are formed on the insulating layers 2020.

Then, as shown in FIG. 83, a first cavity 2040 is formed by removing parts of the metal layer 2030 and the insulating layer 2020 to expose the top surface of the metal core 2010. At this time, a first electrode 2030a and a second electrode 2030b electrically separated from each other may be formed on the insulating layer 2020 adjacent to the first cavity 2040.

Herein, after forming the first cavity 2040, a second cavity 2050 is formed by removing parts of the metal layer 2030 and the insulating layer 2020 to expose the top surface of the metal core 2010 on a position apart from the first cavity 2040 at a predetermined distance. The second cavity 2050 may be simultaneously formed when the first cavity 2040 is formed.

Then, as shown in FIG. 86, a light emitting device 2061 with a parallel electrode structure is directly mounted on the top surface of the metal core 2010 in the first cavity 2040, and then the light emitting device 2061 and the first electrode 2030a are electrically connected through a first boding wire 2071 and the light emitting device 2061 and the second electrode 2030b are electrically connected through a second bonding wire 2072.

Then, a conductive layer 2080 is formed on the top surface of the metal core 2010 in the second cavity 2050.

Meanwhile, the light emitting device 2061 may be electrically connected to the metal core 2010 exposed by the first cavity as shown in FIG. 87 instead of the second electrode 2030b as shown in FIG. 86 through the second bonding wire 2072.

Further, as described above, when the insulating layer 2020 and the metal layer 2030 are formed on a bottom surface of the metal core 2010, although not shown in the drawing, a third cavity (referring to a reference numeral '2045' in FIG. 79) may be formed by removing a part of the metal layer 2030 and the insulating layer 2020 formed on the bottom surface of the metal core 2010 to expose the bottom surface of the metal core 2010 on a position corresponding to the first cavity 2040.

Hereinafter, a light emitting device package in accordance with a eighth embodiment of the present invention will be described in detail with reference to FIG. 88. Only, description for the same construction of the eighth embodiment as that of the sixth embodiment will be omitted and only different construction thereof from that of the sixth embodiment will be described in detail.

Figure 88:
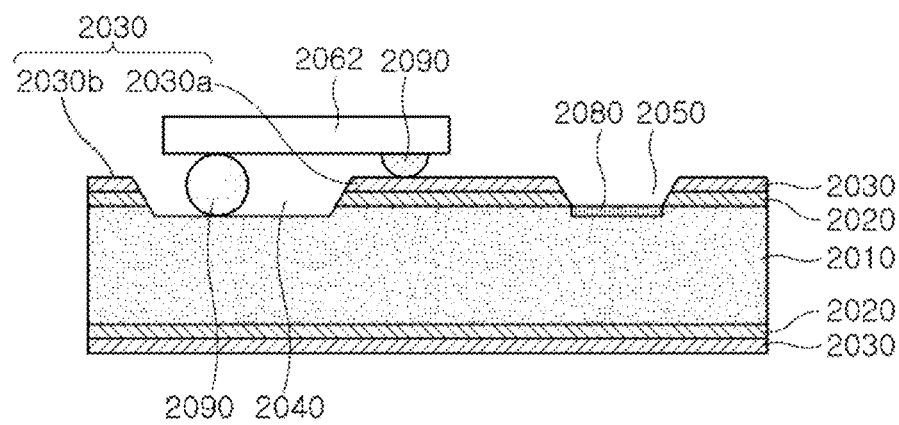

FIG. 88 is a cross-sectional view showing a structure of the LED package in accordance with the eighth embodiment of the present invention.

As shown in FIG. 88, in accordance with the eighth embodiment of the present invention, most of construction of the LED package is the same as that of the above-mentioned LED package in accordance with the sixth embodiment, only there is difference from the LED package in accordance with the sixth embodiment in that a light emitting device 2062 has a flip chip structure not the vertical electrode structure and includes connection units 2090 on a bottom surface and the connection units 2090 are electrically connected to a metal core 2010 exposed by the first cavity 2040 and a first electrode 2030a respectively.

It is preferable that the first electrode 2030a electrically connected to any one of the connection units 2090 of the light emitting device 2062 is placed on a position adjacent to the first cavity mounting the light emitting device 2062 so as to facilitate a flip chip bonding process.

At this time, it is preferable that when the metal core 2010 electrically connected to the connection unit 2090 of the light emitting device 2062 has electrically (+) polarity, the first electrode 2030a has electrically (−) polarity.

Herein, the connection units 2090 may be composed of a solder ball as shown in the drawing or a bump (not shown) and a pad (not shown).

Further, in accordance with a modified embodiment of the eighth embodiment like the modified embodiment of the sixth embodiment, although not shown in the drawing, the LED package may further include an insulating layer 2020 and a metal layer 2030 sequentially formed on a bottom surface of the metal core 2010 and having a third cavity (referring to a reference numeral '2045' in FIG. 79) to expose the bottom surface of the metal core 2010 on a position corresponding to the first cavity 2040.

The LED package in accordance with the eighth embodiment is capable of obtaining the same operation and effect as those of the sixth embodiment by directly mounting the light emitting device 2062 on the metal core 2010 through flip chip bonding instead of wire bonding.

Hereinafter, a method of manufacturing the LED package in accordance with the eighth embodiment of the present invention will be described in detail with reference to FIG. 80 to FIG. 83 and FIG. 88. Only, description for the same construction of the eighth embodiment as that of the sixth embodiment will be omitted and only different construction thereof from that of the sixth embodiment will be described in detail.

First of all, as shown in FIG. 80, a metal core 2010 is supplied, and then, as shown in FIG. 81, insulating layers 2020 are formed on the metal core 2010.

Then, as shown in FIG. 82, metal layers 2030 are formed on the insulating layers 2020.

Then, as shown in FIG. 83, a first cavity 2040 is formed by removing parts of the metal layer 2030 and the insulating layer 2020 to expose the top surface of the metal core 2010. At this time, a first electrode 2030a and a second electrode 2030b electrically separated from each other may be formed on the insulating layer 2020 adjacent to the first cavity 2040.

After forming the first cavity 2040, a second cavity 2050 is formed on a position apart from the first cavity 2040 at a predetermined distance to expose the top surface of the metal core 2010. The second cavity 2050 may be simultaneously formed when the first cavity 2040 is formed.

Then, as shown in FIG. 88, a light emitting device 2062 is directly mounted on the top surface of the metal core 2010 in the first cavity 2040. Then, a conductive layer 2080 is formed on the top surface of the metal core 2010 in the second cavity 2050.

Herein, in accordance with the eighth embodiment of the present invention, the light emitting device 2062 of the LED package includes connection units 2090 on a bottom surface. The connection units 2090 may be composed of a bump, a pad or a solder ball or the like and electrically connected to the metal core 2010 and the first electrode 2030a respectively.

Meanwhile, as described above, when the insulating layer 2020 and the metal layer 2030 are formed on a bottom surface of the metal core 2010, a third cavity ((referring to a reference numeral '2045' in FIG. 79) may be formed by removing a part of the metal layer 2030 and the insulating layer 2020 formed on the bottom surface of the metal core 2010 to expose the bottom surface of the metal core 2010 on a position corresponding to the first cavity 2040.

Hereinafter, a LED package in accordance with a ninth embodiment of the present invention will be described in detail with reference to FIG. 89 to FIG. 91. Only, description for the same construction of the ninth embodiment as that of the sixth embodiment will be omitted and only different construction thereof from that of the sixth embodiment will be described in detail.

Figure 89:
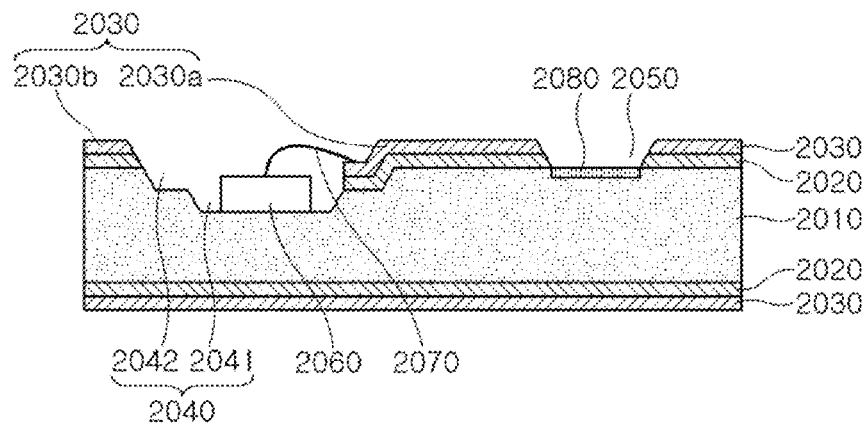
Figure 90:
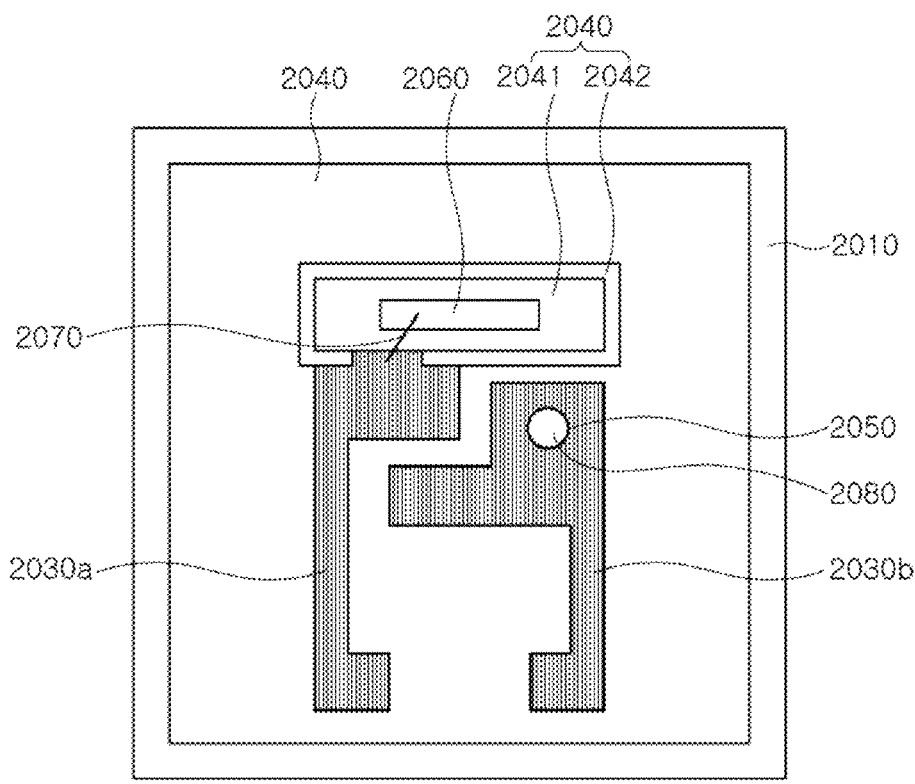
Figure 91:
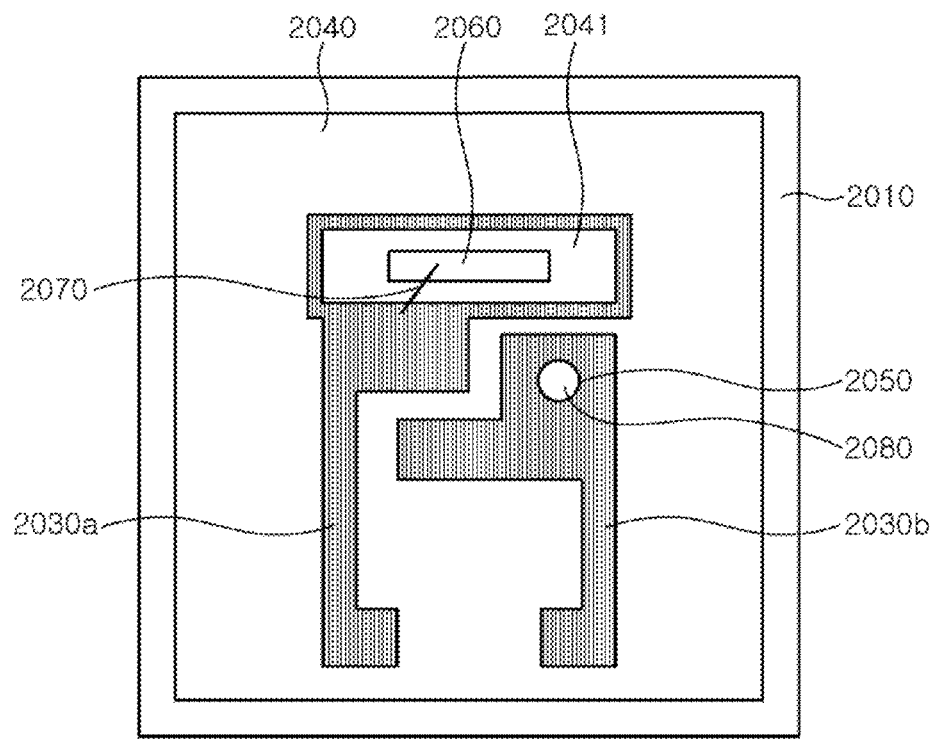

FIG. 89 is a cross-sectional view showing a structure of the LED package in accordance with the ninth embodiment of the present invention, and FIG. 90 and FIG. 91 are plane-views showing the structure of the LED package in accordance with the ninth embodiment of the present invention, wherein FIG. 90 is a view showing a first electrode formed on a partial inner surface of an upper cavity and FIG. 91 is a view showing a first electrode is formed on an entire inner surface of the upper cavity.

As shown in FIG. 89, in accordance with the ninth embodiment of the present invention, most of construction of the LED package is the same as that of the above-mentioned LED package in accordance with the sixth embodiment, only there is difference from the LED package in accordance with the sixth embodiment in that a cavity 2040 has a two-step structure with a lower cavity 2041 and an upper cavity 2042, a first electrode 2030a electrically connected to a light emitting device 2060 through a bonding wire 2070 and an insulating layer 2020 formed on a lower part of the first electrode 2030a are extended to an inner surface of the upper cavity 2042.

That is, in accordance with the ninth embodiment of the present invention, the LED package includes a metal core 2010 having the first cavity 2040 composed of the lower cavity 2041 and the upper cavity 2042, the insulating layer 2020 formed on a top surface of the metal core 2010 excluding the lower cavity 2041 and including the inner surface of the upper cavity 2042; a metal layer 2030 formed on the insulating layer 2020 and having the a first electrode 2030a and a second electrode 2030b electrically separated from each other; a light emitting device 2060 directly mounted on the metal core 2010 in the lower cavity 2041; and the bonding wire 2070 electrically connecting the light emitting device 2060 and the first electrode 2030a.

At this time, when the metal core 2010 has electrically (+) polarity, the first electrode 2030a may have electrically (−) polarity.

The lower cavity 2041 constituting the first cavity 2040 may be formed in a size capable of mounting the light emitting device 2060.

It is preferable that the first electrode 2030a electrically connected to the light emitting device 2060 through the bonding wire 2070 is placed on a position adjacent to the first cavity 2040 mounting the light emitting device 2060 so as to facilitate a wire bonding process.

Particularly, in the ninth embodiment of the present invention, it is preferable that the first electrode 2030a is extended to the inner surface of the upper cavity 2042 and the bonding wire 2070 is bonded on a portion of the first electrode 2030a formed on the inner surface of the upper cavity 2042.

Further, the bonding wire 2070 is preferably formed in a lower height than that of a top surface of the metal layer 2030 formed on the metal core 2010 where the first cavity 2040 is not formed.

Through the above construction, when molding material is filled in the first cavity 2040 to protect the light emitting device 2060 and the bonding wire 2070, the molding material is filled to entirely cover the bonding wire 2070, and therefore it is possible to prevent damage such as disconnection of the bonding wire 2070 in case of handling by preventing the bonding wire 2070 from being exposed to an upper part of the molding material.

Meanwhile, the first electrode 2030a formed on the inner surface of the upper cavity 2042 may be formed on a partial inner surface of the upper cavity 2042 as shown in FIG. 90 or on an entire inner surface of the upper cavity 2042 as shown in FIG. 91.

And, although not shown, in accordance with the ninth embodiment of the present invention like the modified embodiment of the sixth embodiment, the LED package may further include an insulating layer 2020 and a metal layer 2030 sequentially formed on a bottom surface of the metal core 2010 and having a third cavity (referring to a reference numeral '2045' in FIG. 79) to expose the bottom surface of the metal core 2010 on a position corresponding to the first cavity 2040.

Further, in accordance with the ninth embodiment of the present invention, as described above, the LED package may further include grooves 2100 to expose the top surface of the metal core 2010 on positions adjacent to the first cavity 2040 by removing parts of the metal layer 2030 and the insulating layer 2020. And, protrusions 2210 formed on a circumferential portion of a cap 2200 are inserted into the grooves 2100 and the cap 2200 can be coupled to an upper part of the first cavity 2040.

In accordance with the ninth embodiment of the present invention, the LED package is capable of obtaining the same operation and effect and further preventing damage of the bonding wire 2070 by forming the bonding wire 2070 electrically connected to the light emitting device 2060 inside a substrate not to be projected to an upper part of the substrate including the metal core 2010 through the first cavity 2040 with the two-step structure being formed on the metal core 2010 and the light emitting device 2060 being mounted in the lower cavity 2041 of the first cavity 2040, thereby enhancing reliability.

A modified embodiment of the ninth embodiment will be described with reference to FIG. 92. Only, description for the same construction of the modified embodiment as that of the ninth embodiment will be omitted and only different construction thereof from that of the ninth embodiment will be described in detail.

Figure 92:
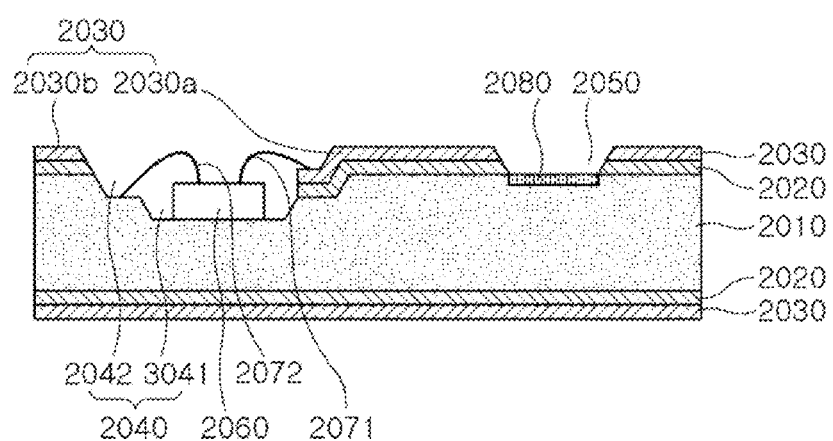

FIG. 92 is a cross-sectional view showing a modified embodiment of the LED package in accordance with the ninth embodiment of the present invention.

As shown in FIG. 92, in accordance with of the modified embodiment of the ninth embodiment of the present invention, most of construction of the LED package is the same as that of the above-mentioned LED package in accordance with the ninth embodiment, only there is difference from the LED package in accordance with the ninth embodiment in that a light emitting device 2060 has a parallel electrode structure not a vertical electrode structure, one electrode (not shown) of the light emitting device 2060 is electrically connected to a first electrode 2030a through a first boding wire 2071 and the other electrode (not shown) thereof is electrically connected to a portion of a metal core 2010 where an insulating layer 2020 is not formed through a second bonding wire 2072.

At this time, it is preferable that when the metal core 2010 has electrically (+) polarity, the first electrode 2030a has electrically (−) polarity.

And, in accordance with the modified embodiment of the ninth embodiment, as described above, the LED package may further include an insulating layer 2020 and a metal layer 2030 sequentially formed on a bottom surface of the metal core 2010 and having a third cavity (referring to a reference numeral '2045' in FIG. 79) to expose the bottom surface of the metal core 2010 on a position corresponding to the first cavity 2040.

Further, in accordance with the modified embodiment of the ninth embodiment, the LED package may further include grooves 2100 formed on positions adjacent to the first cavity 2040 to expose the top surface of the metal core 2010, and a cap 2200 coupled to an upper part of the first cavity 2040 by inserting protrusions 2210 formed on a circumferential portion of the cap 2200 into the grooves 2100.

Hereinafter, a method of manufacturing the LED package in accordance with the ninth embodiment of the present invention will be described in detail with reference to FIG. 89. Only, description for the same construction of the ninth embodiment as that of the sixth embodiment will be omitted and only different construction thereof from that of the sixth embodiment will be described in detail.

Referring to FIG. 89, first of all, a metal core 2010 with a first cavity 2040 composed of a lower cavity 2041 and an upper cavity 2042 is supplied.

Then, an insulating layer 2020 is formed on a top surface of the metal core 2010 excluding the lower cavity 2041 and including an inner surface of the upper cavity 2042, and then a metal layer 2030 having a first electrode 2030a and a second electrode 2030b electrically separated from each other is formed on the insulating layer 2020.

The insulating layer 2020 may be formed on a partial inner surface or an entire inner surface of the upper cavity 2042. Further, the first electrode 2030a formed on the insulating layer 2020 may be formed to the inner surface of the upper cavity 2042 with being placed on a position adjacent to the first cavity 2040. That is, the first electrode 2030a may be formed on the insulation layer 2020 formed on the partial inner surface or the entire inner surface of the upper cavity 2042.

Meanwhile, in the present embodiment, as described above, the insulating layer 2020 and the metal layer 2030 are sequentially formed on the metal core 2010 on which the lower cavity 2041 and the upper cavity 2042 are formed, however, after forming the upper cavity 2042 on the metal core 2010, the insulating layer 2020 and the metal layer 2030 may be formed on the metal core 2010 on which the upper cavity 2042 is formed, and then the lower cavity 2041 may be formed by etching a part of the metal layer 2030, insulating layer 2020 and metal core 2010. The present invention is not limited to a formation order of the lower cavity 2041 and the upper cavity 2042 of the metal core 2010, the insulating layer 2020 and the metal layer 2030.

Then, a second cavity 2050 is formed by removing a part of the metal layer 2030 and the insulating layer 2020 formed on a position apart from the first cavity 2040 at a predetermined distance to expose the top surface of the metal core 2010. Then, a conductive layer 2080 is formed on the top surface of the metal core 2010 in the second cavity 2050.

Then, a light emitting device 2060 is directly mounted on the metal core 2010 in the lower cavity 2041, and then the light emitting device 2060 and the first electrode 2030a are electrically connected through a bonding wire 2070.

The bonding wire 2070 is preferably formed in a lower height than that of a top surface of the metal layer 2030 formed on the metal core where the first cavity 2040 is not formed.

Herein, before or after connecting the light emitting device 2060 and the first electrode 2030a through the bonding wire 2070, as shown in FIG. 92, the light emitting device 2060 and a portion of the metal core 2010 where the insulating layer 2020 is not formed may be electrically connected through a second bonding wire 2072.

Then, although not shown in the drawing, molding material (not shown) is filled in the first cavity 2040 to protect the light emitting device 2060 and the bonding wire 2070. At this time, in accordance with the ninth embodiment of the present invention, there is an advantage to prevent damage such as disconnection of the bonding wire 2070 in case of handling by preventing the bonding wire 2070 from being exposed to an upper part of the molding material through the molding material being filled to entirely cover the bonding wire 2070.

Referring to FIGS. 93 to 96, an LED package according to a tenth embodiment of the invention will be described.

Figure 93:
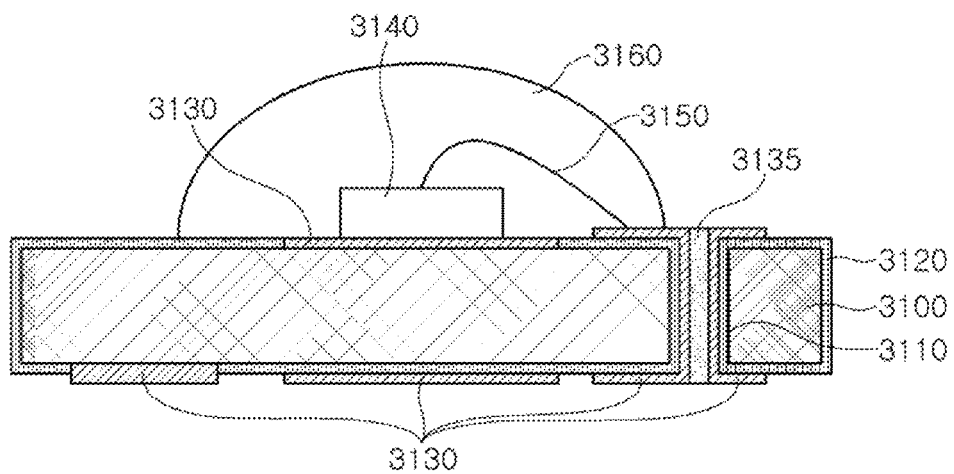
Figure 94:
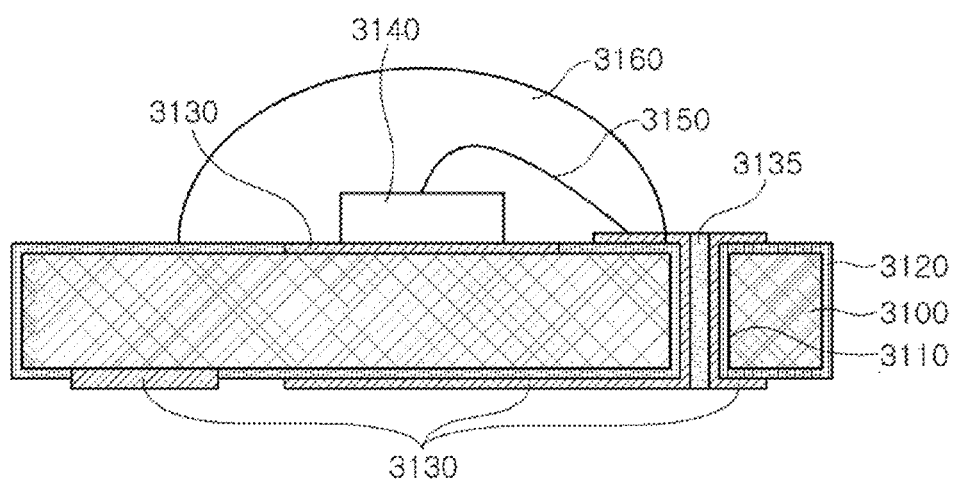

FIGS. 93 and 94 are cross-sectional views of an LED package according to a tenth embodiment of the invention.

As shown in FIG. 93, the LED package according to the tenth embodiment of the invention includes a metal substrate 3100 having one or more via holes 3110 formed therein, an insulating layer 3120 which is formed on the surface of the metal substrate 3100 including the inner surface of the via hole 3110, a plurality of metal patterns 3130 which are formed on the insulating layer 3120 and are electrically isolated from each other, and an LED chip 3140 mounted on a metal pattern 3130 among the plurality of metal patterns 3130.

The metal substrate 3100 may be formed of metal with excellent heat conductivity, such as aluminum (Al).

The insulating layer 3120, which is an oxide film layer ($Al_2O_3$), may be formed on the metal substrate 3100 composed of aluminum through an anodizing process. The anodizing process may be performed using organic acid, sulfuric acid, or mixed acid thereof.

Aluminum is a metallic material which can be obtained at a relatively low price, and has excellent heat conductivity. Further, the oxide film layer ($Al_2O_3$) obtained through the anodizing process also has relatively high heat conductivity of 10-30 W/mK, and can be formed with a small thickness, thereby implementing low thermal resistance.

Therefore, the metallic substrate 3100 exhibits more excellent heat dissipation performance than the conventional substrate formed of copper or ceramic. Further, the anodizing process for anodizing aluminum is a relatively simple process, and the process cost and time thereof are relatively low and short.

The via hole 3110 may be formed by a drilling, punching, or etching process, and may serve to electrically connect the metal patterns 3130 formed on the top and bottom surfaces of the metal substrate 3100.

The via hole 3110 may be completely filled up with the insulating layer 3120 and the metal patterns 3130 which are formed on the inner surface of the via hole 3110. As shown in FIG. 93, however, when the insulating layer 3120 and the metal patterns 3130 are sequentially formed with a small thickness along the inner surface of the via hole 3110, the inside of the via hole 3110 may not be filled up completely in this case, the internal space of the via hole 3110 may be filled up with a via-hole filler 3135. The via-hole filler 3135 may be composed of a conductive material such as metal or a non-conductive material such as epoxy.

Among the plurality of metal patterns 3130, the metal pattern 3130 having the LED chip 3140 mounted thereon may be formed on the top surface of the metal substrate 3100 which is exposed by partially removing the insulating layer 3120. In this case, the LED chip 3140 may be mounted on the metal pattern 3130 formed on the top surface of the metal substrate 3100, as described above, but may be mounted across the metal pattern 3130 formed on the top surface of the metal substrate 3100 and the insulating layer 3120 adjacent to the metal pattern 3130.

As the metal pattern 3130 having the LED chip 3140 mounted thereon is not formed on the insulating layer 3120 but is directly connected to the top surface of the metal substrate 3100, heat generated from the LED chip 3140 can be effectively dissipated to the outside.

On the bottom surface of the metal substrate 3100, another metal pattern 3130 may be formed at a position corresponding to the metal pattern 3130 having the LED chip 3140 mounted thereon, and serves to effectively dissipate heat generated from the LED chip 3140.

In this case, the metal pattern 3130, which is formed on the bottom surface of the metal substrate 3100 so as to correspond to the LED chip 3140, may be electrically isolated from the adjacent metal patterns 3130 so as to serve as only a heat dissipation layer, as shown in FIG. 93. However, as shown in FIG. 94, the metal pattern 3130 may extend so as to be electrically connected to an adjacent metal pattern 3130, thereby serving as both a heat dissipation layer and an electrode.

The LED chip 3140 may be a vertical LED chip. In this case, any one electrode (not shown) of the LED chip 3140 may be electrically connected to the metal pattern 3130 having the LED chip 3140 mounted thereon, and another electrode (not shown) of the LED chip 3140 may be electrically connected to a metal pattern 3130, where the LED chip is not mounted, through a wire 3150. At this time, the metal pattern 3130 connected to the LED chip 3140 through the wire 3150 is formed so as to extend to the bottom surface of the metal substrate 3100 through the via hole 3110.

The wire 3150 may be formed of gold, aluminum, or copper.

On the metal substrate 3100, a molding portion 3160 is formed so as to cover the LED chip 3140 and the wire 3150.

The molding portion 3160 may be formed in a desired shape through an injection molding, transfer molding, or pin-gate molding method using silicon resin, epoxy resin, or epoxy molding compound (EMC).

The molding portion 3160 is formed in a hemispherical shape, as shown in FIGS. 93 and 94. Without being limited thereto, however, the molding portion 3160 may be formed in various shapes such as a trapezoid, a rectangle, and so on.

Figure 95:
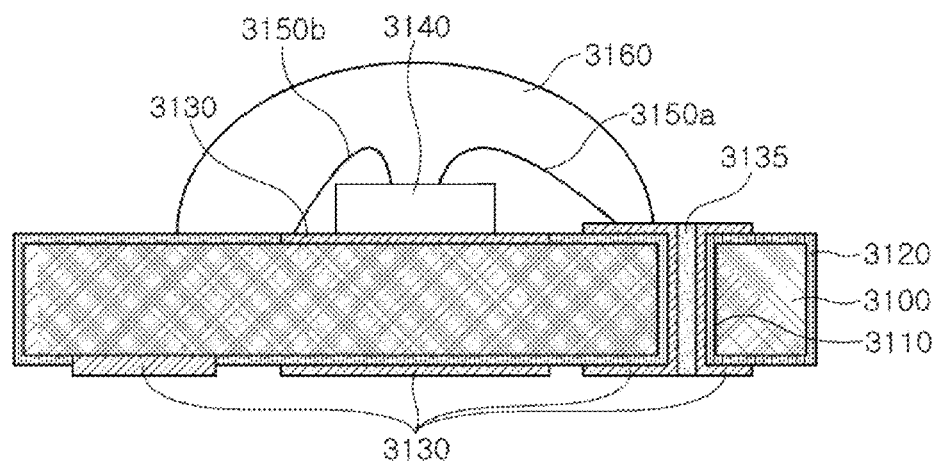
Figure 96:
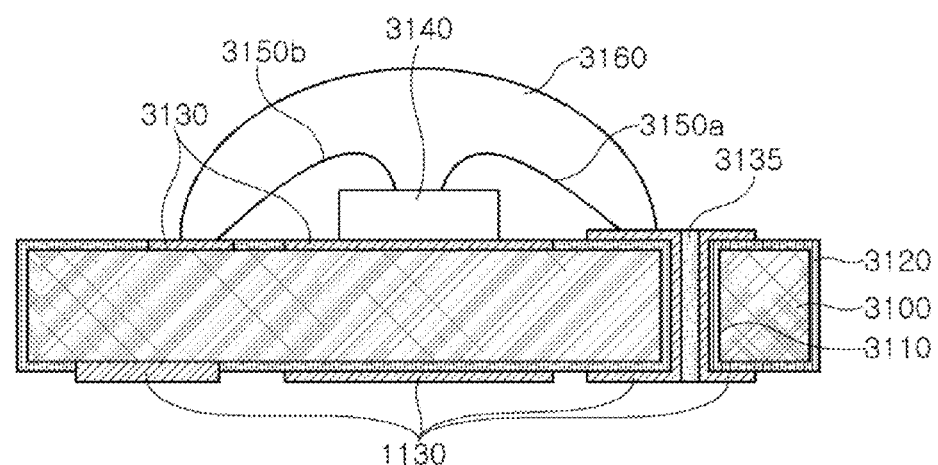

FIGS. 95 and 96 are cross-sectional views showing an example where a horizontal LED chip is mounted on the LED package according to the tenth embodiment of the invention.

In the tenth embodiment of the invention, a horizontal LED chip may be used as the LED chip 3140, instead of the vertical LED chip. In this case, as shown in FIG. 95, any one electrode (not shown) of the horizontal LED chip 3140 may be electrically connected to the metal pattern 3130, where the LED chip 3140 is not mounted, through a first wire 3150$a$, and another electrode (not shown) thereof may be electrically connected to the metal pattern 3130 having the LED chip 3140 mounted thereon through a second wire 3150$b$.

At this time, the second wire 3150$b$ may not be electrically connected to the metal pattern 3130 having the LED chip 3140 mounted thereon, as described above, but may be electrically connected to a separate metal pattern 3130 where the LED chip 3140 is not mounted, as shown in FIG. 96. The separate metal pattern 3130 connected to the second wire 3150$b$ may be formed on the top surface of the metal substrate 3100 which is exposed by partially removing the insulating layer 3120.

In the LED package according to the tenth embodiment of the invention, the metal pattern 3130 connected to the via hole 3110 and the metal substrate 3100 are used as electrodes which are electrically connected to the LED chip 3140. Any one metal pattern 3130 among the metal patterns 3130 formed on the bottom surface of the metal substrate 3100 may be formed on the bottom surface of the metal substrate 3100, which is exposed by partially removing the insulating layer 3120, so as to be directly connected to the metal substrate 3100.

Further, by using the metal substrate 3100 formed of aluminum where the via hole 3110 is formed, it is possible to obtain an excellent heat dissipation effect. Therefore, a high-power LED chip with a relatively large calorific value as well as a low-power LED chip with a relatively low calorific value may be used, which makes it possible to enhance an optical characteristic of the LED package.

Further, as the insulating layer 3120 is formed on the metal substrate 3100 through the anodizing process, the insulating layer 3120 is integrally formed with the metal substrate 3100, which makes it possible to enhance the durability of the package.

Figure 97:
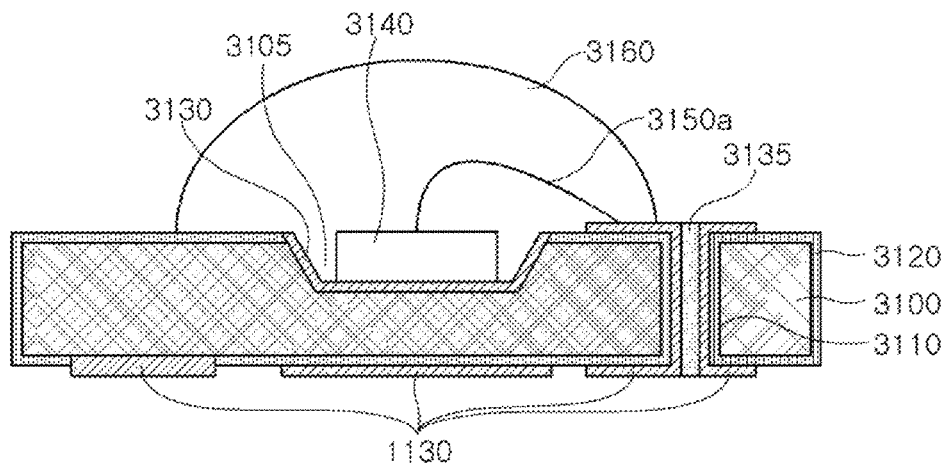

FIG. 97 is a cross-sectional view of an LED package according to a modification of the tenth embodiment of the invention. As shown in FIG. 97, the metal pattern 3130 having the LED chip 3140 mounted thereon, among the plurality of metal patterns 3130, may be formed on the top surface of a cavity 3105 which is formed by partially removing the insulating layer 3120 and the metal substrate 3100.

When the LED chip 3140 is mounted within the cavity 3105, the thickness of the metal substrate 3100 under the LED chip 3140 can be reduced. Therefore, since the heat dissipation path of the LED chip 3140 is reduced, it is possible to further enhance the heat dissipation performance of the LED package.

Referring to FIGS. 98 to 105, a method of manufacturing an LED package according to the tenth embodiment of the invention will be described.

FIGS. 98 to 105 are process diagrams sequentially showing a method of manufacturing an LED package according to the tenth embodiment of the invention.

Figure 98:
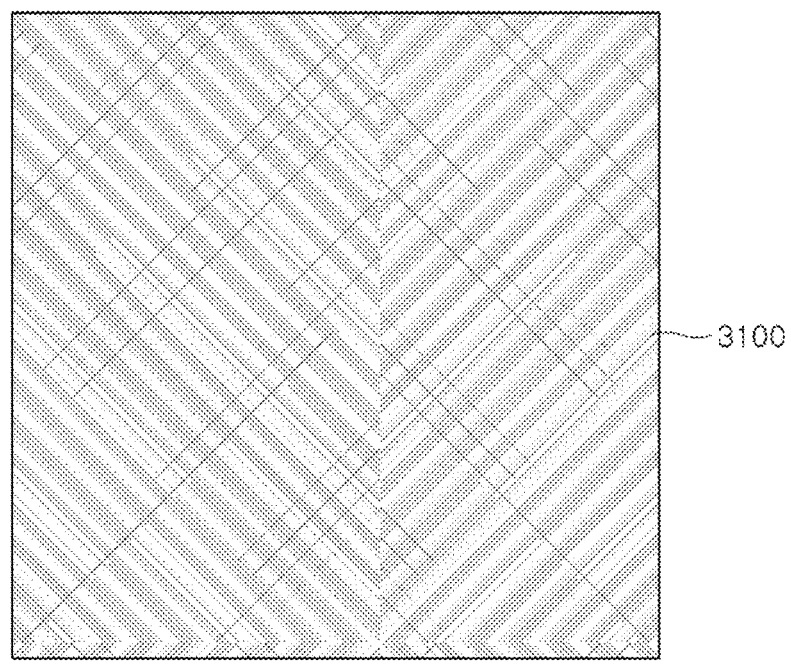

As shown in FIG. 98, a metal substrate 3100 is prepared.

The metal substrate 3100 may be an aluminum plate which has been subjected to a process for cleaning contaminants such as organic matters existing on the surface of the aluminum plate.

As shown in FIG. 98, the metal substrate 3100 may be formed in a square shape. Depending on the processed aluminum plate, the metal substrate 3100 may be formed in various shapes such as a rectangle, a circle and so on. The thickness of the metal substrate 3100 may be set to more than about 0.1 mm, in consideration of the process and the reliability of products after the process.

Figure 99:
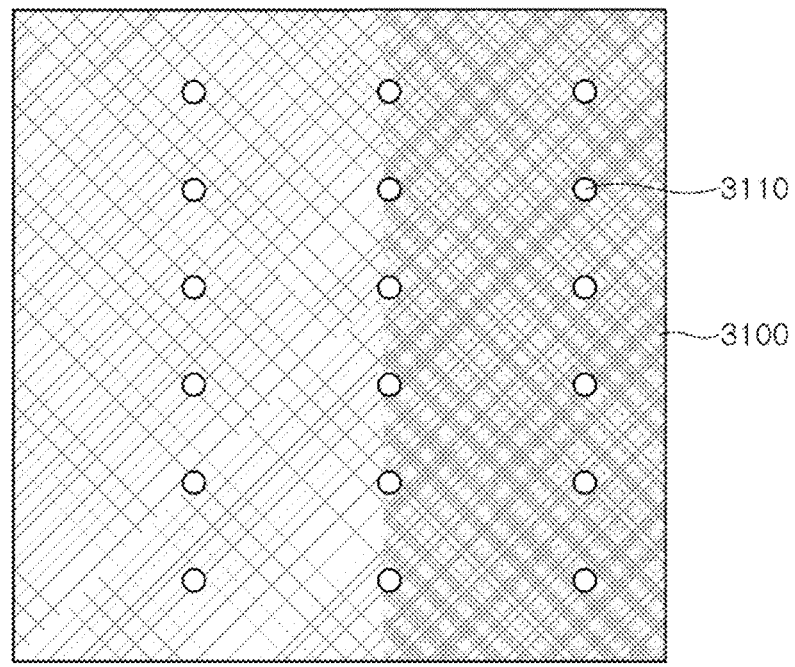

Next, as shown in FIG. 99, a plurality of via holes 3110 passing through the metal substrate 3100 are formed. As described above, the via holes 3110 may be formed by a drilling, punching, or etching process.

Figure 100:
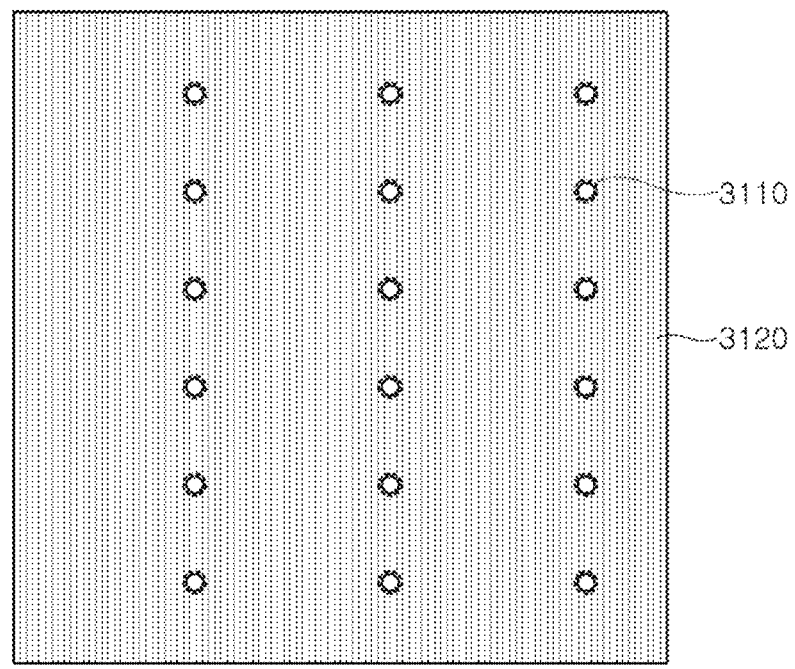

Then, as shown in FIG. 100, an insulating layer 3120 is formed on the surface of the metal substrate 3100 including the inner surfaces of the via holes 3110, through an anodizing process.

Figure 101:
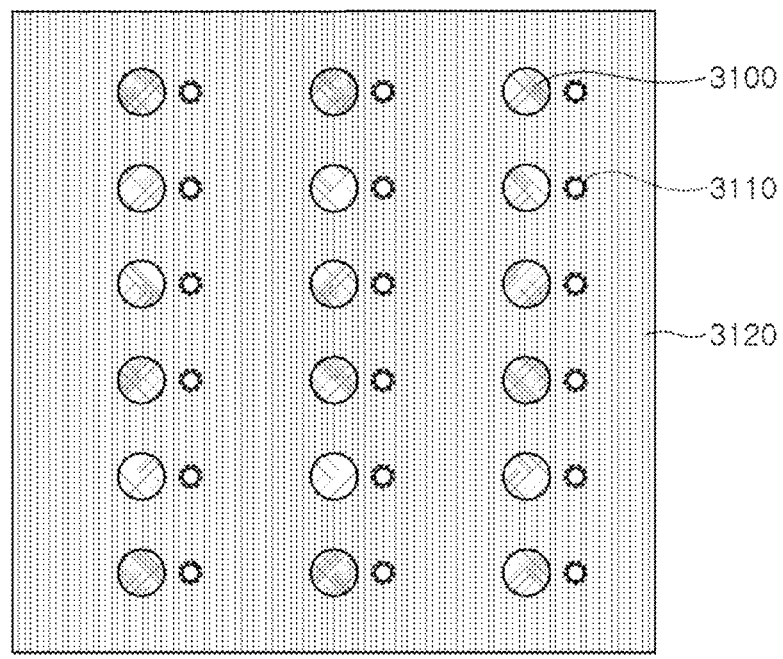
Figure 102:
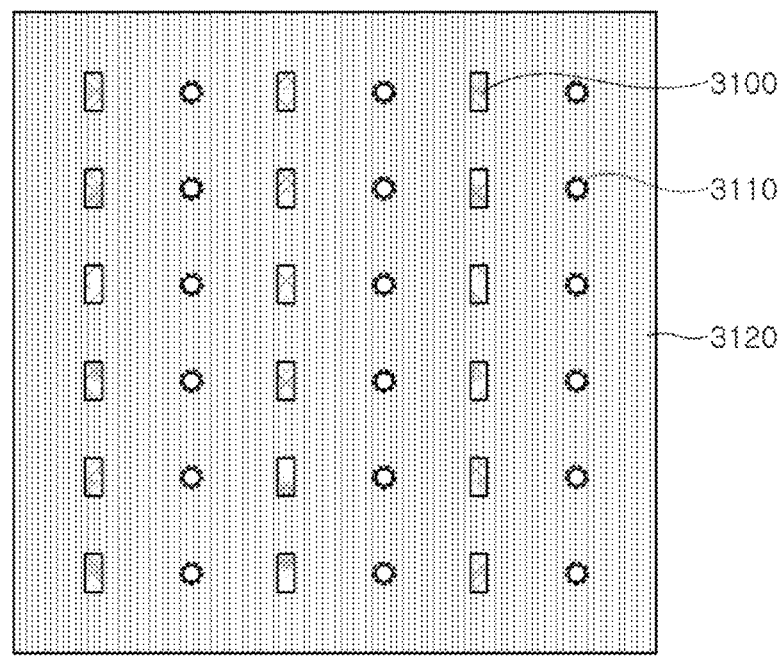

Next, as shown in FIGS. 101 and 102, the insulating layer 3120 is partially removed in such a manner that the top and bottom surfaces of the metal substrate 3100 are partially exposed. The removing of the insulating layer 3120 may be performed by an etching process.

After the top and bottom surfaces of the metal substrate 3100 are partially exposed, the exposed top surface of the metal substrate 3100 may be additionally etched so as to form a cavity 3105 with a predetermined depth, as shown in FIG. 97.

FIG. 101 shows a state where the top surface of the metal substrate 3100 is partially exposed, and FIG. 102 shows a state where the bottom surface of the metal substrate 3100 is partially exposed.

Figure 103:
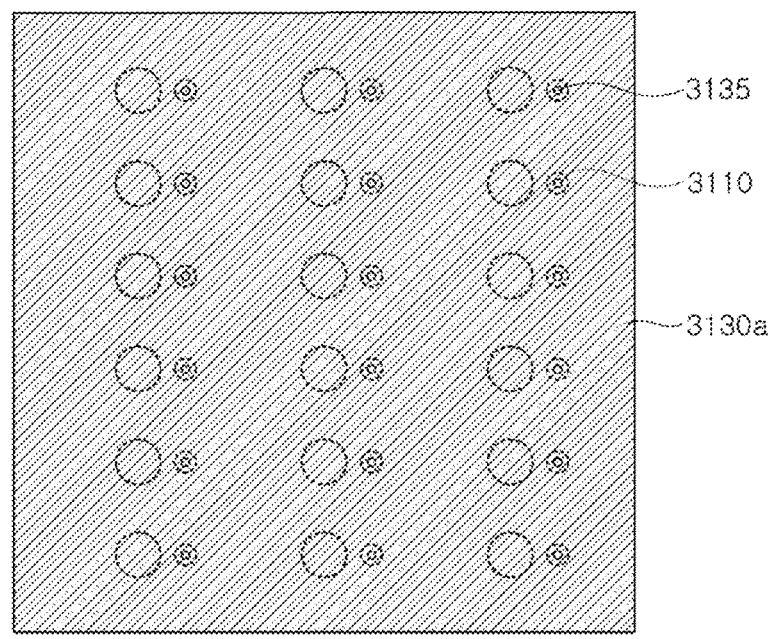

Next, as shown in FIG. 103, a metal layer 3130$a$ is formed on the insulating layer 3120 including the exposed portions of the metal substrate 3100. The metal layer 3130$a$ may be formed through an electroplating method, an electroless plating method, or a metal deposition method.

While the metal layer 3130$a$ is formed, the via holes 3110 may be completely filled up with the metal layer 3130$a$. When the metal layer 3130$a$ is thinly formed along the inner surfaces of the via holes 3110, the via holes 3110 may be not be filled up completely. When the via holes 3110 are not filled up completely, a process for filling up the via holes 3110 with a via-hole filler 3135 may be additionally performed, or may be not performed. The via-hole filler 3135 may be composed of a conductive or non-conductive material.

Figure 104:
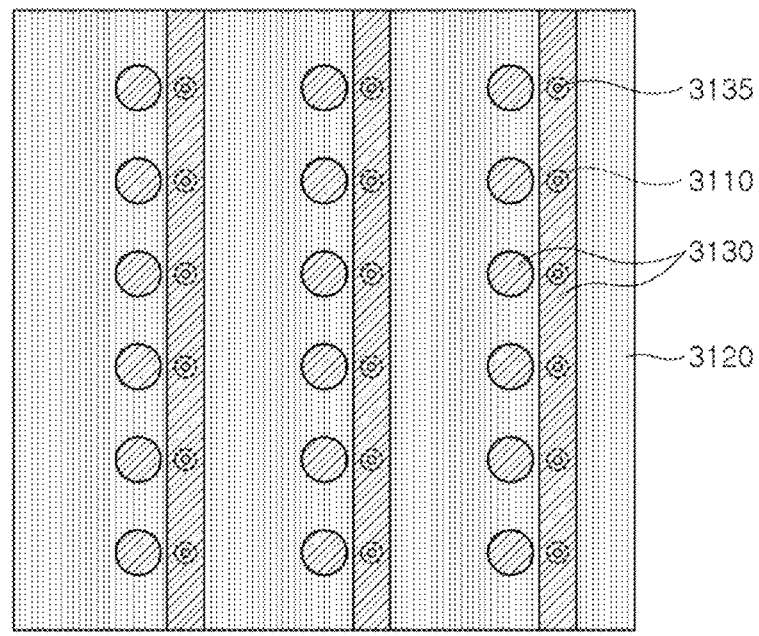

Next, as shown in FIG. 104, the metal layer 3130$a$ is patterned so as to form a plurality of metal patterns 3130 on the exposed portions of the top and bottom surfaces of the metal substrate 3100 and the insulating layer 3120, the metal patterns 3130 being electrically isolated from one another.

Figure 105:
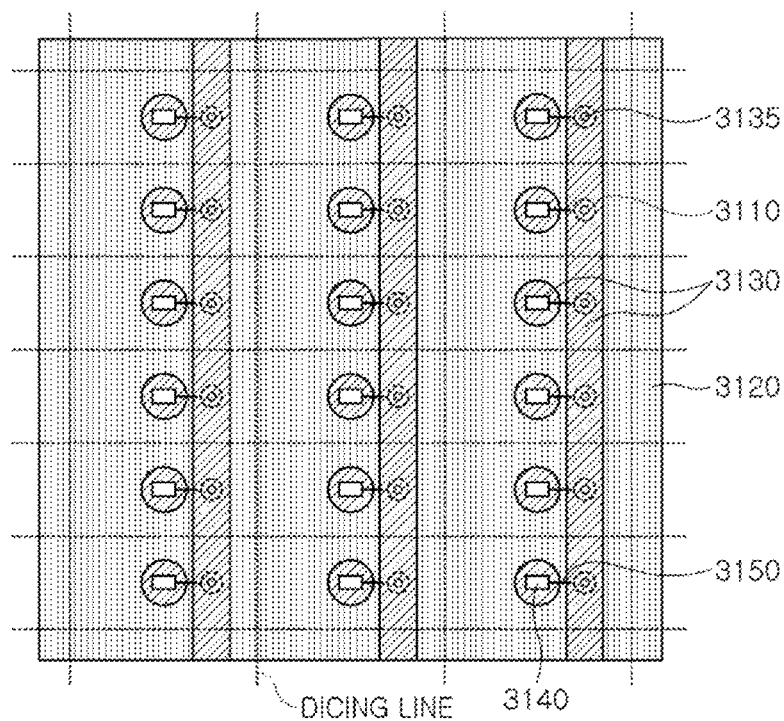

Then, as shown in FIG. 105, LED chips 3140 are mounted on the metal patterns 3130. In this case, the LED chips 3140 may be mounted on the metal patterns 3130 formed on the exposed top surface of the metal substrate 3100.

When the LED chips 3140 are mounted, a die bonding method may be used, in which silver paste, transparent epoxy, or solder is applied on the metal patterns 3130 on which the LED chips 3140 are to be mounted, and the LED chips 3140 mounted on the metal patterns 3130 are heat-treated at a predetermined temperature. Alternatively, a fluxless or flux eutectic bonding method may be used.

As the LED chips 3140 are mounted on the metal patterns 3130 which are directly connected to the top surface of the metal substrate 3100, heat generated from the LED chips 3140 can be effectively dissipated to the outside through the metal substrate 3100.

Next, wires 3150 for electrically connecting the LED chips 3140 to the metal patterns 3130 on which the LED chips 3140 are not mounted are formed. Although not shown, molding portions 3160 (refer to FIG. 93) are formed on the metal substrate 3100 so as to cover the LED chips 3140 and the wires 3150.

Then, the metal substrate 3100 is diced along a dicing line so as to manufacture a plurality of unit LED packages. The unit LED package includes one LED chip 3140 and one or more via holes 3110. When the metal substrate 3100 is diced, a dicing blade or a cutting mold may be used.

Referring to FIGS. 106 to 113, an LED package according to an eleventh embodiment of the invention will be described. In the construction of the eleventh embodiment, the duplicated descriptions of the same components as those of the tenth embodiment will be omitted.

Figure 106:
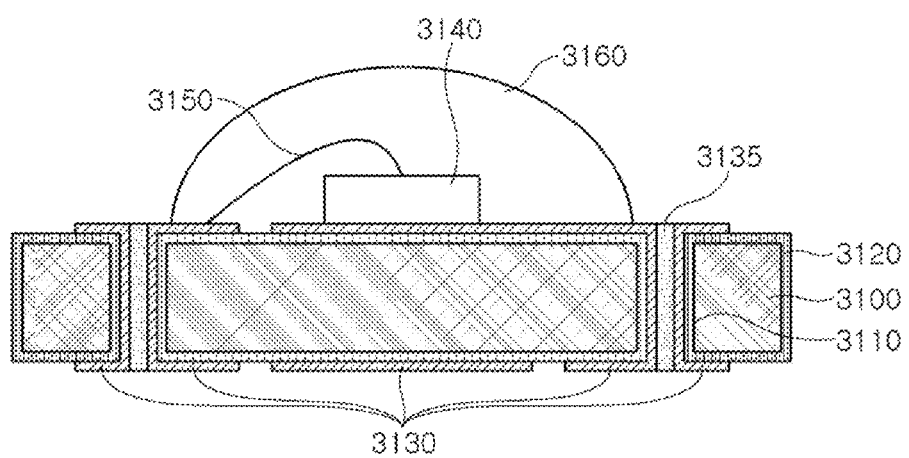

FIG. 106 is a cross-sectional view of an LED package according to an eleventh embodiment of the invention. FIGS. 107 to 111 are cross-sectional views of LED packages according to modifications of the eleventh embodiment of the invention.

As shown in FIG. 106, the LED package according to the eleventh embodiment of the invention has almost the same construction as that of the LED package according to the tenth embodiment, but is different from the tenth embodiment only in that two or more via holes 3110 are formed.

That is, the LED package according to the eleventh embodiment of the invention includes a metal substrate 3100 having two or more via holes 3110 formed therein, an insulating layer 3120 which is formed on the surface of the metal substrate including the inner surfaces of the via holes 3110, a plurality of metal patterns 3130 which are formed on the insulating layer 3120 and are electrically isolated from each other, and an LED chip 3140 which is mounted on a metal pattern 3130 among the plurality of metal patterns 3130.

The metal substrate 3100 may be formed of aluminum, and the insulating layer 3120 may be composed of an oxide film layer ($Al_2O_3$) which is formed through an anodizing process.

Figure 107:
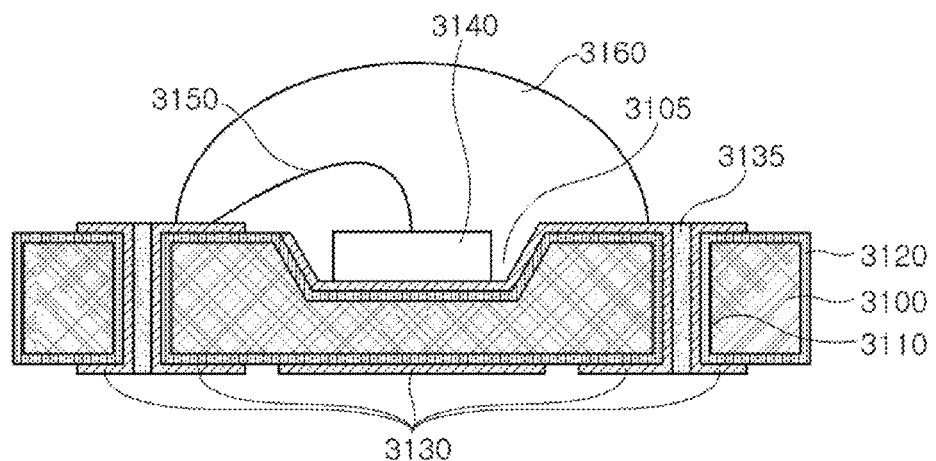

As shown in FIG. 107, the metal substrate 3100 may have a cavity 3105 provided in a position where the LED chip 3140 is mounted, the cavity 3105 having a predetermined depth. When the cavity 3105 is provided in the metal substrate 3100, the thickness of the metal substrate 3100 under the LED chip 3140 can be reduced, which makes it possible to increase a heat dissipation effect where heat generated from the LED chip 3140 is dissipated to the outside through the metal substrate 3100.

On the bottom surface of the metal substrate 3100, a metal pattern 3130 may be formed in a position corresponding to the portion where the LED chip 3140 is mounted, and serves to effectively dissipate heat generated from the LED chip 3140.

Figure 108:
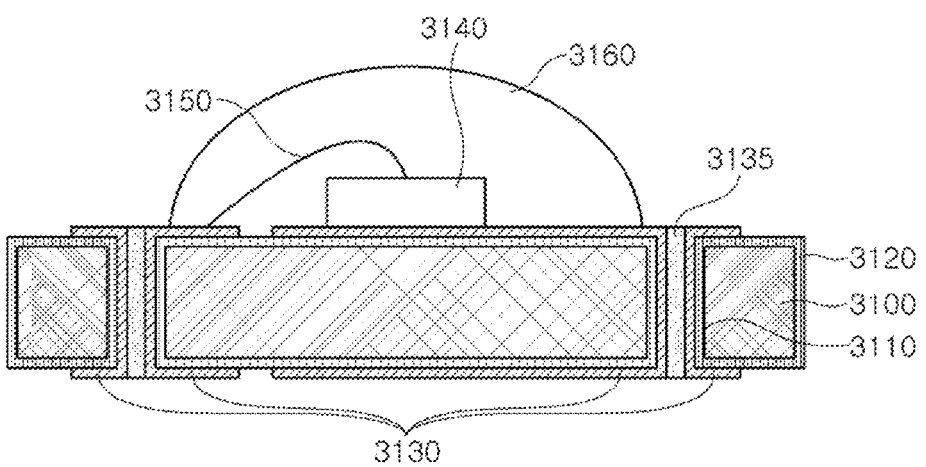

The metal pattern 3130, which is formed on the bottom surface of the metal substrate 3100 so as to correspond to the LED chip 3140, may be electrically isolated from the adjacent metal patterns 3130 so as to serve as only a heat dissipation layer, as shown in FIG. 106. However, as shown in FIG. 108, the metal pattern 3130 may extend so as to be electrically connected to an adjacent metal pattern 3130, thereby serving as both a heat dissipation layer and an electrode.

Figure 109:
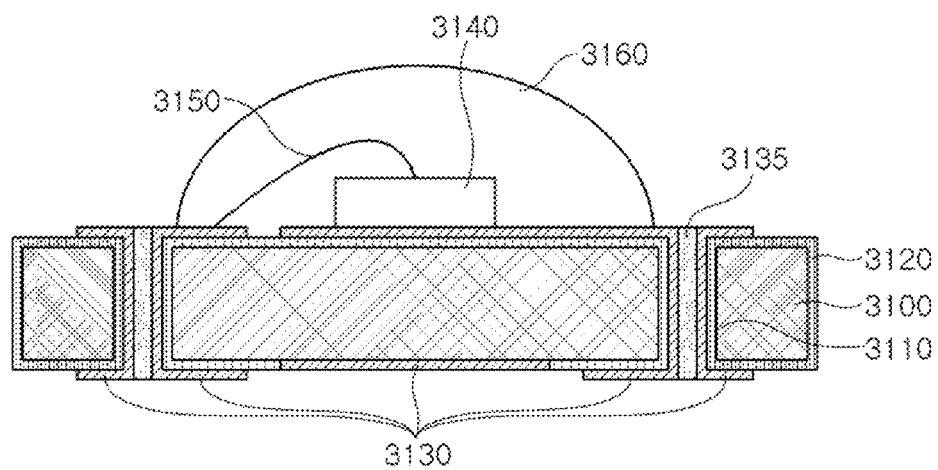

The metal pattern 3130, which is formed on the bottom surface of the metal substrate 3100 so as to correspond to the LED chip 3140, may be formed on the insulating layer 3120 formed on the bottom surface of the metal substrate 3100, as shown in FIG. 106. However, as shown in FIG. 109, the metal pattern 3130 may be formed so as to be directly connected to the bottom surface of the metal substrate 3100 which is exposed by partially removing the insulating layer 3120. In this case, it is possible to further increase a heat dissipation effect.

Figure 110:
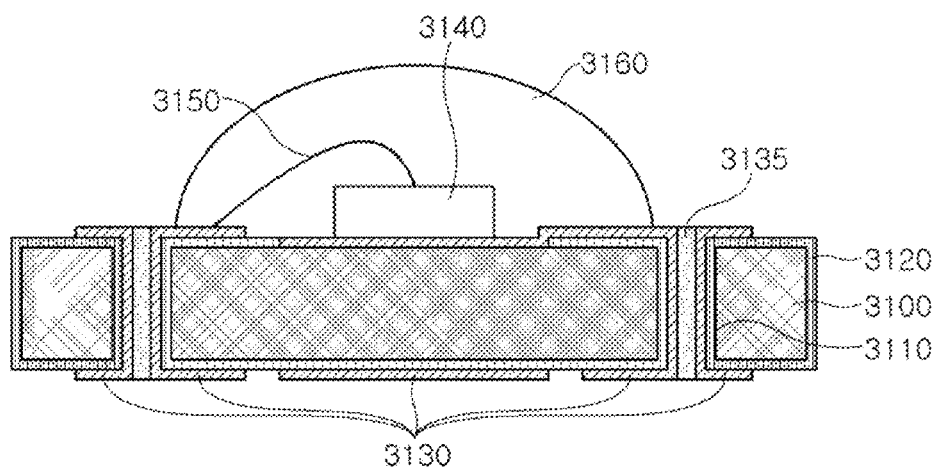

Among the plurality of metal patterns 3130, the metal pattern 3130 having the LED chip 3140 mounted thereon may be formed on the top surface of the insulating layer 3120, as shown in FIG. 106. However, as shown in FIG. 110, the metal pattern 3130 may be formed on the top surface of the metal substrate 3100 which is exposed by partially removing the insulating layer 3120. In this case, as the metal pattern 3130 having the LED chip 3140 mounted thereon is electrically connected to the top surface of the metal substrate 3100, the heat generated from the LED chip 3140 can be effectively dissipated to the outside through the metal substrate 3100.

Figure 111:
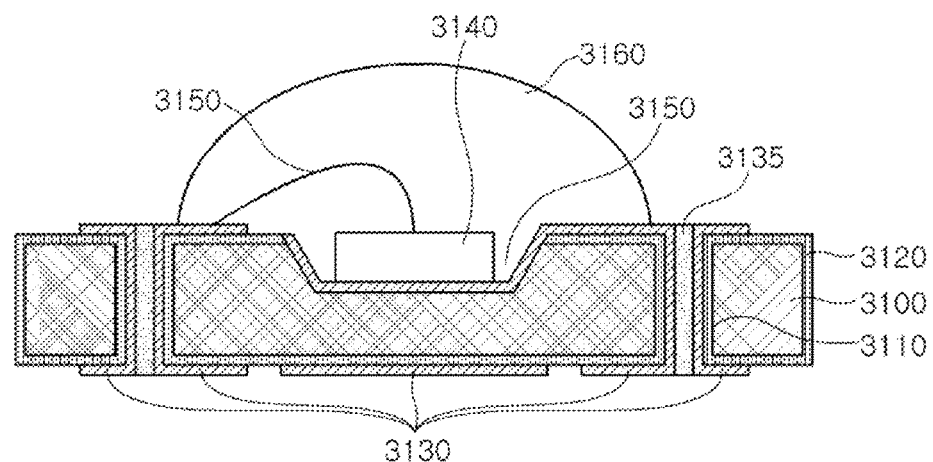

As shown in FIG. 111, the metal pattern 3130 having the LED chip 3140 mounted thereon may be formed on the top surface of a cavity 3105 which is formed by partially removing the insulating layer 3120 and the metal substrate 3100.

When the LED chip 3140 is mounted in the cavity 3105, the thickness of the metal substrate 3100 under the LED chip 3140 can be reduced. Therefore, it is possible to maximize the heat dissipation effect where the heat generated from the LED chip 3140 is dissipated to the outside through the metal substrate 3100.

The LED chip 3140 may be a vertical, horizontal, or flip-chip LED chip.

When the LED chip 3140 is a vertical LED chip, any one electrode (not shown) of the LED chip 3140 may be electrically connected to the metal pattern 3130 having the LED chip 3140 mounted thereon, and another electrode (not shown) thereof may be electrically connected to the metal pattern 3130, where the LED chip 3140 is not mounted, through a wire 3150, as shown in FIGS. 106 to 111.

On the metal substrate 3100, a molding portion 3160 is formed so as to cover the LED chip 3140 and the wire 3150.

Figure 112:
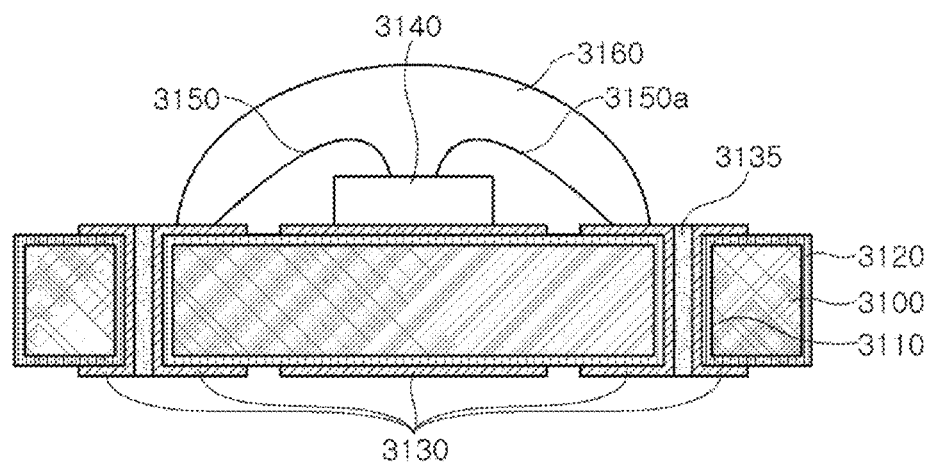
Figure 113:
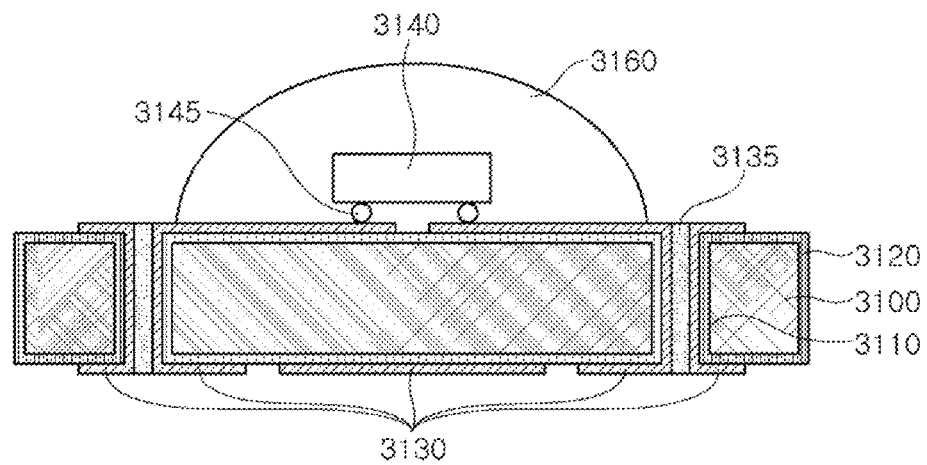

FIG. 112 is a cross-sectional view showing an example where a horizontal LED chip is mounted on the LED package according to the eleventh embodiment of the invention. FIG. 113 is a cross-sectional view showing an example where a flip-chip LED chip is mounted on the LED package according to the eleventh embodiment of the invention.

When the LED chip 3140 is a horizontal LED chip, any one electrode (not shown) of the horizontal LED chip 3140 may be electrically connected to a metal pattern 3130, where the LED chip 3140 is not mounted, through a first wire 3150a, and another electrode (not shown) thereof may be electrically connected to another metal pattern 3130, where the LED chip 3140 is not mounted, through a second wire 3150b, as shown in FIG. 112.

When the LED chip 3140 is a flip-chip LED chip, a pair of connection elements 3145 are formed on the bottom surface of the LED chip 3140 so as to be electrically connected to the electrodes of the LED chip 3140, as shown in FIG. 113. The respective connection elements 3145 may be electrically connected to the metal patterns 3130 which are electrically isolated from each other.

The connection elements 3145 may be composed of solder balls, bumps, or pads.

In the LED package according to the eleventh embodiment of the invention, as the LED chip is mounted on the metal substrate which is formed of aluminum and has been subjected to the anodizing process, it is possible to obtain the same operation and effect as that of the tenth embodiment.

Referring to FIGS. 114 to 119, a method of manufacturing an LED package according to the eleventh embodiment of the invention will be described. In the construction of the eleventh embodiment, the duplicated descriptions of the same components as those of the tenth embodiment will be omitted.

FIGS. 114 to 119 are process diagrams sequentially showing a method of manufacturing an LED package according to the eleventh embodiment of the invention.

Figure 114:
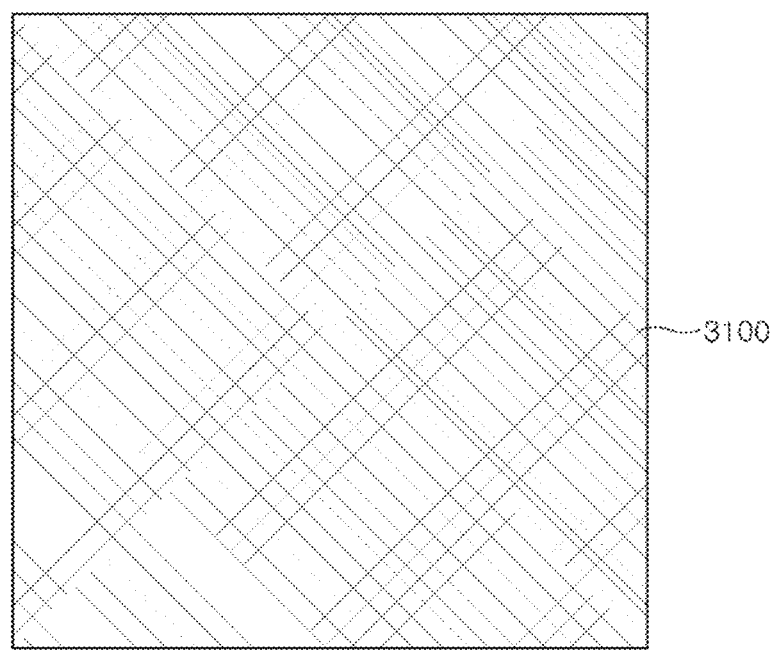

First, as shown in FIG. 114, a metal substrate 3100 is prepared.

Figure 115:
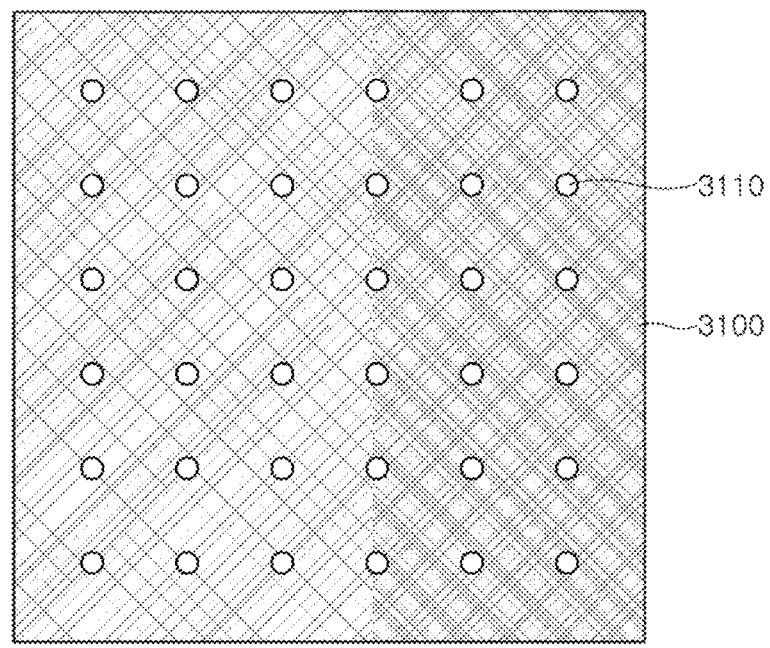

Next, as shown in FIG. 115, a plurality of via holes 3110 are formed so as to pass through the metal substrate 3100.

Figure 116:
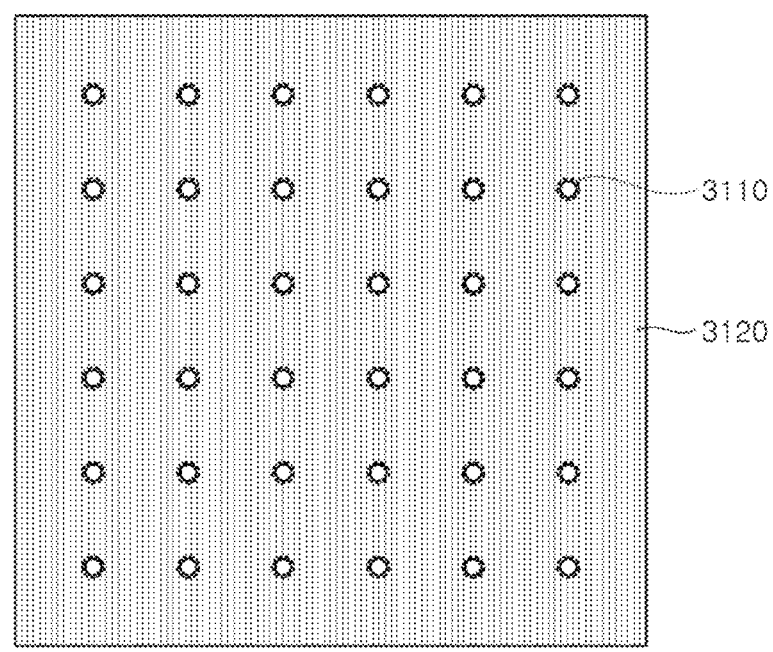

Then, as shown in FIG. 116, an insulating layer 3120 is formed on the surface of the metal substrate including the inner surfaces of the via holes 3110, through an anodizing process.

Figure 117:
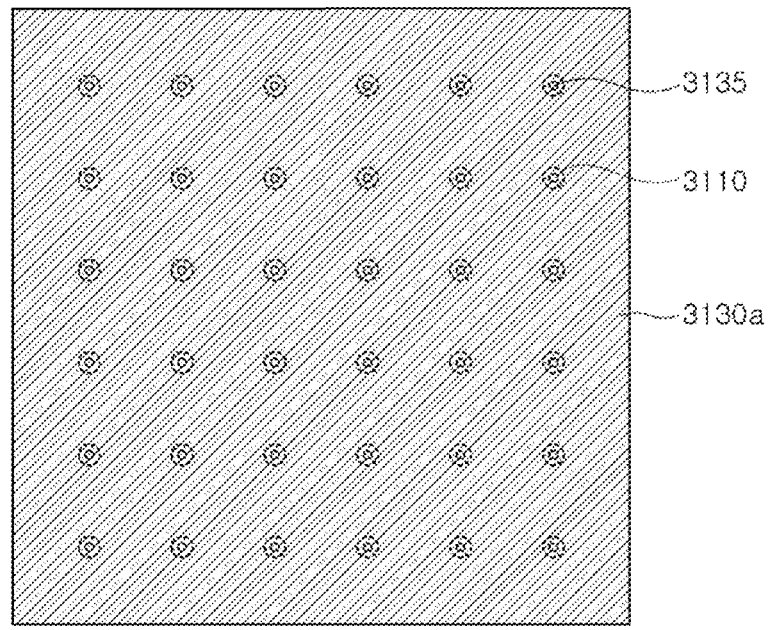

Next, as shown in FIG. 117, a metal layer 3130a is formed on the insulating layer 3120.

When the via holes 3110 are not filled up completely with the metal layer 3130a during the forming of the metal layer 3130a, a process for filling up the via holes 3110 with a via-hole filler 3135 may be additionally performed.

Figure 118:
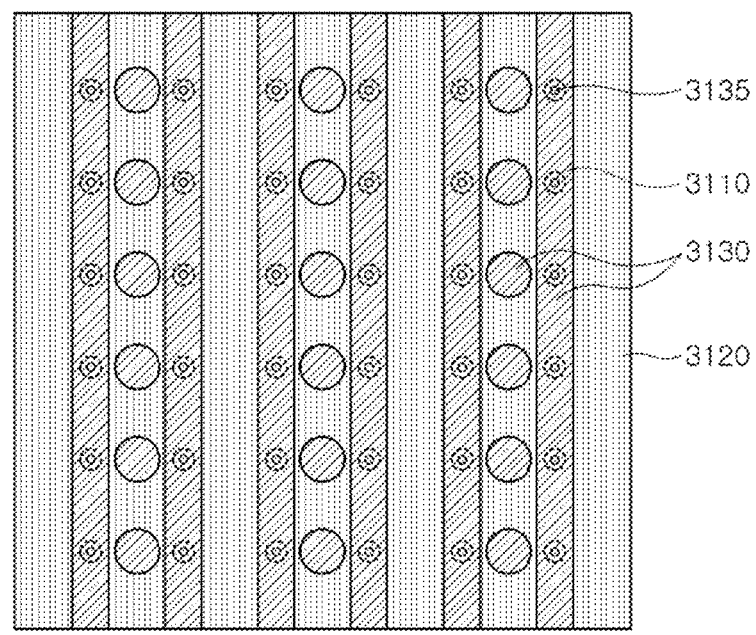

Then, as shown in FIG. 118, the metal layer 3130a is patterned so as to form a plurality of metal patterns 3130 on the insulating layer 3120, the metal patterns 3130 being electrically isolated from one another.

Figure 119:
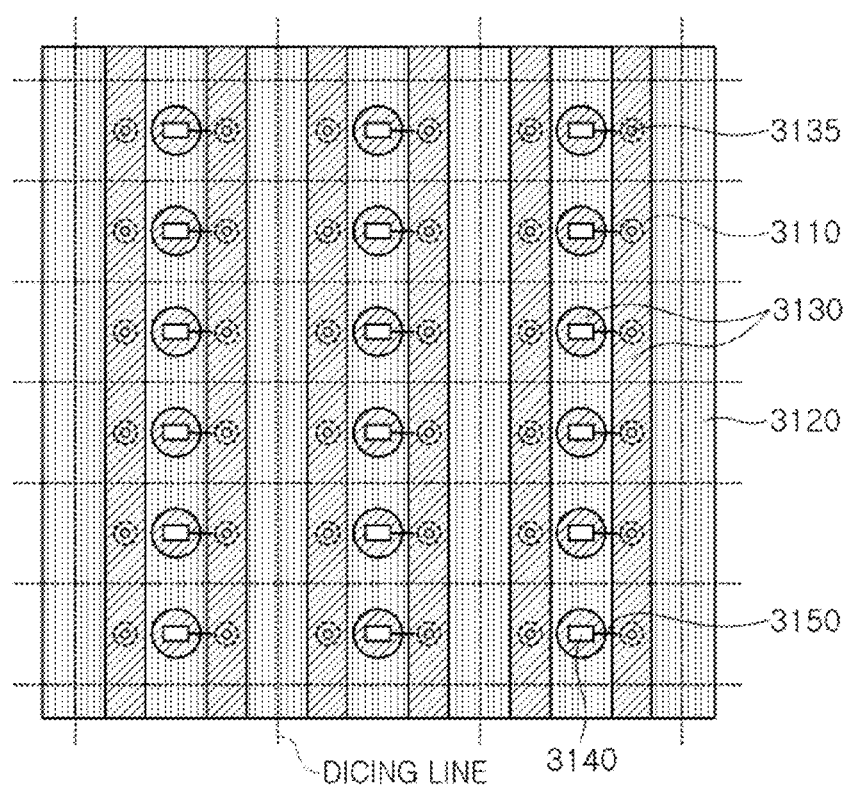

Next, as shown in FIG. 119, LED chips 3140 are mounted on some metal patterns 3130, and wires 3150 for electrically connecting the LED chips 3140 to other metal patterns 3130, where the LED chips 3140 are not mounted, are formed.

Although not shown, molding portions 3160 (refer to FIG. 106) are formed on the metal substrate 3100 so as to cover the LED chips 3140 and the wires 3150.

Next, the metal substrate 3100 is diced along a dicing line so as to manufacture a plurality of unit LED packages. The unit LED package includes one LED chip 3140 and two or more via holes 3110.

In this manner, the LED package according to the exemplary embodiments of the present invention can be applied for the separation type backlight units configured in various forms without departing from the technical idea of the present invention.

<Backlight Unit>

A backlight unit employing the LED packages according to the exemplary embodiments of the present invention as described above will now be explained.

Figure 31:
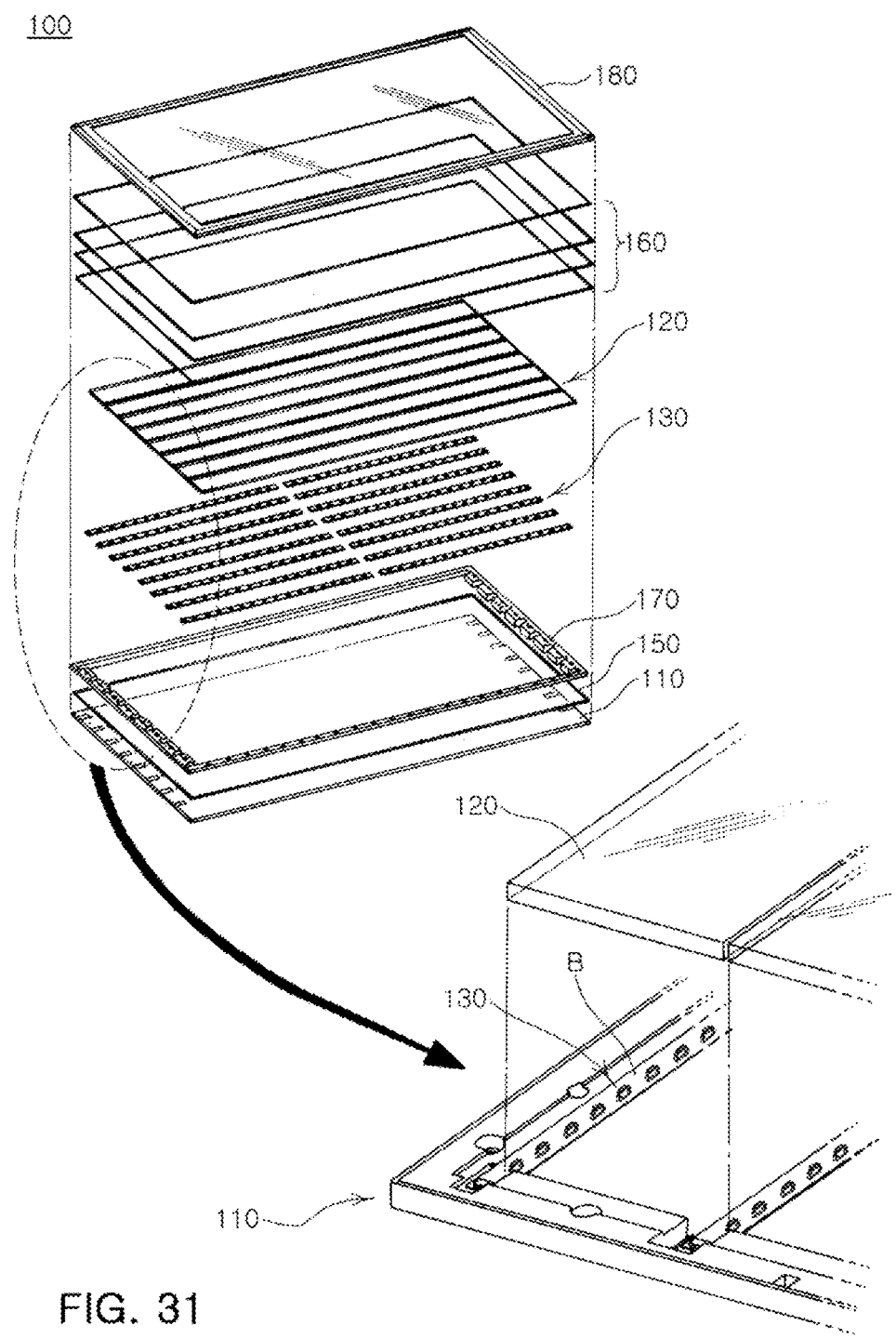
FIG. 31 is a perspective view for explaining a backlight unit according to a first exemplary embodiment of the present invention.
Figure 32:
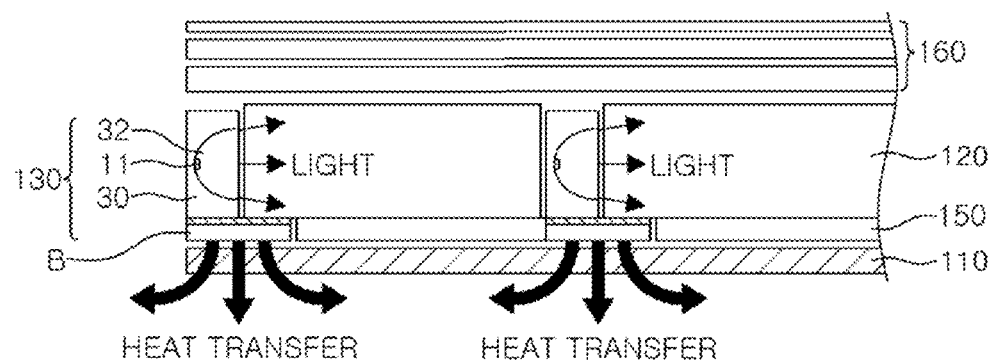
FIG. 32 is an enlarged sectional view schematically demonstrating a mounted state of the LED package.

FIG. 31 is a perspective view for explaining a backlight unit according to a first exemplary embodiment of the present invention, and FIG. 32 is an enlarged sectional view schematically demonstrating a mounted state of the LED package.

With reference to FIGS. 31 and 32, a backlight unit 100 includes a lower cover 110 having a bottom surface, a plurality of light guide plates 120 disposed on the lower cover 110, a board (B) provided to be horizontal with the bottom surface of the lower cover 110 at one side of each light guide plate 120 and including a wiring to which voltage is applied from an external source, and a plurality of LED packages 130 and optical members 160 mounted on the board (B) disposed at one side of the light guide plates 120 and providing light.

The backlight unit 100 may further include a liquid crystal panel 180 for displaying an image by adjusting a light transmittance so as to be used for a liquid crystal display (LCD).

In the present exemplary embodiment, the backlight unit has a tandem type structure. The tandem type structure refers to placing the light guide plates on a tile plate and making a uniform light emitting surface. The tandem type structure, allowing brightness to be partially changed, is effective for improving the contrast of a screen image of reducing power consumption.

The light guide plates 120 are divided into a plurality of sections and the plurality of light guide plates 120 are disposed in parallel in a receiving space of the lower cover 110. In this respect, in a case of 46 inches, eight light plates 120 are disposed, and sixteen LED packages 130 are mounted in a single module, and each module may be disposed at the side of the light guide plate 120. However, the number of light guide plates 120 and the LED packages 130 may be set to be different depending on the size of the liquid crystal panel.

The plurality of light guide plates may be separately disposed, or may be integrally connected to solve a problem whereby a boundary is generated between the light guide plates 120 in the backlight unit.

The lower cover 110 may form a lower frame having a bottom surface with a material such as iron (Fe), electrolytic galvanized iron (EGI), or the like, or may have a side frame formed to extend from an edge of the bottom surface so as to be perpendicular to an upward direction. In this case, the bottom surface of the lower frame may be divided into a plurality of regions formed in a row to configure a separation type backlight unit. In this case, the plurality of regions may be bordered by concave recesses formed, for example, at each region.

Reflection members 150 may be attached to the entire bottom surface of the lower cover 110 or to the plurality of the bottom surfaces excluding the concave recesses in the case where the concave recesses are formed. A white polyester film or a film coated with metal (Ag or Al) is generally used to form the reflection member 150. A light reflexibility level of visible light at the reflection members 150 is about 90% to 97%, and it increases as the coated film becomes thicker.

The plurality of reflection members 150 provided on the bottom surface of the lower cover 110 may be formed to extend so as to be disposed between the LED package 130 providing light and the light guide plate 120 positioned to be adjacent to the rear surface of the LED package 130. In this case, light guided after being provided from one side of the light guide plates 120 can be reflected without being interfered with by the LED packages 130 disposed at the other side of the light guide plate 120 so as to be provided toward the optical members 160, thus increasing the light reflection efficiency.

The LED packages 130 are provided in the concave recesses. In this case, the LED packages 130, provided in the concave recesses, are horizontal to the bottom surface of the lower cover 110, and are mounted on the board (B), i.e., a printed circuit board (PCB), with wiring to which a voltage can be applied from an external source.

Here, the LED packages 130 may vary according to diverse exemplary embodiments of the present invention, and the LED packages 130 may be mounted to be perpendicular to the board (B) through side mounting as shown in FIG. 19, but the present invention is not limited thereto.

The board (B) on which the plurality of LED packages 130 are mounted may include a circuit wiring for providing a driving voltage received from an LED driving unit to the LED packages 130, and the circuit wiring may be designed to drive the plurality of LED packages 130 separately or collectively (i.e., by groups).

The light guide plates 120 are provided on the bottom surface of the lower cover 110 divided into a plurality of regions in which the reflection members 150 are provided respectively. Preferably, the side of the light guide plates 120 is tightly attached to the main body 30 to allow light provided from the LED chip 11 mounted on the main body 30 to be introduced into light guide plates 120 without loss.

The light guide plates 120 are made of a polymethacrylate and have a high transparency and are very glossy because polymethymethacrylates light absorption levels in a visible ray region is the smallest among polymer materials. The light guide plates 120 have a high mechanical strength, and thus, they are not easily broken or deformed. The light guide plates 120 are light and have good chemical resistance. In addition, the light guide plates 120 having a transmittance level of visible rays as high as 90% to 91%, have very low internal loss levels, and have strong mechanical properties such as tensile strength, bending strength, and expansion strength, and the like, and strong chemical properties and resistance.

The optical members 160 are provided to implement the optical characteristics of light provided through the light guide plates 120. In this case, the optical members 160 may include, for example, a diffusion plate including diffusion patterns to reduce the non-uniformity of light which has passed through the light guide plates 120, a prism sheet with light condensing patterns to enhance front luminance of light, a protection sheet, and the like.

A guide unit 170 may be provided to be formed along four corners of the lower cover 110, to which the LED package 130 is electrically connected, and guides a mounting position. Accordingly, the mounting of the LED package 130 at the designed position can be facilitated.

Because the backlight unit according to the present exemplary embodiment uses the tandem type structure, a local dimming driving method can be used to partially change the brightness, and thus, the contrast of a screen can be improved and power consumption can be reduced.

In addition, because the LED package can be used as both the edge type LED package and the direct type LED package, the design freedom of the backlight unit can be increased.

An LED backlight unit including the LED package according to a second exemplary embodiment of the present invention will now be described with reference to FIGS. 33 and 34.

Figure 33:
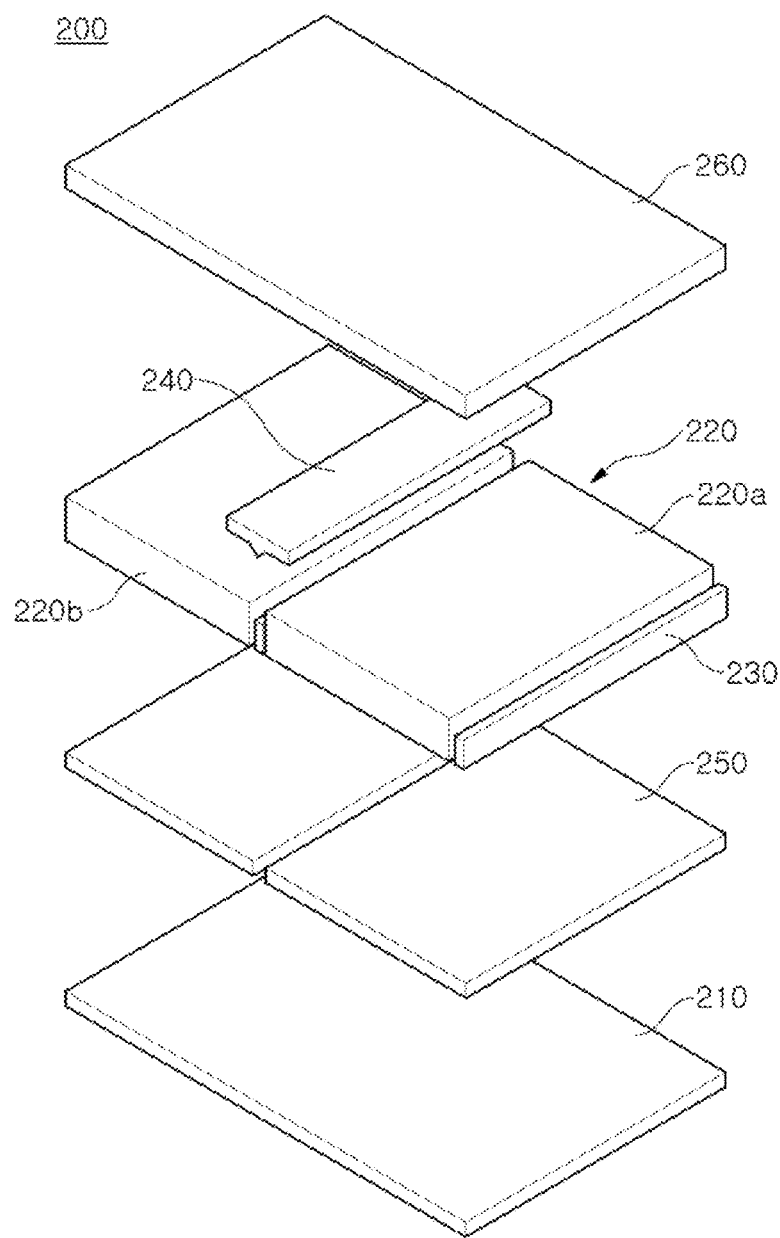
FIG. 33 is an exploded perspective view of an LED backlight unit including the LED package according to a second exemplary embodiment of the present invention.
Figure 34:
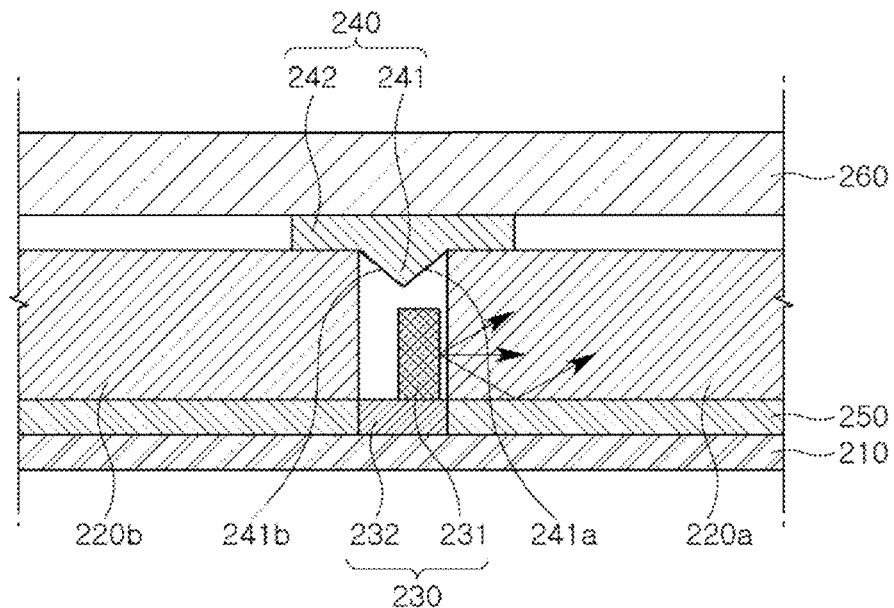
FIG. 34 is a sectional view of the LED backlight unit of FIG. 33.

FIG. 33 is an exploded perspective view of an LED backlight unit including the LED package according to the second exemplary embodiment of the present invention, and FIG. 34 is a sectional view of the LED backlight unit of FIG. 33.

Here, the backlight unit may include a plurality of divided light guide plates, however, only the first and second of the plurality of light guide plates are illustrated for the sake of brevity.

With reference to FIGS. 33 and 34, a backlight unit 200 includes a lower cover, a light guide plate 220, a light source unit 230, and a fixing member 240.

The lower cover 210 has a receiving space. For example, the receiving space may be formed by a bottom surface of the lower cover 210 and a side wall bent from an edge of the bottom surface.

The light guide plate 220 is divided into a plurality of sections. The divided plurality of light guide plates 220 are disposed in parallel within the receiving space of the lower cover 210.

The light guide plate 220 is illustrated to have a quadrilateral shape, but the present invention is not limited thereto and the light guide plate may have various other shapes such as a triangular or hexagonal shape.

A light source unit 230 is disposed at one side of each light guide plate 220 in order to provide light to the light guide plate 220. Each light source unit 230 includes an LED package for forming light and a board 232 having a plurality of circuit patterns for applying a driving voltage of the LED package 231.

A light source of the LED package 231 may be an LED that emits light when current is applied thereto. Here, the LED may include sub-LEDs each implementing blue, green and red colors. The blue, green and red light beams emitted from the sub-LEDs implementing blue, green, and red colors may be mixed to implement white light.

The LED may include a phosphor for converting a portion of the blue light and/or UV light emitted from the blue and/or UV LED into blue, green, yellow, and red colors. In this case, the blue and the green, yellow, and red, or the blue and yellow may be mixed to implement white light, or the UV light may be converted into blue, green, yellow, and red colors or into blue, green, and red colors to implement white light.

Light formed by the light source unit 230 is made incident to the side of the light guide plate 220, and then output to an upper portion through total reflection within the light guide plate 220.

The fixing member 240 is disposed between the divided light guide plates 220 to prevent the divided light guide plates 220 from being separately moved.

The fixing member 240 includes an insertion portion 241 and a head portion 242.

The insertion portion 241 may be inserted between the divided light guide plates 220 to prevent the divided light guide plates 220 from being moved horizontally. Namely, the insertion portion 241 is inserted between mutually adjacent first and second light guide plates 220a and 220b among the divided light guide plates 220. Here, the insertion portion 241 may include first and second slope faces 241a and 241b extending from an end portion of the insertion portion 241 to both sides so as to be connected with the head portion 242. Namely, the section of the insertion portion 241 may have a triangular shape. Thus, the insertion portion 241 can be easily inserted between the divided light guide plates 220.

The head portion 242 may have an area larger than the insertion portion 241. The head portion 242 may have a width larger than the distance between the neighboring light guide plates. Thus, the head portion 241 is disposed at the edge of an upper end of each of the divided light guide plates 220. Namely, the head portion 242 is laid between the upper edges of the light guide plates 220 which face with the insertion portion 241 interposed therebetween to prevent the fixing member 240 from being released to the space between the divided light guide plates 220. In addition, the head portion 242 downwardly presses the divided light guide plates 220 to prevent the divided light guide plates 220 from being moved up and down.

Because the fixing member 240 including the insertion portion 241 and the head portion 242 is disposed between the divided light guide plates 220, the divided light guide plates 220 can be prevented from being moved left and right as well as up and down.

The fixing member 240 may have a stripe shape traversing the lower cover 210 or a lattice shape formed to surround the periphery of each of the light guide plates 220.

In order to minimize the influence of the fixing member 240 on picture quality, the fixing member 240 may be made of a material that allows for light transmission, e.g., a transparent plastic. In addition, the fixing member 240 may contain a reflection material, e.g., $TiO_2$, for making light leaked between the light guide plates 220 reflect to the corresponding light guide plate 220.

A reflection member 250 may be disposed under each light guide plate 220. The reflection member 250 reflects light output to a lower portion of the light guide plates 220 to make the light again made incident to the light guide plates 220, thereby improving the light efficiency of the backlight unit.

The backlight unit may further include an optical member 260 supported by the fixing member 24 and disposed on the light guide plats 220. The optical member 260 may include a diffusion plate, a diffusion sheet, a prism sheet, and a protection sheet disposed on the light guide plate 220. The optical member 260 is spaced apart from the light guide plate 220 by means of the fixing member 240. Accordingly, the light guide plate 220 may uniformly provide light to the optical member 260.

In this manner, because the backlight unit having the light guide plates 220 divided into the plurality of sections for separation driving according to the present exemplary embodiment of the present invention includes the fixing member 240 for preventing movement of the divided light guide plates 220, heat can be smoothly released and a deficiency that may be otherwise caused by the movement of the light guide plate 220 can be prevented.

Figure 35:
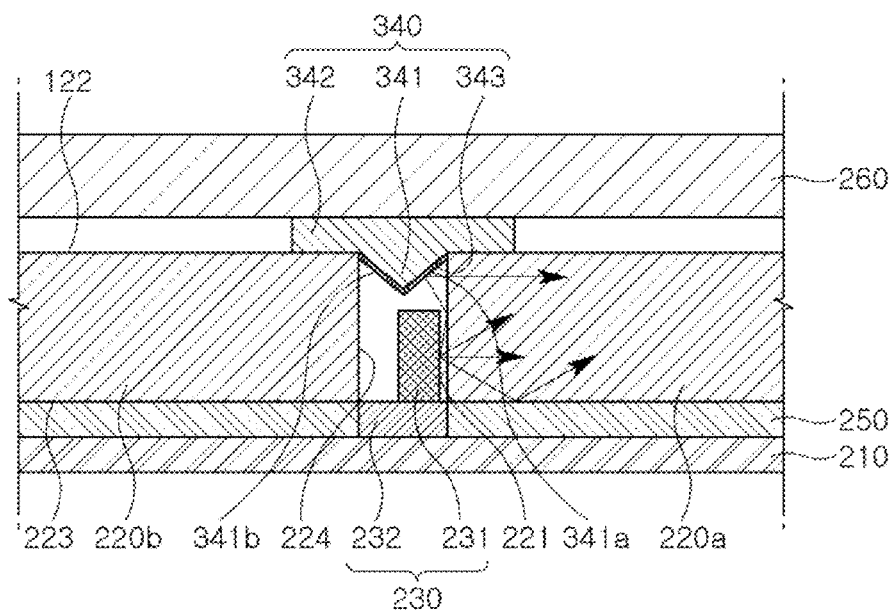
FIG. 35 is a sectional view of a backlight unit according to a third exemplary embodiment of the present invention.

FIG. 35 is a sectional view of a backlight unit according to a third exemplary embodiment of the present invention.

The backlight unit according to the third exemplary embodiment of the present invention has the same elements as that of the second exemplary embodiment of the present invention, except for a reflection film. The same elements of the backlight unit as those of the second exemplary embodiment will be given the same reference numerals, and the repeated description will be omitted.

With reference to FIG. 35, the backlight unit according to the third exemplary embodiment of the present invention includes the lower cover 210, the light guide plate 220 divided into a plurality of sections, the light source unit 230 and a fixing member 340. Each light guide plate 220 includes a first face 221 to which light is made incident, a second face 222 from which the light is output, a third face 223 that opposes the second face 222 and reflects the light to the second face 222, and a fourth face 224 that opposes the first face 221 and is connected with the second and third faces 222 and 223. In this case, the divided light guide plates 220 are arranged such that the first face 221 and the fourth face 224 are opposed. For example, as for mutually adjacent first and second light guide plates 220a and 220b among the divided light guide plates 220, the first face 221 of the first light guide plate 220a and the fourth face 224 of the second guide plate 220b are opposed.

The fixing member 340 includes an insertion portion 341 inserted between the plurality of divided light guide plates 220, e.g., the first and second light guide plates 220a and 220b, and a head portion 342 connected with the insertion portion 341 and extending to an upper edge of the first and second light guide plates 220a and 220b.

The insertion portion 341 may include first and second slope faces 341a and 341b extending from an end portion of the insertion portion 341 to both sides so as to be connected with the head portion 342. Namely, the section of the insertion portion 341 may have a triangular shape.

Here, either the first slope face 341a or the second slope face 341b may be sloped to the first face 221 of the light guide plate 220 to which light from the light source unit 230 is made incident. For example, as for the mutually adjacent first and second light guide plats 220a and 220b among the divided light guide plates, the first face 221 of the first guide plate 220a and the first slope face 341a may oppose each other, and the fourth face 224 of the second light guide plate 220b and the second slope face 341b may oppose each other. Here, the first slope face 341a extends to an upper portion of the first face 221, and the second slope face 341b extends to an upper portion of the fourth face 224.

In this case, a reflection film 343 is provided on an outer surface, i.e., on the first and second slope faces 341a and 341b, of the insertion portion 341.

By virtue of the reflection film 343, of light provided to the first face 221 of the first light guide plate 220a, a portion or the entirety of light leaked to the fourth face 224 of the second light guide plate 220b can be provided to the first light guide plate 220a. Thus, a hot spot otherwise generated due to light leaked between the divided light guide plates 220 can be prevented. Here, the hot spot refers to a bright point defect having a stronger luminance than the periphery on a portion of a screen image.

The reflection film 343, having the slope extending toward the upper portion of the first face 221 by the first slope face 341a, can effectively reflect light to the first face. Here, a hot spot can be improved by adjusting a reflexibility of the reflection film 343 and the angle of the first and second slope faces 341a and 341b according to the luminance characteristics of the light source unit 230 and the material of the light guide plate 220.

Thus, the backlight unit according to the present invention can solve the hot spot problem as well as improving the movement of the divided light guide plates 220 by having the reflection film 343 that partially or entirely reflects light leaked between the light guide plates 220 divided by the fixing member 340.

Figure 36:
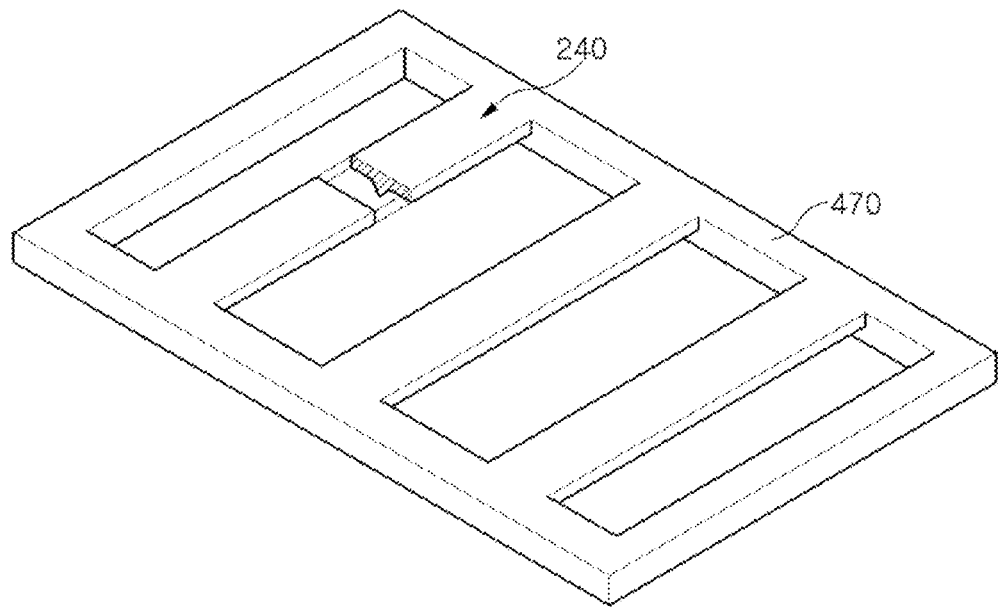
FIG. 36 is a perspective view showing a fixing member provided in a backlight unit according to a fourth exemplary embodiment of the present invention.

FIG. 36 is a perspective view showing a fixing member provided in a backlight unit according to a fourth exemplary embodiment of the present invention.

The backlight unit according to the fourth exemplary embodiment of the present invention has the same elements as those of the backlight unit according to the second exemplary embodiment of the present invention. Thus, the same elements as those of the backlight unit according to the second exemplary embodiment will be given the same reference numerals, and a repeated description will be omitted.

With reference to FIG. 36, the backlight unit according to the fourth exemplary embodiment of the present invention includes the lower cover 210, the light guide plate 220 divided into a plurality of sections, the light source unit 230, fixing members 240, and a fixing frame 470.

The fixing frame 470 connects the plurality of fixing members 240 to each other. In detail, the fixing frame 470 has a rectangular frame shape with the interior open, and the fixing members 240 are disposed in the opening of the fixing frame 470. Here, as shown, the fixing members 240 may have a stripe shape. However, the shape of the fixing members 240 may not be limited and the fixing members 240 may have a lattice form.

The fixing members 240 and the fixing frame 470 may be integrally molded. Or, the fixing members 240 and the fixing frame 470 may be combined by using a coupling unit, e.g., an adhesive, a fastening part, or the like.

Accordingly, the plurality of fixing members 240 may be assembled to the divided light guide plates 220 by the fixing frame 470 collectively one time, so the assembly productivity can be improved compared with a case where the plurality of fixing members 240 are separately assembled.

The fixing frame 470 may be fixed on the lower cover 210, so the divided light guide plates 220 can be more effectively fixed.

Accordingly, the backlight unit according to the fourth exemplary embodiment of the present invention can improve the assembly productivity and fixing characteristics by including the fixing frame 470 for connecting the plurality of fixing members 240.

A backlight unit having the LED package according to a fifth exemplary embodiment of the present invention will now be described with reference to FIGS. 37 to 44.

Figure 37:
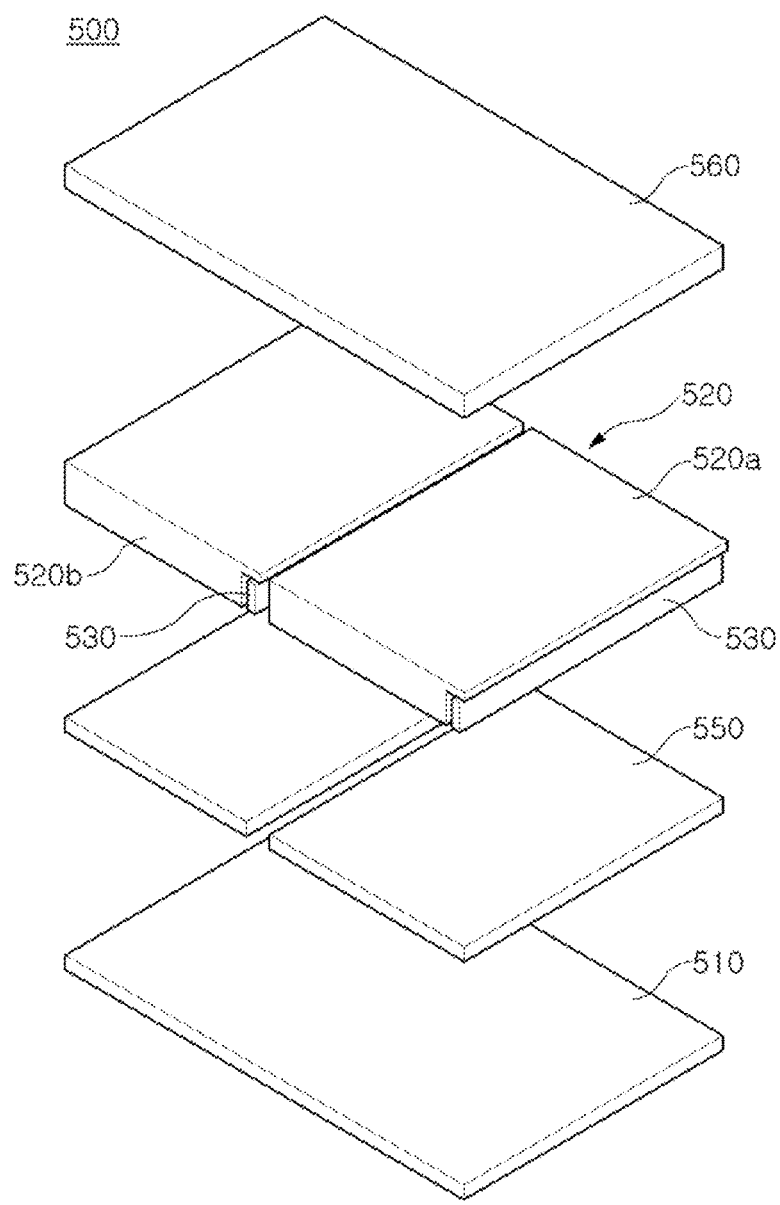
FIG. 37 is an exploded perspective view of a backlight unit including the LED package according to a fifth exemplary embodiment of the present invention.
Figure 38:
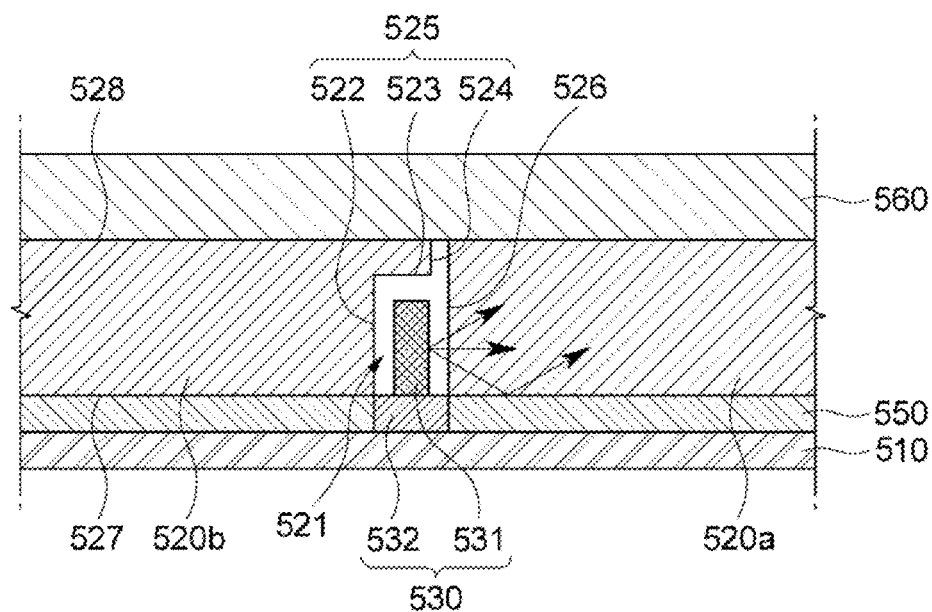
FIG. 38 is a sectional view of the backlight unit of FIG. 37.

FIG. 37 is an exploded perspective view of a backlight unit including the LED package according to a fifth exemplary embodiment of the present invention, and FIG. 38 is a sectional view of the backlight unit of FIG. 37.

With reference to FIGS. 37 and 38, a backlight unit 500 includes a lower cover 510, a plurality of light guide plates 520 disposed in parallel on the lower cover, and a light source unit 530 disposed at one side of each of the plurality of light guide plates 520. Here, the backlight unit may include a plurality of light guide plates, but two light guide plates are illustrated for the sake of brevity.

In detail, the lower cover 510 may have a receiving space for receiving the plurality of light guide plates 520 and the light source unit 530. For example, the receiving space may be formed by a bottom surface of the lower cover 510 and a side wall bent from an edge of the bottom surface.

The light source unit 530 may be disposed at the edge of each of the plurality of light guide plates 520 to provide a separation driving function to the edge type backlight unit. Namely, the light source unit 530 provides light having an adjusted luminance value to the corresponding light guide plate 520, and the corresponding light guide plate 520 may provide the light having the adjusted luminance value to a selected region of the liquid crystal panel.

The plurality of light guide plates 520 includes one face 525 having a receiving recess 521, another face 526 facing the one side, a lower face 527 bent to extend from an edge of the one face 525, and an upper face 528 facing the lower face 527. The another face 526 may serve as an incident face to which light formed (emitted) from the light source unit 530 is made incident. The lower face 527 may serve as a reflection face for total-reflecting light to an upper side. Here, although not shown, a plurality of optical patterns may be disposed on the lower face 527. In addition, the upper face 528 may serve as an output face from which the light is output to the outside.

The plurality of light guide plates 520 may be disposed such that the one face 525 and the another face 526 of the mutually adjacent light guide plates face each other. For example, the plurality of light guide plates 520 may include mutually adjacent first and second light guide plates 520a and 520b. In this case, the one face 525 of the first light guide plate 525a and the another face 526 of the second light guide plate 520b may face each other.

The light source unit 530 may be disposed between the mutually adjacent light guide plates, for example, between the one face of the first light guide plate 520a and the another face of the second light guide plate 520b. The light source unit 530 is received in the receiving recess 521 formed at the one face 525. Accordingly, it is unnecessary to separate the plurality of light guide plates 520 at certain intervals to install the light source unit 530 between the plurality of light guide plates 520, so the backlight unit can be formed to be compact. In addition, because the space between the plurality of light guide plates 520 is received, light leakage to between the plurality of light guide plates 520 can be prevented.

The receiving recess 521 may be formed by a first face 522 upwardly bent to extend from the edge of the lower face 527 and a second face 523 outwardly bent to extend from the edge of the first face 522. In this case, when the light source unit 530 makes light incident to the another face 526 of the second light guide plate 520, the first face 522 faces the rear side of the light source unit 530 and the second face 523 faces the side of the light source unit 530.

Here, the optical characteristics of the receiving recess 521, in particular, the second face 523, may be adjusted to prevent generation of a hot spot due to light leaked to between the plurality of light guide plates 520. For example, the first face 522 may be formed as one of a diffusion face, a reflection face, and an optically polished face. Here, the first face 522 reflects a portion of leaked light to the another face 526 and absorbs or externally transmits the other remaining leaked light. The second face 523 may be formed as a diffusion face. In this case, the second face 523 may have a reflexibility of 40% to 70%. If the reflexibility of the second face 523 is 40% or lower, a hot spot that the boundaries between the light guide plates 520 becomes brighter than the upper face 528 of each of the light guide plates 520 may occur. Meanwhile, if the reflexibility of the second face is 70% or higher, a dark spot whereby the boundaries of the light guide plates 520 are darker than the upper face 528 of each of the light guide plates 520 may occur.

The one face 525 may include a third face 524 extending to the receiving recess 521, namely, upwardly bent to extend from the edge of the second face 523. The third face 524 may face in parallel the another face 526 of the neighboring light guide plate 520. In this case, the third face 524 may be formed as one of a diffusion face, a reflection face, and an optically polished face.

In other words, the second face 523 of the receiving recess 521 is formed as a diffusion face, and the optical characteristic of the first face 522 and the third face 524 does not greatly affect the hot spot. However, if one, having a larger area, of the first face 522 and the third face 524 is formed as an optically polished face, a light transmittance would increase to cause a hot spot. Thus, a larger one among the first face 522 and the third face 524 must be formed as a diffusion face or a reflection face excluding the optically polished face.

For example, if the area of the third face 524 is larger than that of the first face 522, the first face 522 may be formed as one of the optically polished face, the reflection face, and the diffusion face. However, the third face 524 may be formed as one of the reflection face and the diffusion face. Meanwhile, if the area of the third face 524 is smaller than that of the first face 522, the third face 524 may be formed as the optically polished face, the reflection face, and the diffusion face. The first face 522 may be formed as one of the reflection face and the diffusion face.

Here, the optical characteristics of the first, second, and third faces, in particular, the optical characteristics of the second face, may be adjusted by changing the density of white ink coated on their surfaces.

In the present exemplary embodiment, the receiving recess provided to the light guide plates has the rectangular shape, but the present invention is not meant to be limited thereto.

Various shapes of the receiving recess formed at the light guide plats according to an exemplary embodiment of the present invention will now be described in detail with reference to FIGS. 39 to 42.

FIGS. 39 to 42 are sectional views illustrating various types of light guide plates provided in the backlight unit according to an exemplary embodiment of the present invention.

Figure 39:
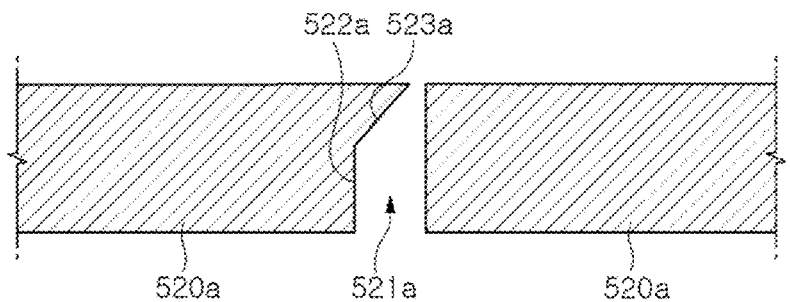
FIGS. 39 to 42 are sectional views illustrating various types of light guide plates provided in the backlight unit according to an exemplary embodiment of the present invention.

As shown in FIG. 39, a receiving recess 521a of the light guide plate 520a according to a first exemplary embodiment of the present invention may have a trapezoid sectional shape formed by a first face 522a and a second face 523c upwardly sloped from the first face 522a.

Figure 40:
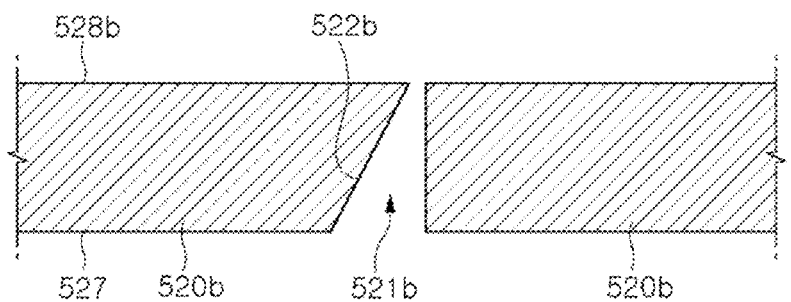

As shown in FIG. 40, the receiving recess 521b of the light guide plate 520b according to a second exemplary embodiment of the present invention may have a triangular sectional shape formed by a first face 522b slopingly extending from an edge of a lower face 527b to an edge of an upper face 528b.

Figure 41:
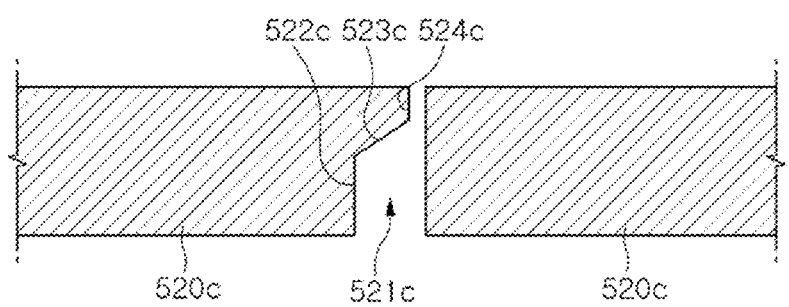

As shown in FIG. 41, a receiving recess 521c of a light guide plate 520c according to a third exemplary embodiment of the present invention may have a trapezoid sectional shape formed by a first face 522c and a second face 523c upwardly sloped from the first face 522c. Here, the light guide plate 520c according to the third exemplary embodiment of the present invention may have a third face 524c upwardly bent to extend from the second face 523c of the receiving recess 521c.

Figure 42:
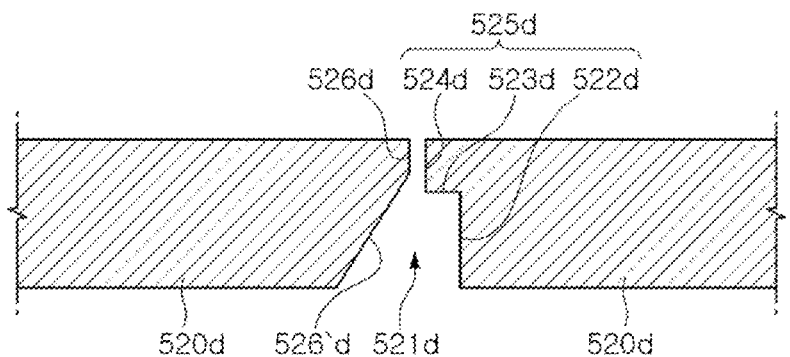

As shown in FIG. 42, a receiving recess 521d of a light guide plate 520d according to a fourth exemplary embodiment of the present invention may be formed by a linear first face 522d and a second face 523d upwardly bent from the first face 522d. In this case, one face 525d on which the receiving recess 521d is formed may serve as an incident face to which light is made incident. Namely, the receiving recess 521d for receiving the light source unit 530 may be formed on the incident face. In this case, another face 526d facing the one face 525d of the light guide plate may have a slope face 526'd sloped to extend upwardly. The slope face effectively reflects light leaked from the rear side of the light source unit 530 to more effectively improve a hot spot.

With reference to FIGS. 37 and 38, each light guide plate 520 has the flat lower face 527, so the lower surfaces of the plurality of light guide plates may be disposed on the same straight line. Accordingly, the plurality of light guide plates 520 can be easily assembled, improving the assembly characteristics of the backlight unit. In addition, when the backlight unit is applied to a large-scale display device, the flatness of the plurality of light guide plates 520 can be easily adjusted. In addition, because the lower face 527 of each of the light guide plates 520 is flat, a cutting process and optical polishing process can be more easily performed on the light guide plates 520.

The light source unit 530 may include a light source 531 for emitting light and a board 532 including a plurality of circuit patterns for applying a driving voltage of the light source 531. In this case, a plurality of light sources 531 may be mounted on the board 532.

The light source 531 may, for example, be an LED that emits light when current is applied thereto. In this case, the LED may have various forms. For example, the LED may include sub-LEDs each implementing blue, green, and red colors. In this case, the blue, green, and red light emitted from the sub-LEDs implementing the blue, green, and red colors may be mixed to implement white light. Also, the LED may include a blue LED and a phosphor for converting a portion of the blue light emitted from the blue LED into yellow color. In this case, the blue color and the yellow color may be mixed to implement white light.

In the above description of the exemplary embodiment of the present invention, the light source unit 530 includes the LED as a light source, but the present invention is not limited thereto. For example, the light source of the light source unit 530 may be a CCFL or an EEFL.

In addition, a reflection member 550 may be disposed at a lower portion of each light guide plate 520. The reflection member 550 may reflect light output to the lower portion of the light guide plate 520 to make the light incident again to the light guide plate, thus improving the light efficiency of the backlight unit.

In the above description of the exemplary embodiment of the present invention, the reflection member 550 is divided into a plurality of sections and disposed at the lower portion of each of the light guide plate 520, but the present invention is not limited thereto. That is, the reflection members 550 may be integrally disposed at a lower portion of the plurality of light guide plates 520.

In this case, because the lower faces of the plurality of light guide plates 520 are disposed on a straight line, so the reflection members 550 can be easily attached.

The backlight unit may further include an optical member 560 disposed on the light guide plate 520. The optical member 560 may include, for example, the diffusion plate, the diffusion sheet, the prism sheet, and the protection sheet disposed on the light guide plates.

The luminance characteristics of the backlight unit according to an exemplary embodiment of the present invention will now be described. Here, the plurality of light guide plates provided in the backlight unit include a receiving recess formed by the first and second faces and a third face extending from the receiving recess. In this case, the first and second faces are formed as diffusion faces, and the third face is formed as a reflection face. The diffusion faces have a reflexibility of 45%, and the reflection face has a reflectivity of 90%.

Figure 43:
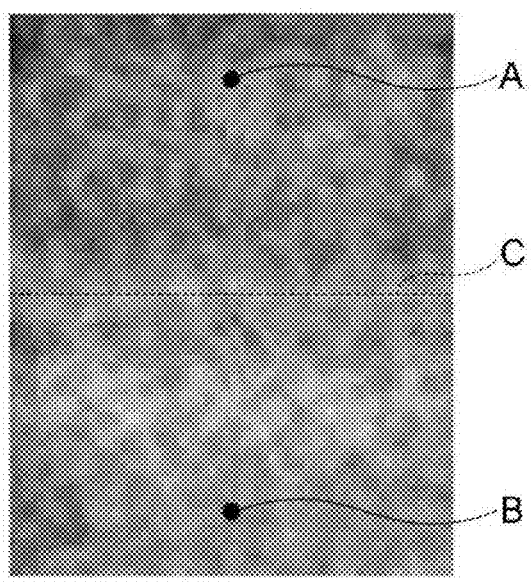
FIG. 43 is a photo showing the illumination of the backlight unit according to an exemplary embodiment of the present invention.

FIG. 43 is a photo showing illumination of the backlight unit according to an exemplary embodiment of the present invention. Specifically, FIG. 43 shows two enlarged light guide plates among the plurality of light guide plates.

As shown in FIG. 43, it is confirmed that the two light guide plates including the boundary (C) of the two light guide plates have the uniform illumination.

Figure 44:
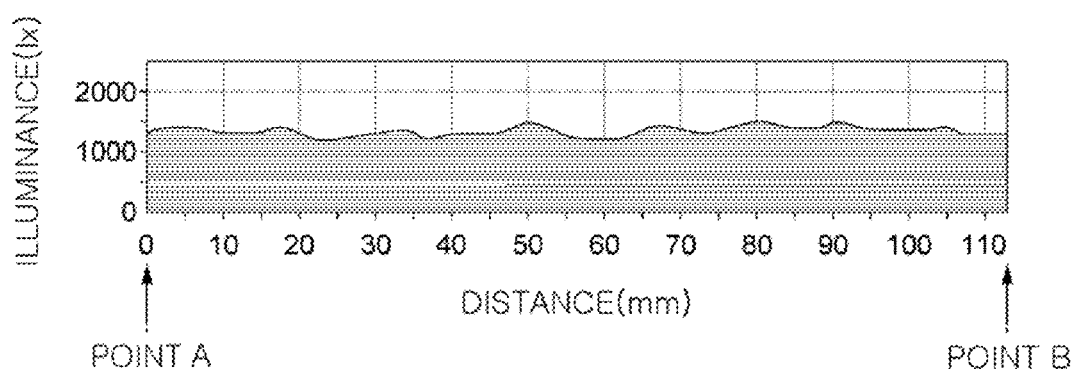
FIG. 44 is a graph showing an illumination distribution at the distance between two points of FIG. 43.

FIG. 44 is a graph showing an illumination distribution at the distance between two points of FIG. 43.

As shown in FIG. 44, the result of checking the illumination (i.e., the intensity of illumination or illuminance) according to the distance from a point A (0 mm) of one light guide plate to a point B (110 mm) of another light guide plate shows the uniform distribution of illumination over the point A to point B.

In addition, the same result was obtained when the first and third faces are formed as reflection faces and the second face is formed as a diffusion face, so its detailed description is thus omitted.

Accordingly, in the backlight unit including the plurality of light guide plates, when the second face of the receiving recess for receiving the light source unit in each light guide plate is formed as the diffusion face, uniform luminance was obtained at the upper portion of each of the plurality of light guide plates and at the boundaries of the plurality of light guide plates.

Accordingly, the backlight unit according to the fifth exemplary embodiment of the present invention obtains both the effect of separation driving (local dimming) by the partial driving and the effect of the edge type backlight unit by having the light guide plates divided into the plurality of sections and the light source unit disposed at the edge of each light guide plate.

In addition, because the receiving recess for receiving the light source unit is provided at the edge of each light guide plate, the backlight unit can be formed to be compact.

Also, because the optical problem such as a hot spot is improved by adjusting the optical characteristics with respect to one side of each light guide plate including the receiving recess, the quality of the backlight unit can be improved.

A backlight unit having the LED package according to a sixth exemplary embodiment of the present invention will now be described with reference to FIGS. 45 and 46.

Figure 45:
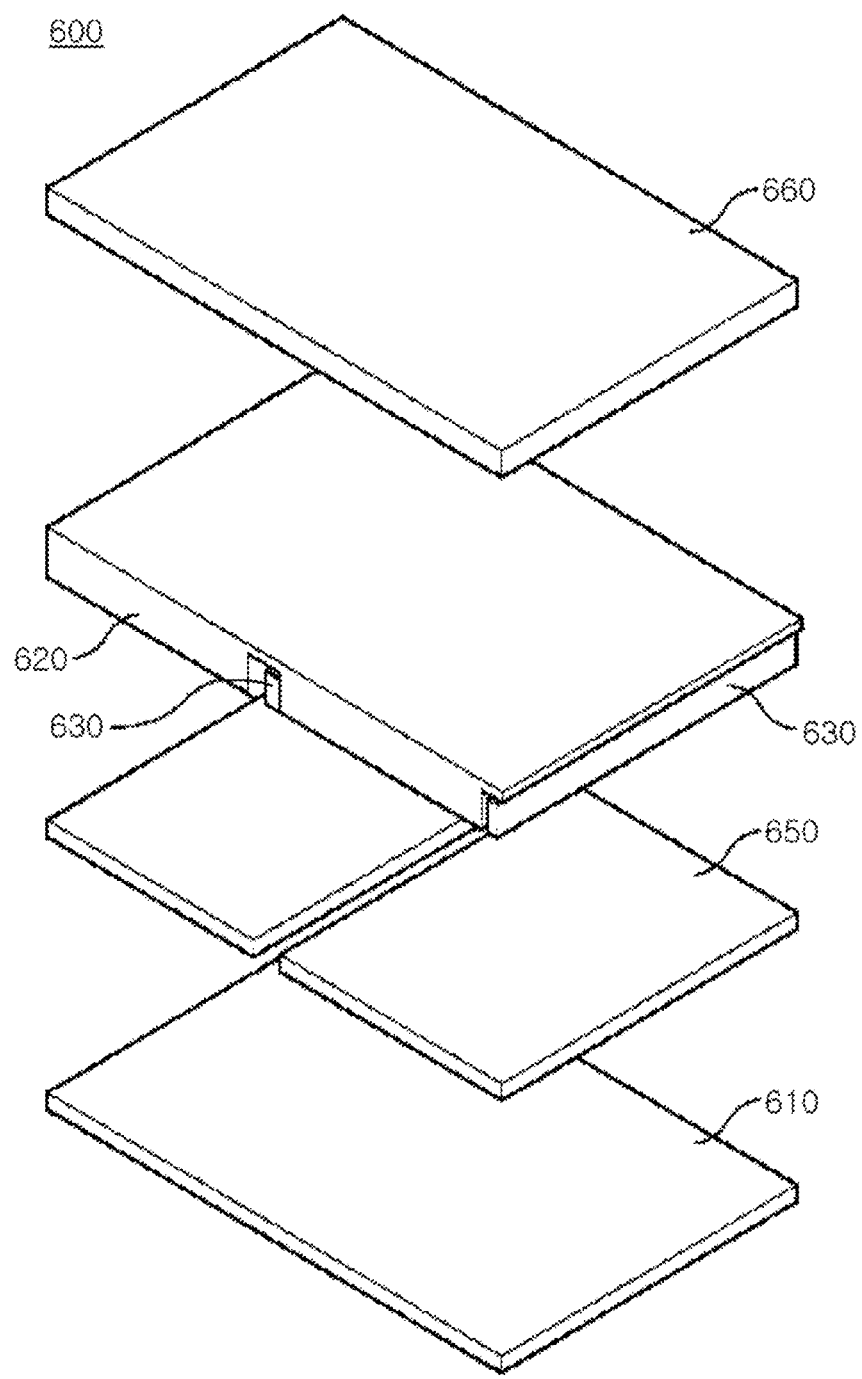
FIG. 45 is an exploded perspective view of a backlight unit including the LED package according to a sixth exemplary embodiment of the present invention.
Figure 46:
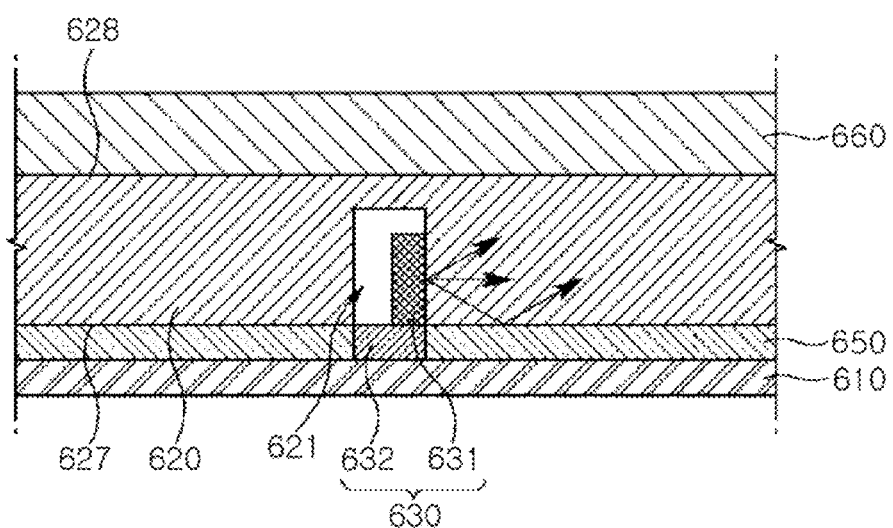
FIG. 46 is a sectional view of the backlight unit of FIG. 45.

FIG. 45 is an exploded perspective view of a backlight unit including the LED package according to a sixth exemplary embodiment of the present invention, and FIG. 46 is a sectional view of the backlight unit of FIG. 45.

With reference to FIGS. 45 and 46, the backlight unit includes a lower cover 610, a light guide plate 620 disposed on the lower cover 610 and having a receiving recess 621 on its lower surface, and a light source unit 630 provided in the receiving recess 621 of the light guide plate 620. The backlight unit may further include a reflection member 650 and an optical member 660 (similar to those described above with reference to FIGS. 37 and 38).

Compared with the backlight unit according to the fifth exemplary embodiment of the present invention having the LED package as described above with reference to FIGS. 37 and 38 in which the light guide plate is divided into a plurality of sections, the backlight unit according to the sixth exemplary embodiment of the present invention has the features wherein it is formed as a single body and includes the receiving recess 621 in which the light source unit 630 is inserted or fastened. In this case, the light source unit 630 includes a board 632 and an LED package 631 mounted on the board 632.

Through such a structure, a luminance problem arising at the part of the light source unit 630 can be improved, and an assembly process of the light guide plate 620 can be simplified.

Other detailed content of the backlight unit according to the sixth exemplary embodiment of the present invention is not greatly different from the elements of the backlight unit according to the fifth exemplary embodiment of the present invention, therefore a detailed description of the backlight unit according to the sixth exemplary embodiment of the present invention will be omitted.

Figure 47:
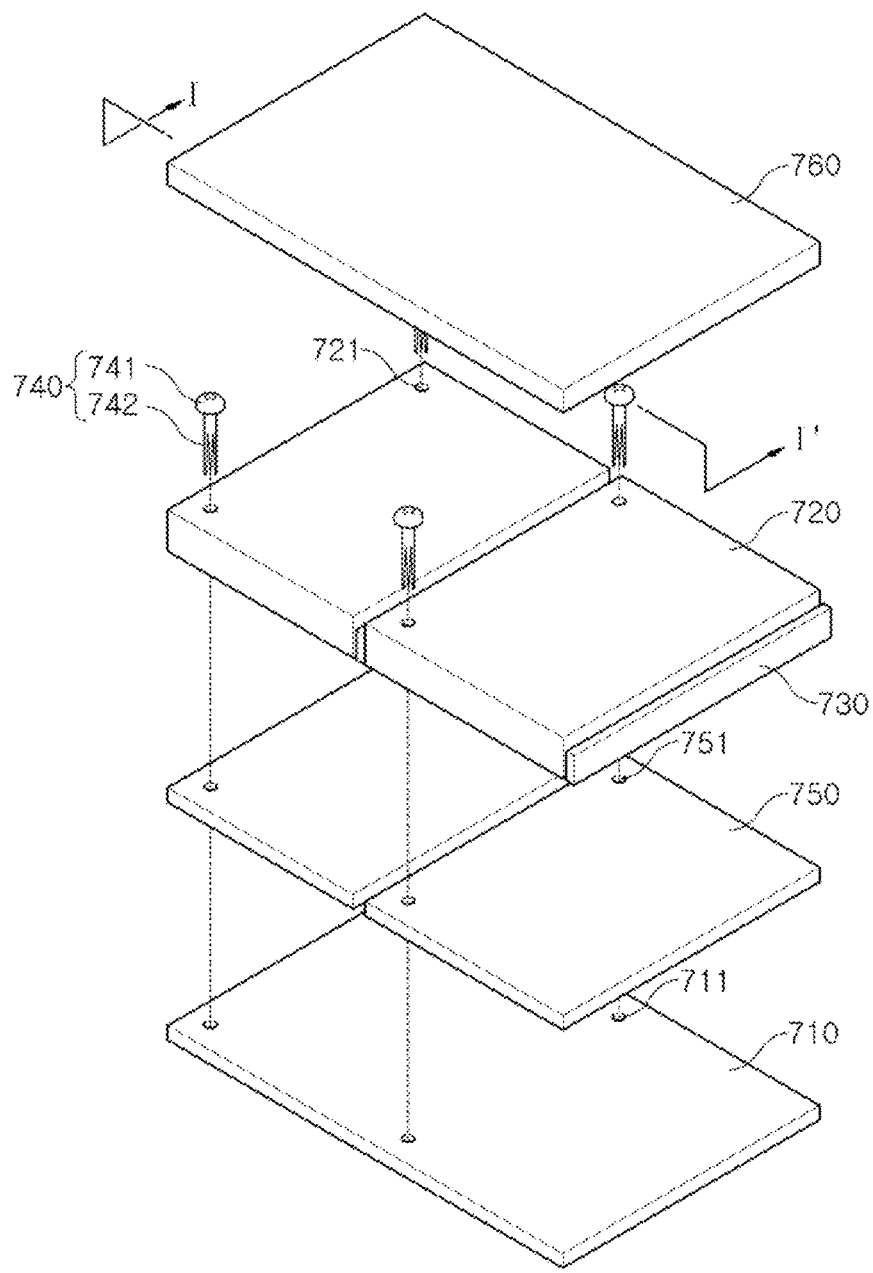
FIG. 47 is an exploded perspective view of a backlight unit including the LED package according to a seventh exemplary embodiment of the present invention.
Figure 48:
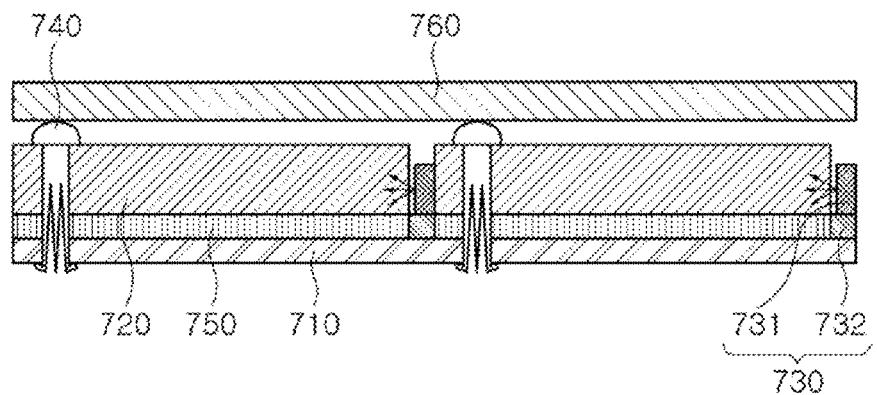
FIG. 48 is a sectional view of the backlight unit of FIG. 47.
Figure 49:
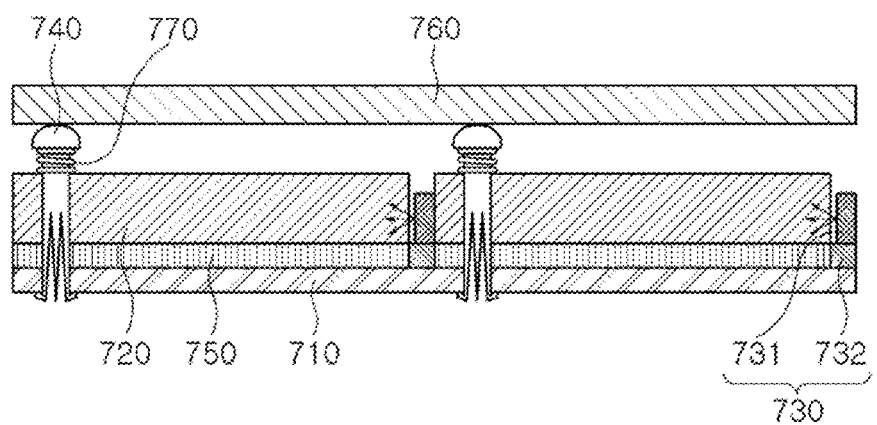
FIG. 49 is a sectional view of a backlight unit according to a different embodiment of FIG. 48.
Figure 50:
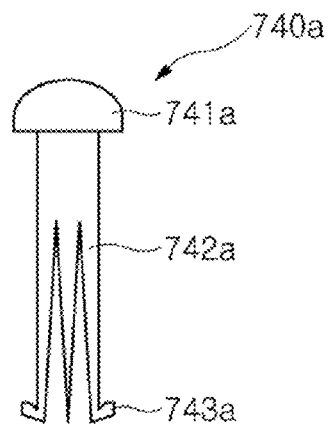
FIG. 50 is a sectional view of a fixing member of FIG. 48.
Figure 51:
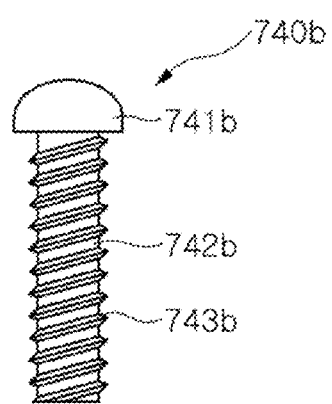
FIG. 51 is a sectional view of a fixing member according to a different embodiment.

FIG. 47 is an exploded perspective view of a backlight unit including the LED package according to a seventh exemplary embodiment of the present invention, FIG. 48 is a sectional view of the backlight unit of FIG. 47, FIG. 49 is a sectional view of a backlight unit according to a different embodiment of FIG. 48, FIG. 50 is a sectional view of a fixing member of FIG. 47, and FIG. 51 is a sectional view of a fixing member according to a different embodiment. Here, the backlight unit may include a plurality of light guide plates, and herein two light guide plates are illustrated for the sake of brevity.

With reference to FIGS. 47 and 48, the backlight unit includes a lower cover 710, a light guide plate 720, a light source unit 730, and a fixing member 740.

The lower cover 710 includes a receiving space. For example, the receiving space may be formed by a bottom surface of the lower cover 710 and a side wall bent from an edge of the bottom surface.

The lower cover 710 may have fastening portions 711 (to be described) through which a fixing member 740 is to be fastened. Here, the fastening portions 711 may be through holes through which the fixing member (to be described) is to pass or recesses into which the fixing member 740 is to be inserted.

The light guide plate 720 is divided into a plurality of sections. The plurality of divided light guide plates are disposed in parallel in the receiving space of the lower cover 710.

Each light guide plate 720 includes through holes 721 penetrating the body. The through holes 721 are disposed at the edges of the light guide plates 702. However, in the present invention, the positions and number of the through holes 721 are not limited. The through holes 721 are disposed to correspond to the fastening portions 711.

The light guide plate 720 has a rectangular shape, but it may have various other shapes such as a triangular shape or a hexagonal shape without being limited thereto.

A plurality of light source units 730 providing light to the light guide plates 720 are disposed at one side of each of the light guide plate 720. Each light source unit 730 may include a light source 731 emitting light and a printed circuit board (PCB) 732 having a plurality of circuit patterns for applying a driving voltage of the light source 731.

The light source 731 may be an LED that emits light when current is applied thereto. Here, the LED may have various shapes, and it is substantially the same as that in the above-described exemplary embodiment, so a detailed description thereof will be omitted.

Light emitted from the light source unit 730 is made incident to the side of the light guide plate 720 and output to an upper portion by an inner total reflection of the light guide plate 720.

The fixing member 740 serves to fix the light guide plate 720 to the lower cover 710 to prevent the movement of the light guide plate 720. The fixing member 740 is inserted into the through hole 721 of the light guide plate 720 to fix the light guide plate 720 to the lower cover 710. In addition, the fixing member 740 may pass through the fastening portion 711, e.g., the through hole, of the light guide plate 720 or the insertion recess by way of the through hole 721 of the light guide plate 720.

The fixing member 740 includes a body portion 742 and a head portion 741 extending from the body portion 742.

The body portion 742 is fastened to the fastening portion 711 by penetrating the through hole of the light guide plate 720. Namely, the body part 742 couples the light guide plate 720 and the lower cover 710 to fix the light guide plate 720 on the lower cover 710.

The head portion 741 has a larger width than the body portion 742 in order to prevent the fixing member 740 from being completely released through the through hole 721 of the light guide plate 720.

The head portion 741 may have one of various sectional shapes such as a semi-circular shape, a semi-oval shape, a square shape, and a triangular shape. Here, if the head portion 741 has a triangular sectional shape, it can minimize contact between the fixing member 740 and an optical member 760 (to be described) to minimize the generation of a black spot due to the fixing member 740.

The light guide plate 720 and the optical member 760 has a certain space (i.e., gap) therebetween, so light output from the light guide plate 720 can be uniformly provided on the optical member 760. Here, because the head portion 741 supports the optical member 760, it serves to maintain the space between the light guide plate 720 and the optical member 760 (to be described). Here, the space between the light guide plate 720 and the optical member 760 can be adjusted by adjusting the height of the head portion 741.

In order to minimize the influence of the fixing member 740 on picture quality, the fixing member 740 may be made of a material allowing light transmission, e.g., transparent plastic.

The fixing member 740 may have various shapes. Various examples of the fixing member will be described later.

A reflection member 750 may be disposed at a lower portion of each light guide plate 720. The reflection member 750 reflects light output to the lower portion of the light guide plate 720 to allow the light to be made incident again to the light guide plate 720, thus improving the light efficiency of the backlight unit.

The reflection member 750 may have through portions 751 corresponding to the through holes 721 and the fastening portions 711. The fixing member 740 may be fastened to the fastening portions 711 by way of the through holes 721 and the through portions 751. Accordingly, when the reflection member 750 is divided into a plurality of sections like the light guide plate 720, they can be fixed on the lower cover 710 by means of the fixing member 740.

The backlight unit may further include the optical member 760 disposed on the light guide plate 720. The optical member 760 may include, for example, a diffusion plate, a diffusion sheet, a prism sheet, and a protection sheet disposed on the light guide plate 720.

Accordingly, in the present exemplary embodiment, because the backlight unit includes the light guide plate divided into the plurality of sections, the effect of separation driving by the partial driving can be further improved.

In addition, because the light guide plates divided into the plurality of sections are fixed on the lower cover by using the fixing member, a defect otherwise caused by the movement of the light guide plates can be prevented.

Also, because the space between the light guide plates and the optical member is uniformly maintained by means of the fixing member, uniform light can be provided to the liquid crystal panel.

Moreover, the LED backlight unit can smoothly release heat, which has been generated from the light source, to the outside through the electrode structure.

FIG. 49 is a sectional view of the backlight unit of FIG. 48 according to a different exemplary embodiment. Here, the backlight unit has the same elements as those of the exemplary embodiment described above, except for a support member. Thus, the same reference numerals are given to the same elements, and a repeated description will be omitted.

With reference to FIG. 49, the backlight unit according to a different embodiment of the fixing member includes the lower cover 710 having the fastening portions 711, the plurality of light guide plates 720 disposed in parallel on the lower cover 710 and having the through holes 721 corresponding to the fastening portions 711, the light source unit 730 disposed at one side of each light guide plate 720, and the fixing members 740 passing through the through holes 721 to fix the plurality of light guide plats 720 to the lower cover 710 fastened to the fastening portions 711. In addition, the backlight unit includes the optical member 760 disposed on the light guide plates.

Here, the fixing member 740 includes a body portion 742 for fastening the light guide plate 720 and the lower cover 710 to fix the light guide plate 720 and the head portion 741 extending from the body portion 742. The head portion 741 serves to present the fixing member 740 from being released and maintain the space between the optical member 760 and the light guide plate 720.

The space between the light guide plate 720 and the optical member 760 need to be adjusted according to variables such as a mode of an LCD or the characteristics of parts constituting the backlight unit.

In this case, the length of the body of the fixing member 740 inserted into the through hole 721 may be adjusted to selectively adjust the height of the head portion 741 based on the upper surface of the light guide plate 720. In this case, if there is a certain interval between the light guide plate 720 and the head portion 741, the fixing member 740 may be moved down, rather than being fixed in the through hole 721, changing the height of the head portion 741. Thus, a support member 770 is provided between the light guide plate 720 and the fixing member 740 to prevent the movement of the fixing member 740.

Here, the support member 770 may be, for example, a spring. The spring is reduced in volume according to a certain force applied thereto, so the spring, whose volume is simply reduced according to the fastening length of the fixing member 740, prevents the fixing member 740 from being moved down.

In addition, the support member 770 can distribute pressure directly applied by the head portion 741 of the fixing member 740 to the light guide plate 720, thereby preventing damage to the light guide plate 720 due to the fastening of the fixing member 740.

In the present exemplary embodiment, the support member 770 is the spring, but the present invention is not limited thereto and the support member 770 may be an elastic pad whose volume can be controlled according to a fastening force.

Accordingly, the backlight unit including the support member 770 according to the present exemplary embodiment can selectively control the height of the head portion of the fixing member and support and fix the fixing member to thus uniformly maintain the space (gap) between the light guide plate and the optical member.

In addition, damage to the light guide plate 720 can be minimized by means of the support member 770, and the fixing member 740 can be fastened to the light guide plate.

Various types of fixing members are illustrated as follows.

FIG. 50 is a sectional view of the fixing member according to a first embodiment of the present invention. With reference to FIG. 50, a fixing member 740a according to the first exemplary embodiment of the present invention includes a head portion 741a, a body portion 742a, and a stop portion 743a. One end portion of the body portion 742a is branched into two or more parts, so that when the fixing member 740a is inserted, the diameter of the end of the body portion 742a can be reduced and thus the fixing member 740a can be easily inserted into the through hole 721 of the light guide plate 720. In addition, the stop portion 743a is disposed at the end of the branched body portion to prevent the fixing member 740a from being released.

FIG. 51 is a sectional view of the fixing member according to a second exemplary embodiment of the present invention. With reference to FIG. 51, a fixing member 740b according to the second exemplary embodiment of the present invention includes a head portion 741b and a body portion 742b. The body portion 741b includes a thread 743b on its outer surface, by means of which the body portion 741b can pass through the light guide plate 720 according to a rotation of the fixing member 740b so as to be easily fastened to the fastening portion.

Various methods for fixing the plurality of light guide plates to the lower cover will now be described with reference to FIGS. 52 to 59.

Figure 52A:
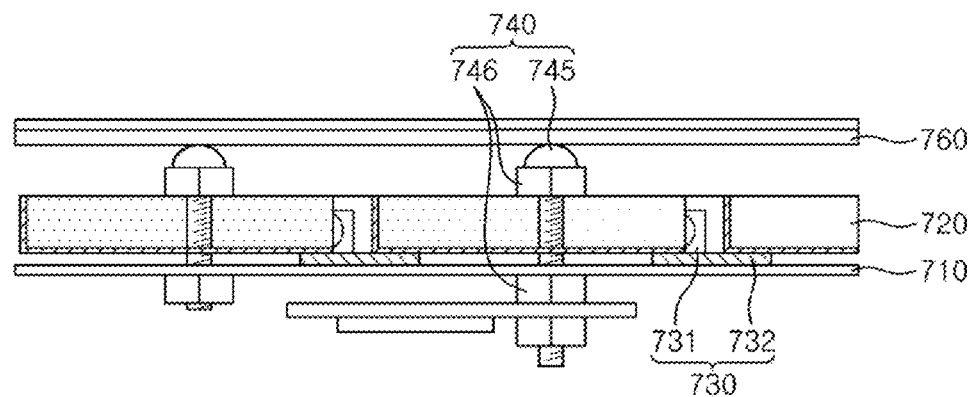
FIG. 52a is a sectional view showing fixing a light guide plate to a lower cover according to a first exemplary embodiment of the present invention.
Figure 52B:
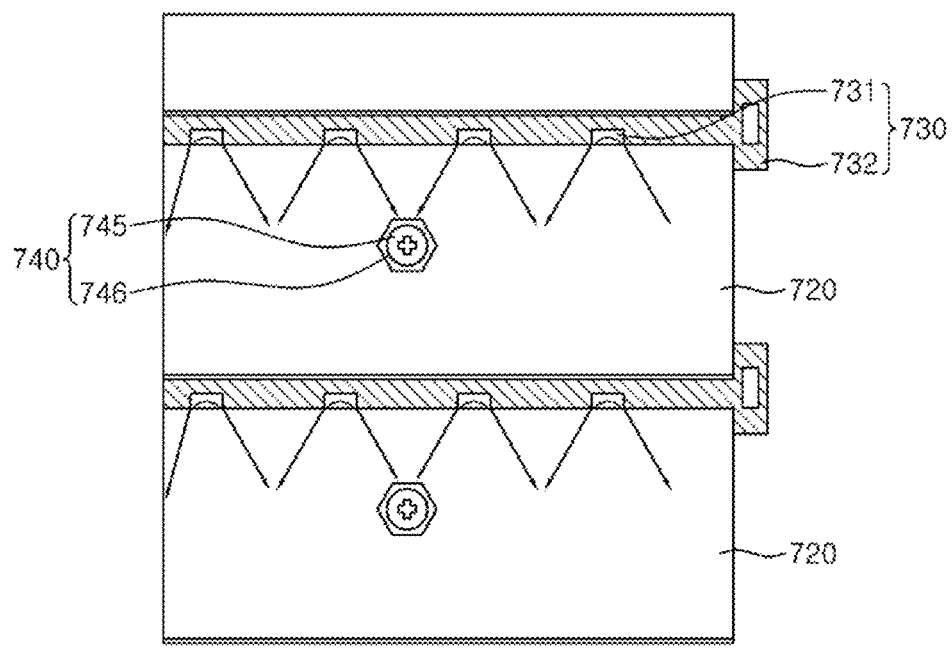
FIG. 52b is a plan view showing fixing the light guide plate to the lower cover according to the first exemplary embodiment of the present invention.

FIG. 52a is a sectional view showing fixing a light guide plate to a lower cover according to a first exemplary embodiment of the present invention, and FIG. 52b is a plan view showing fixing the light guide plate to the lower cover according to the first exemplary embodiment of the present invention.

As illustrated, the light guide plate 720 includes the through hole 721 for passing through the body and formed at a central portion. The through hole 721 may be disposed to correspond to the fastening portion 711 formed on the lower cover 710.

As the fixing member 740 for fixing the light guide plate 720, a bolt 745 and a nut 746 may be used, but the present invention is not limited thereto.

Figure 53:
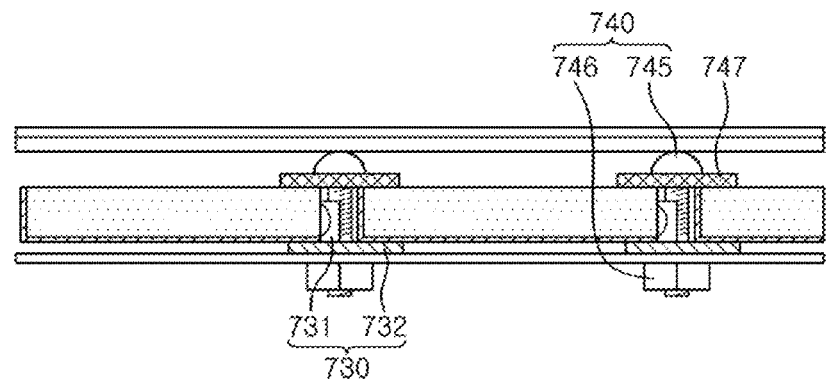
FIG. 53 is a sectional view showing fixing a light guide plate to a lower cover according to a second exemplary embodiment of the present invention.
Figure 54:
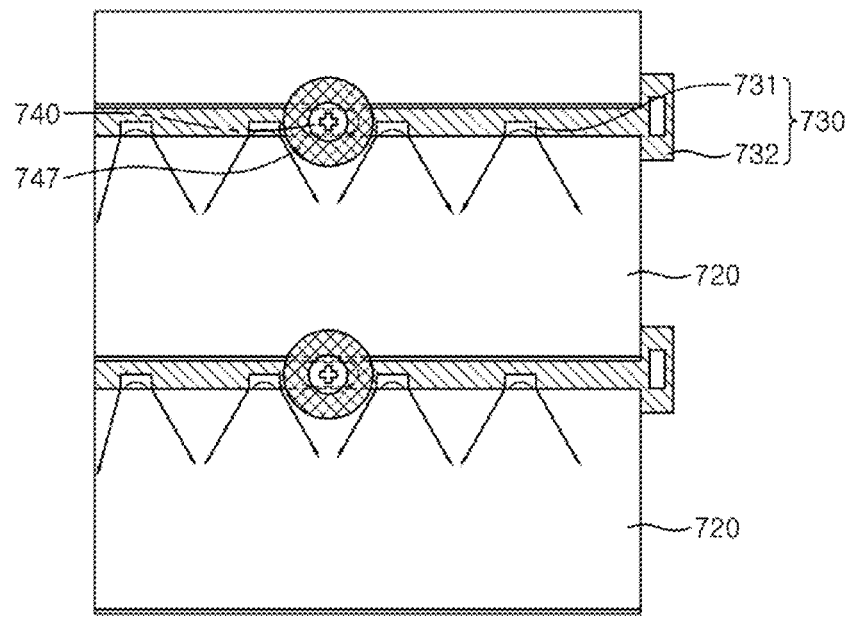
FIG. 54 is a plan view showing fixing the light guide plate to the lower cover according to the second exemplary embodiment of the present invention.
Figure 55:
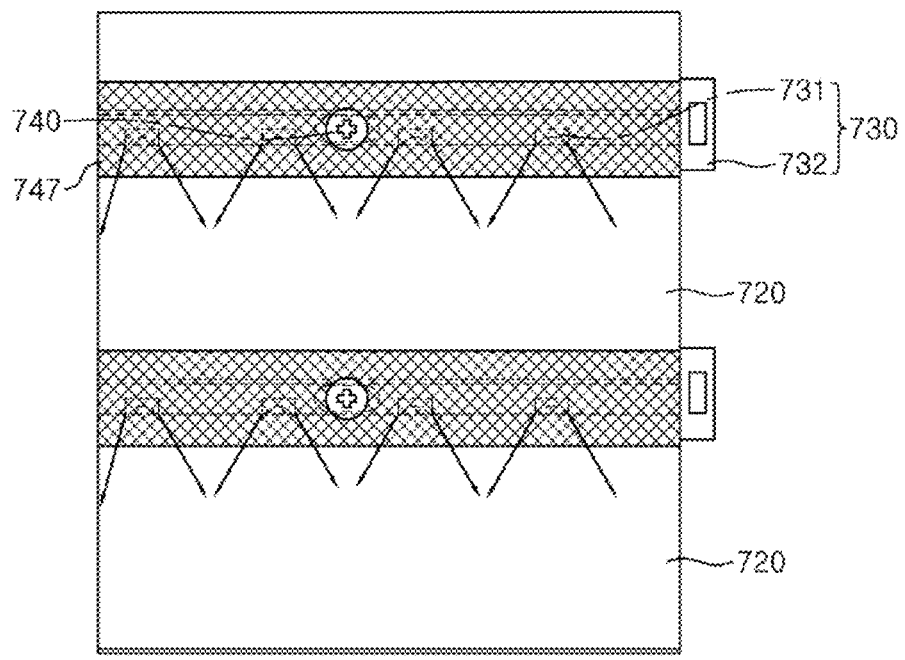
FIG. 55 is a plan view showing a different embodiment of FIG. 54.

FIG. 53 is a sectional view showing fixing a light guide plate to a lower cover according to a second exemplary embodiment of the present invention, FIG. 54 is a plan view showing fixing the light guide plate to the lower cover according to the second exemplary embodiment of the present invention, and FIG. 55 is a plan view showing a different embodiment of FIG. 54.

As illustrated, the fixing member 740 is disposed between the light guide plates 720 to fix the both light guide plates. In this case, the fixing member 740 is positioned between the LED packages 731 of the light source unit 730 so as not to affect output light.

A plate unit 747 with a large area is preferably provided between the head portion 741 and the light guide plate 720 in order to extendedly press and fix the light guide plate 720.

The plate unit 747 may have a disk shape having a diameter larger than the head portion 741, or as shown in FIG. 54, the plate unit may have a rectangular shape with a size corresponding to the length of the light guide plate 720 along a lengthwise direction of the side where the light source unit 730 is disposed to cover a gap between the light guide plates 720.

Figure 56A:
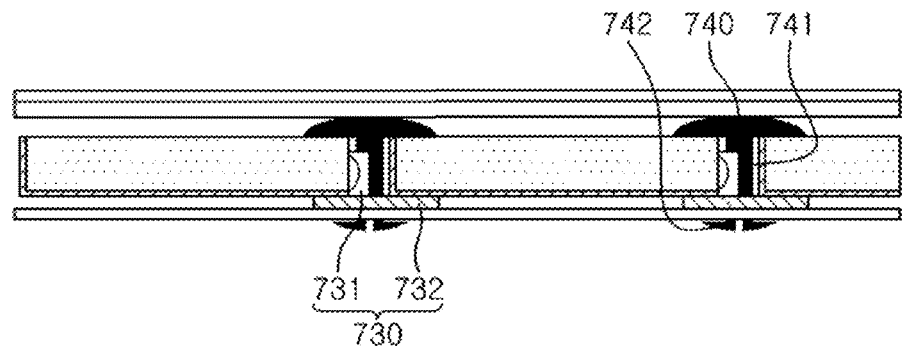
FIG. 56a is a sectional view showing fixing a light guide plate to a lower cover according to a third exemplary embodiment of the present invention.
Figure 56B:
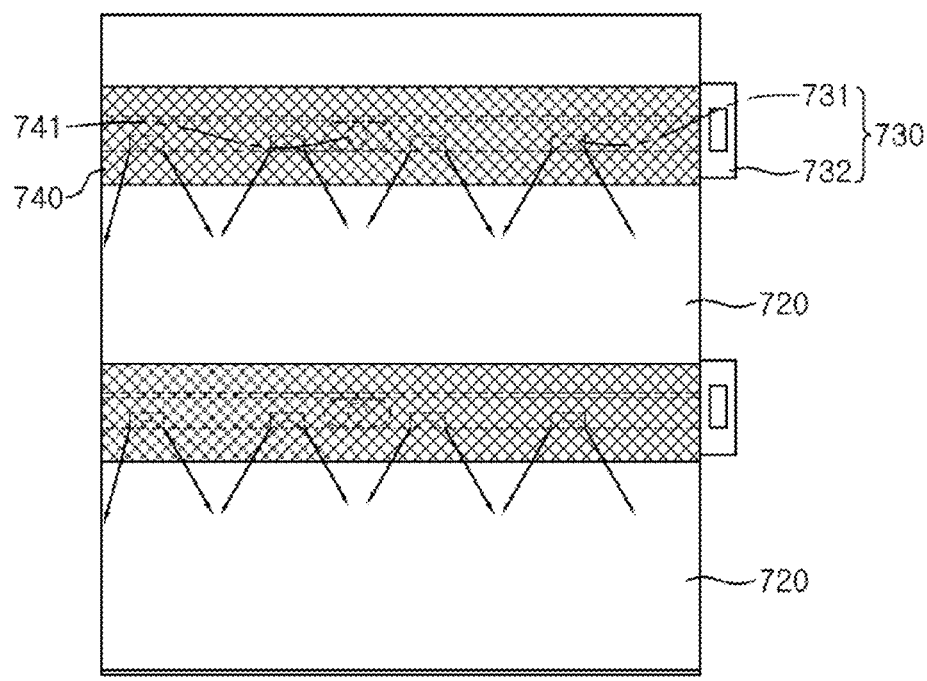
FIG. 56b is a plan view showing fixing the light guide plate to the lower cover according to the third exemplary embodiment of the present invention.

FIG. 56a is a sectional view showing fixing a light guide plate to a lower cover according to a third exemplary embodiment of the present invention and FIG. 56b is a plan view showing fixing the light guide plate to the lower cover according to the third exemplary embodiment of the present invention.

As illustrated in FIGS. 56a and 56b, the fixing member 740 includes the head portion 741 and the body portion 742. The head portion 741 has such shape as the plate unit 747 as shown in FIG. 55. Namely, the head portion 741 has the square shape to cover the gap between the light guide plates 720.

The body portion 742 may be formed as a hook member which can pass through the fastening portion 711 of the lower cover 710 and be fixedly caught.

Figure 57A:
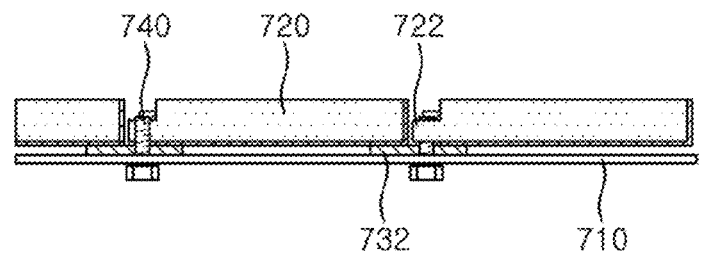
FIG. 57a is a sectional view showing fixing a light guide plate to a lower cover according to a fourth exemplary embodiment of the present invention.
Figure 57B:
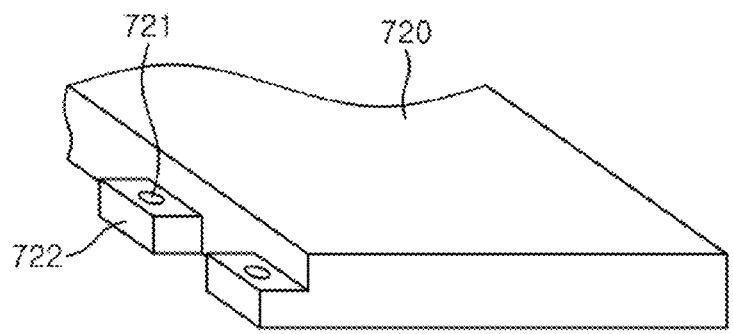

FIG. 57a is a sectional view showing fixing a light guide plate to a lower cover according to a fourth exemplary embodiment of the present invention, and FIG. 57b is a partial perspective view showing the light guide plate of FIG. 57a.

Protrusions 722 are formed at certain intervals on the side of the light guide plate 720 where the light source unit 730 is disposed., and each protrusion 722 includes a through hole 721 through which the fixing member 740 passes through so as to be fixed.

Accordingly, the LED package 731 of the light source unit 730 may be disposed between the protrusions 722 so that a gap between the light guide plates 720 may not be increased by the protrusion 722.

It is illustrated that the fixing member 740 includes a bolt and a nut which pass through the fastening portion 711 of the lower cover 710 so as to be screwed, but the present invention is not limited thereto and the fixing member 740 as illustrated in FIG. 48 may be also used.

Figure 58A:
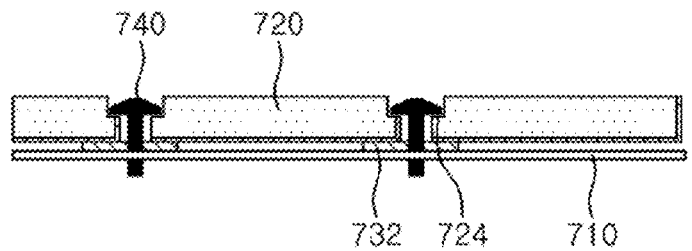
FIG. 58a is a sectional view showing fixing a light guide plate to a lower cover according to a fifth exemplary embodiment of the present invention.
Figure 58B:
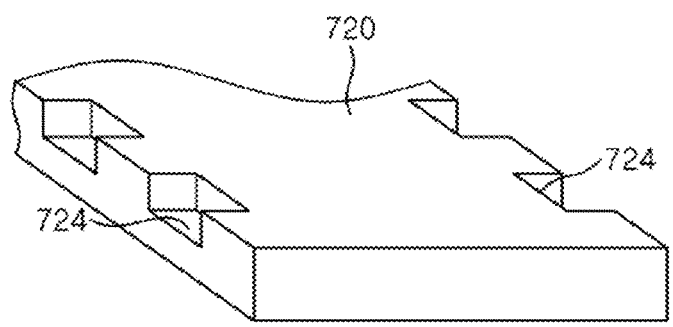

FIG. 58a is a sectional view showing fixing a light guide plate to a lower cover according to a fifth exemplary embodiment of the present invention and FIG. 58b is a partial perspective view showing the light guide plate of FIG. 58a.

Receiving portions 724 are formed at certain intervals such that they are depressed at the opposite side of the side where the light source unit 730 is disposed in the light guide plate 720. Accordingly, the part where the receiving portions 724 are formed makes a step structure with the upper surface of the light guide plate 720.

The receiving portions 724 may be formed at positions of both sides of the light guide plate 720 such that they correspond to each other. The LED package 731 is disposed on the surface where the receiving portions 724 are not formed, namely, between the receiving portions.

In this case, the head portion 741 of the fixing member 740 disposed between the light guide plates 720 is caught by the step face of the receiving portion 724, and the body portion 742 of the fixing member 740 is penetratingly fixed in the fastening portion 711 of the lower cover 710, thus fixing the light guide plate to the lower cover.

In this manner, the fixing member 740 is positioned to be lower than the light guide plate, rather than being protruded from the upper surface of the light guide plate 720, so the size of the backlight unit can be advantageously reduced.

Figure 59:
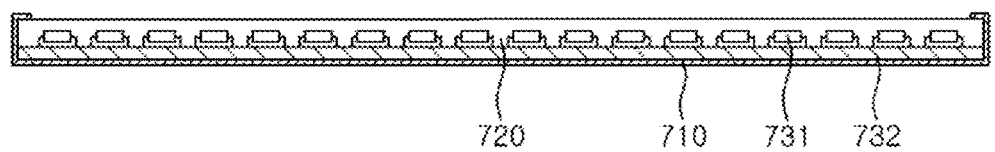
FIG. 59 is a sectional view showing the light guide plate fixed to the lower cover.

As shown in FIG. 59, the lower cover 710 is bent such that the end portions of the side walls of the lower cover 710 being in contact with both sides of the light guide plate 720 face the light guide plate 720 based on the both sides of the light guide plate 720, namely, the side where the light source unit 730 is disposed, to thereby surround the light guide plate 720.

In this case, the edge portions of the both sides of the light guide plate can be fixed by the side walls of the lower cover 710, so a fixing member for fixing the edge portions of the light guide plate can be omitted.

A backlight unit having the LED package according to an eighth exemplary embodiment of the present invention will now be described with reference to FIGS. 60 and 61.

Figure 60A:
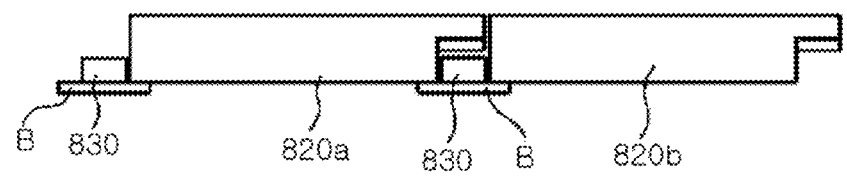
FIG. 60 is a sectional view for explaining a backlight unit according to a different exemplary embodiment of the present invention.

FIG. 60 is a sectional view for explaining a backlight unit according to a different exemplary embodiment of the present invention. First, as shown in FIG. 60a, the backlight unit according to the present exemplary embodiment is a surface light source device having a plate type light guide plate, That is, the backlight unit is a tandem type surface light source device including n number of LED light sources and n number of plate type light guide plates.

As for the LED light sources, a plurality of LED packages 830 are arranged in a row on the board (B), and n number of LED light sources configured thusly are arranged in parallel. Plate type light guide plates 820a and 820b are arranged and installed at one side of the n number of LED light sources.

The surface light source device having the plate type light guide plates includes a reflection member (not shown) disposed at a lower portion of the LED package 830 and the plate type light guide plate 820 and reflecting light output from the LED light source. An optical member, such as a diffusion sheet for diffusing light output toward the liquid crystal panel after being reflected by the reflection member and refracted from the plate type light guide plate, or a prism sheet for collecting light which has passed through the diffusion sheet into a front viewing angle, is provided at an upper portion of the plate type light guide plate.

In detail, the LED light sources include a plurality of LED packages in which a top view LED is mounted, respectively.

The plate type light guide plates 820*a* and 820*b* are disposed in a direction in which light is emitted from the LED light sources and made of a transparent material allowing light to be transmitted therethrough. The plate type light guide plate has a simple configuration compared with an edge type light guide plate, facilitating mass production, and also is easily adjusted at an upper portion of the LED light source.

The plate type light guide plates 820*a* and 820*b* include a light input portion to which light emitting from the LED light source is made incident, an output face to which the light which has been made incident from the LED light source is output as illumination light to the liquid crystal panel, and a front end portion being at the opposite side of the light input portion and having a thickness smaller than that of the light input portion, and are disposed such that a front end portion of the plate type light guide plate 820 covers the upper portion of the LED package 830. Namely, the (n+1)th LED light source is positioned at a lower portion of a front end portion of the nth plate type light guide plate. The front end portion of the plate type light guide plate has a prism shape at its lower surface.

Figure 60B:
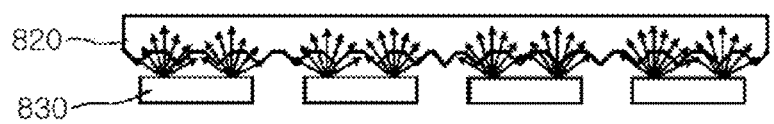

As shown in FIG. 60*b*, light coming from the LED package 830 is not directly output to the light guide plate 820 but is diffused and distributed by the prism shape provided at a lower surface of the front end portion of the plate type light guide plate. Accordingly, a hot spot generated at the light guide plate above the LED light source can be removed.

Figure 61:
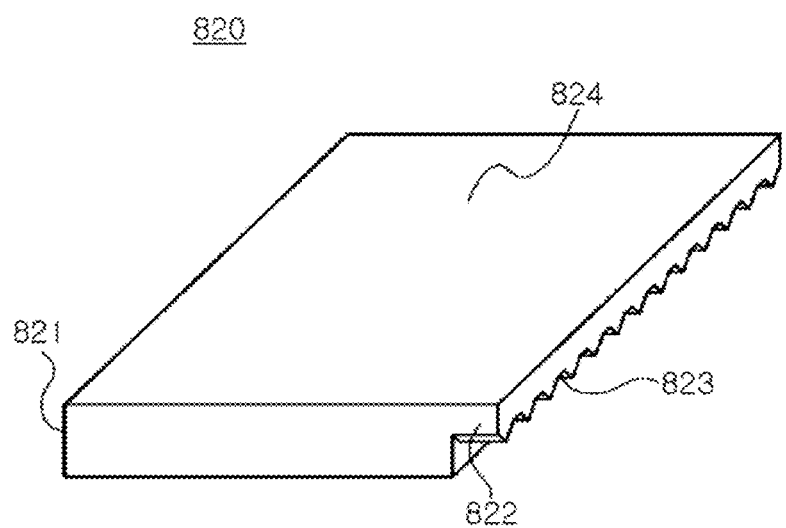
FIG. 61 is a schematic perspective view for explaining the plate type light guide plate of FIG. 60.

FIG. 61 is a schematic perspective view for explaining the plate type light guide plate of FIG. 60. As shown in FIG. 61, the plate type light guide plate includes a light input portion 821 to which light coming from the LED light source including a plurality of LED packages is made incident, a light output face 824 from which the light which has been made incident to the light input portion 821 is output as illumination light to the liquid crystal panel, and a front end portion 822 being at the opposite side of the light input portion 821 and having a section with a thickness smaller than the light incident section of the light input portion 821.

The front end portion 822 has a prism shape 823 for distributing a portion of the light coming from the LED packages arranged at its lower portion. The prism shape 823 may be one of a triangular prism, a conic prism, and a hemispherical prism that can distribute and diffuse incident light.

The prism shape 823 of the front end portion 822 may be formed along the entire front end portion 822. Or, the prism shape 823 may be partially formed only at an upper portion of the LED packages. Through such prism shape, a hot spot generated at the light guide plate above the LED packages can be removed.

Thus, the presence of the prism shape formed on the lower surface of the front end portion of the light guide plate according to the exemplary embodiment of the present invention removes the necessity of processing a diffusion sheet or a prism sheet between the LED package and the light guide plate to distribute a hot spot generated on the light guide plate on the LED package due to a portion of light coming from the LED package.

A backlight unit having the LED package and an LCD according to a ninth exemplary embodiment of the present invention will now be described with reference to FIGS. 62 to 66.

Figure 62:
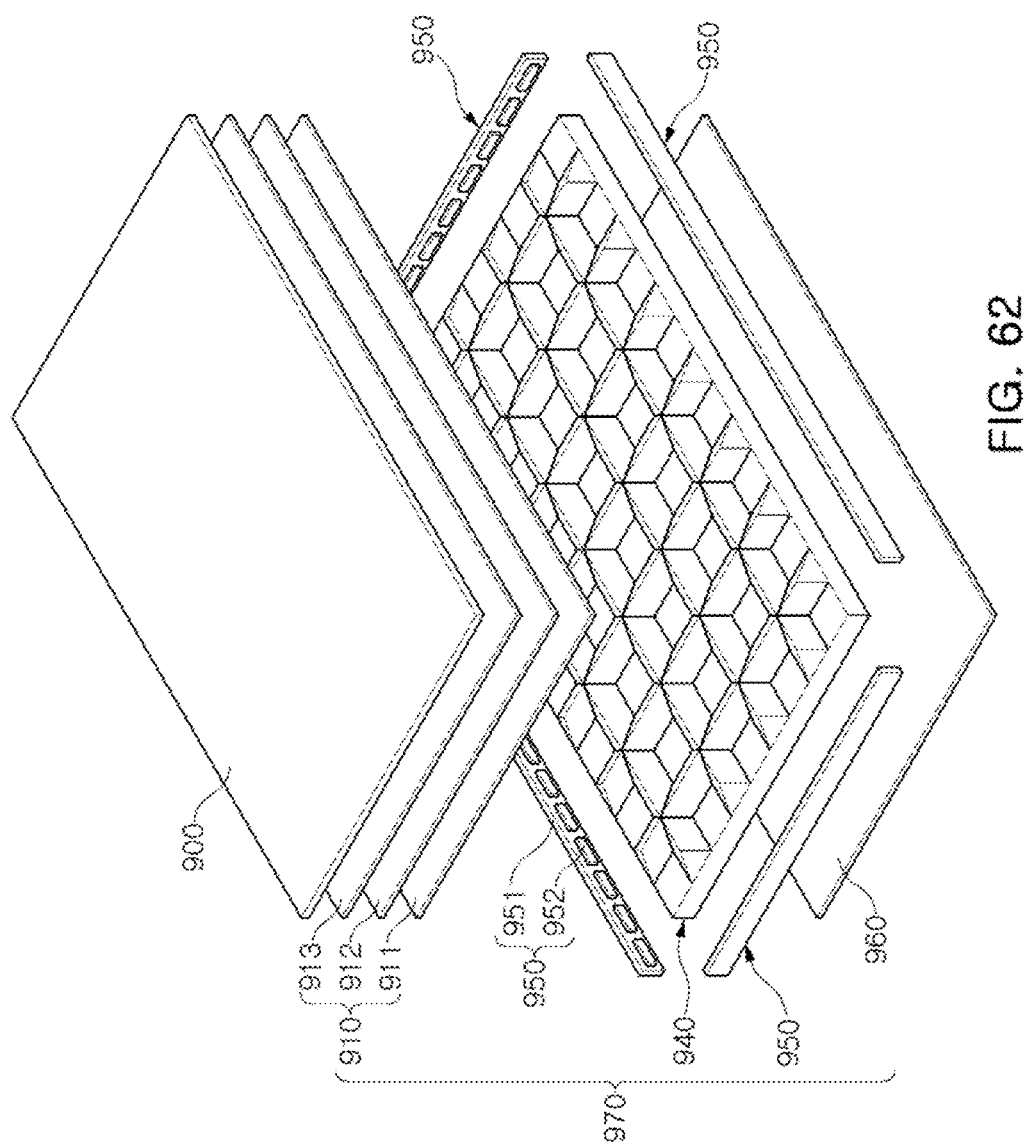
FIG. 62 illustrates a backlight unit including the LED package and a liquid crystal display (LCD) according to a ninth exemplary embodiment of the present invention.

FIG. 62 illustrates a backlight unit including the LED package and a liquid crystal display (LCD) according to a ninth exemplary embodiment of the present invention.

With reference to FIG. 62, the LCD includes a liquid crystal panel 900 for displaying an image and a backlight unit 970. Although not shown, the liquid crystal panel 900 includes first and second substrates which face each other and a liquid crystal layer interposed between the first and second substrates. The first substrate includes a plurality of pixels disposed in a matrix form. Each pixel includes a thin film transistor (TFT) and a pixel electrode electrically connected with the TFT. The first substrate further includes a plurality of wirings, e.g., gate wirings and data wirings, for applying an electrical signal to each pixel. The second substrate includes a color filter layer and a common electrode disposed on the color filter layer. The common electrode forms a liquid crystal driving voltage for driving liquid crystal of the liquid crystal layer along with the pixel electrode. The liquid crystal panel displays an image by controlling the transmittance of light transmitted through the liquid crystal according to the liquid crystal driving voltage.

In the exemplary embodiment, the liquid crystal panel has been described as a TN type liquid crystal panel, but the present invention is not limited thereto and any other types of liquid crystal panels such as an IPS type or VA type liquid crystal panel can be applicable.

The backlight unit 970 includes light source units 950 and a light guide plate 940.

The light source unit 950 includes a light source 952 emitting light and a board 951 including a plurality of circuit patterns for applying voltage to the light source 952.

The light guide plate 940 may be disposed under the liquid crystal panel 900, and the light source unit 950 may be disposed at each side of the light guide plate 940. Namely, the light source unit 950 is disposed at the side of the liquid crystal panel 900. Accordingly, the backlight unit 970 can be fabricated to be thinner.

The light guide plate 940 includes an incident face facing the light source unit 950, an output face bent from the incident face and facing the liquid crystal panel 900, a light focusing pattern (i.e., light collecting pattern) disposed on the output face, and a rear face facing the output face. A plurality of patterns (not shown) may be disposed on the rear face in order to allow light provided to the incident face to proceed to the output face.

The light guide plate 940 may improve the effect, namely, the effect of a contrast ratio, or the like, according to a local dimming driving method by the light focusing pattern.

In addition, the backlight unit 970 may further include an optical member 910 disposed on the light guide plate 940. The optical member 910 may include, for example, a diffusion sheet 911, a prism sheet 912, and a protection sheet 913 disposed on the light guide plate 940.

Although not shown, the backlight unit 970 may further include a lower cover for receiving the light source unit 950, the light guide plate 940, and the like. Here, the backlight unit 970 and the liquid crystal panel 900 may be fixed by the lower cover and an upper cover (not shown) fastened to the lower cover.

Figure 63:
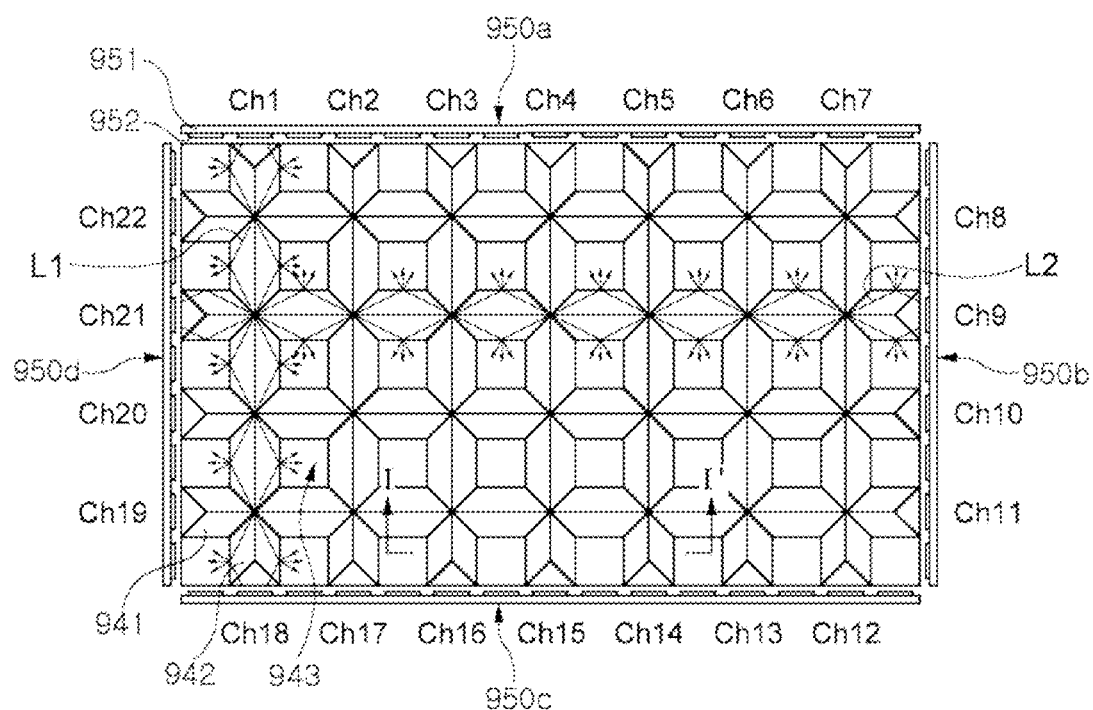
FIG. 63 is a plan view of the backlight unit of FIG. 62.
Figure 64:
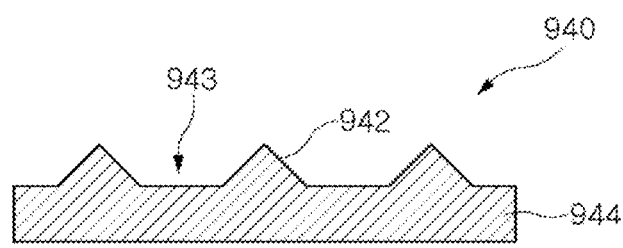
FIG. 64 is a sectional view taken along line I-I of FIG. 63.

FIG. 63 is a plan view of the backlight unit of FIG. 62, and FIG. 64 is a sectional view taken along line I-I' of FIG. 63.

With reference to FIGS. 63 and 64, the backlight unit 970 includes the light source unit 950 and the light guide plate 940.

The light source unit 950 may include first to fourth optical units 950*a*, 950*b*, 950*c*, and 950*d* disposed at the four sides of the light guide plate 940. However, the number of optical units is not limited in the present exemplary embodiment.

The light source 952 may include an LED, a semiconductor device, emitting light when current is applied thereto, and a detailed description thereof will be omitted. However, in the present exemplary embodiment, the light source is not limited to the LED. That is, a lamp such as a CCFL may be used as the light source.

The board 954 allows the plurality of light sources 952 to be mounted thereon, and includes a circuit wiring for providing a light source driving voltage transferred from a light source driving unit (not shown) to the light source 952. In this case, the circuit wiring may be electrically connected with the plurality of light sources 952 separately or by groups, so that the plurality of light sources 952 may be driven separately or by groups. For example, the first light source unit 950a may include first to seventh channels Ch1 to Ch7 separated by circuitry. Each channel may include one or two or more light sources 952 which are mutually electrically connected. Likewise, the second light source unit 950b may include eighth to eleventh channels Ch8 to Ch11, the third light source unit 950c may include twelfth to eighteenth channels Ch12 to Ch18, and the fourth light source unit 950d may include nineteenth to twenty-second channels Ch19 to Ch22. However, in the present exemplary embodiment, the number of channels of each light source unit is not limited.

Here, if a first region of the liquid crystal panel should display a brighter image, the luminance of light sources disposed at the channels corresponding to the first region can be adjusted to provide light having a higher luminance. If a second region of the liquid crystal panel should display a darker image, the luminance of light sources disposed at the channels corresponding to the second region is adjusted to provide light having a lower luminance.

In this manner, as the light source unit 950 includes the plurality of channels that can be independently driven, it can provide light having a selectively adjusted luminance value to a certain region of the optical member 910.

The light guide plate 940 includes a first light focusing pattern 941 disposed on the output face and concentrating light in a first direction, and a second light focusing pattern 942 for concentrating light in a second direction crossing the first direction.

The first and third light source units 950a and 950c may be disposed in a facing manner at both ends of the first light focusing pattern 941. Also, the second and fourth light source units 950b and 950d may be disposed in a facing manner at both ends of the second light focusing pattern 942.

The first and second light focusing patterns 941 and 942 may have a certain pattern protruded from the body 944 of the light guide plate 940. For example, the first and second light focusing patterns 941 and 942 may have a form of a prism pattern. Namely, the first light focusing pattern 941 may be disposed with a first directionality to traverse the upper surface of the light guide plate 940. The second light focusing pattern 942 may be disposed with a second directionality to traverse the upper surface of the light guide plate 940. Here, the first and second light focusing patterns 941 and 942 may have a hemispherical or triangular sectional shape to concentrate light.

In addition, the light guide plate 940 further includes diffusion portions 943 for diffusing light beams output by the first and second light focusing patterns 941 and 942. The diffusion portions 943 may be disposed at left and right sides of the first light focusing pattern 941 and at upper and lower sides of the second light focusing pattern 942. Namely, the diffusion portions 943 may be arranged in a lattice form. The diffusion portions 943 may be formed as a recess surrounded by the first and second light focusing patterns 941 and 942. The diffusion portions 943 diffuse light focused by the first and second light focusing patterns 941 and 942. Namely, light having the luminance value adjusted by the diffusion portions 943 can be uniformly provided to a selective region of the liquid crystal panel 900, and thus, the liquid crystal panel 900 can more smoothly display an image.

Light paths by the first and second light focusing patterns 941 and 942 will now be described.

Light sources 952 disposed at both ends of the first light focusing pattern 941, e.g., the light sources 952 disposed at the first channel Ch1 are turned on. Then, first light L1 formed at the first channel Ch1 is output with a straightness in the first direction by the first light focusing pattern 941. At this time, the first light is diffused by the diffusion portions 943 disposed at left and right sides of the first light focusing pattern 941. Meanwhile, light sources disposed at both ends of the second light focusing pattern 942, for example, the light sources disposed at the ninth channel Ch9 are turned on. Then, second light L2 formed at the ninth channel Ch9 is output with a straightness in the second direction by the second light focusing pattern. At this time, the second light L2 is spread by the diffusion portions 943 disposed at the upper and lower sides of the second light focusing pattern 942.

When the light sources of the first channel Ch1 and the ninth channel Ch9 are simultaneously turned on, the first and second light sources would be repeated at the crossing of the first and second light focusing patterns to output light with brighter luminance than other regions.

In the above description of the exemplary embodiment of the present invention, only the light sources of the first to fourth light source units are driven, but the present invention is not limited thereto and corresponding light source units can be driven together according to the required amount of light. For example, when light sources disposed at the ninth channel are turned on, the light sources disposed at the twenty-first channel Ch21, corresponding to the ninth channel Ch9, may be also simultaneously turned on. Likewise, when light sources disposed at the first channel are turned on, the light sources disposed at the eighteenth channel Ch18, corresponding to the first channel Ch1, may be simultaneously turned on. Accordingly, light with a better luminance can be provided the selected region of the liquid crystal panel. Namely, the brightness degree of an image can be adjusted by selecting channel positions and controlling the ON/OFF operation of the light sources disposed at the channels.

Consequently, because the backlight unit has the first and second light focusing pattern, light having an adjusted luminance value can be focused to a selected region, rather than being distributed to the entire region of the liquid crystal panel, the contrast ratio according to the separation driving effect can be improved.

Figure 65:
FIG. 65 is a screen image displayed as the related art LCD is driven.
Figure 66:
FIG. 66 is a screen image displayed as the LCD according to an exemplary embodiment of the present invention is driven.

FIG. 65 is a screen image displayed as the related art LCD is driven, and FIG. 66 is a screen image displayed as the LCD according to an exemplary embodiment of the present invention is driven.

As shown in FIGS. 65 and 66, it is noted that the contrast ratio and image quality characteristics of the LCD including the first and second light focusing patterns according to the exemplary embodiment of the present invention are superior to that of the related art. Thus, because the backlight unit has the first and second light focusing patterns to provide light with a selectively adjusted luminance value, although the edge type backlight unit employs the local dimming driving scheme, it can sufficiently obtain the local dimming effect.

Therefore, the backlight unit according to the exemplary embodiment of the present invention is advantageous in that it has the local dimming effect, namely, the improved contrast ratio and low power consumption, and is formed to be thinner, which leads to the fabrication of a thinner LCD having good picture quality characteristics.

A backlight unit having the LED package according to a tenth exemplary embodiment of the present invention will now be described with reference to FIG. 67.

Figure 67:
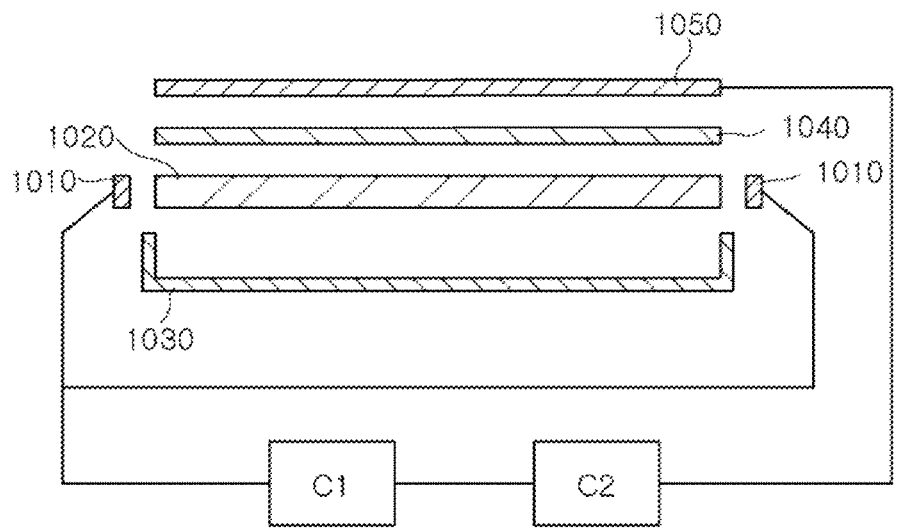
FIG. 67 is a sectional view showing a backlight unit including the LED package according to an exemplary embodiment of the present invention.
Figure 68:
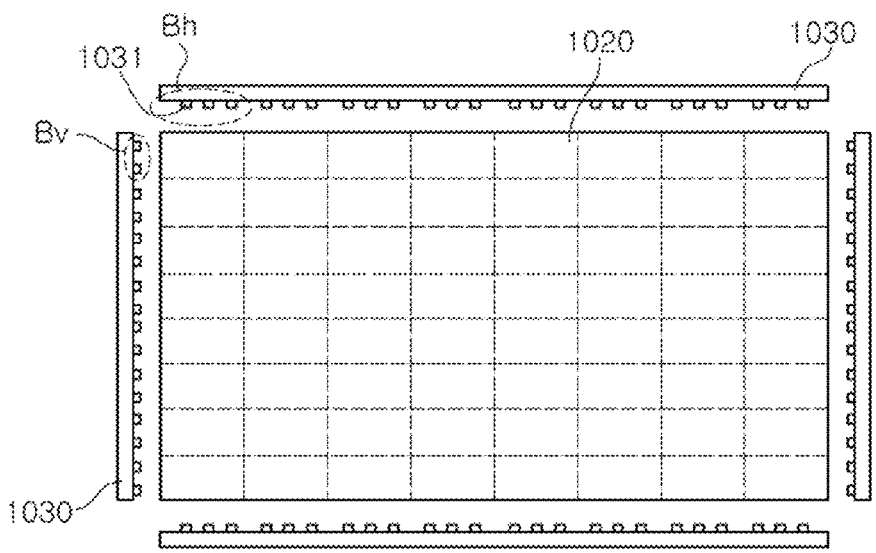
FIG. 68 is a top plan view of an array of the light guide plate and the LED package of FIG. 67.
Figure 69:
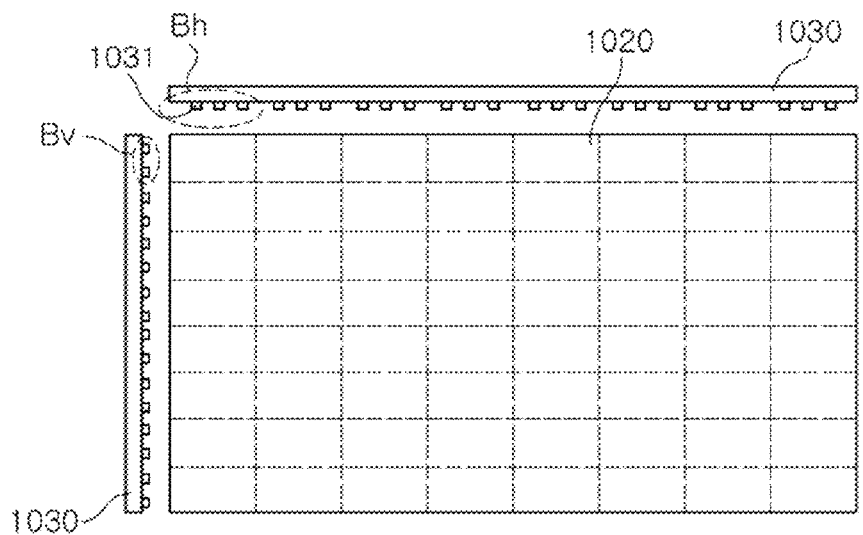
FIG. 69 is a top plan view of an array of a light guide plate and an LED package according to a modification of the exemplary embodiment of FIG. 68.

FIG. 67 is an exploded sectional view showing a backlight unit including the LED package according to an exemplary embodiment of the present invention, FIG. 68 is a top plan view of an array of the light guide plate and the LED package of FIG. 67, and FIG. 69 is a top plan view of an array of a light guide plate and an LED package according to a modification of the exemplary embodiment of FIG. 68.

With reference to FIG. 67, a backlight unit according to the tenth exemplary embodiment of the present invention includes an array of a plurality of LED packages emitting light toward a liquid crystal panel 1050 disposed at an upper portion thereof, a light guide plate 1020, a lower cover 1010, an optical member 1060, and controllers C1 and C2. The controller includes an LED block driving controller C1 and a panel image signal transfer unit C2. This will be described in detail later with reference to FIG. 71.

The lower cover 1010 is generally made of a metal material for the purpose of heat diffusion, in which a board with the LED packages mounted thereon and the other elements constituting the backlight unit such as the light guide plate 1020 and the like are disposed.

The light guide plate 1020 is made of a transparent material to allow light emitted from the LED package array 1030 to pass therethrough, and generally has a regular hexahedron-shaped structure, but the structure of the light guide plate 1020 is not limited thereto. The light guide plate 1020 makes light emitted from its lateral direction spread uniformly to maintain luminance and color uniformity on the liquid crystal panel 1050, and allows incident light to uniformly go straight.

The optical member 1060 is provided at an upper portion of the light guide plate 1020 to improve the luminance by selectively laminating one of a diffusion sheet for diffusing light output to the liquid crystal panel 1050 in various directions or a prism sheet for collecting light output to the liquid crystal panel 1050 into a front viewing angle. The optical member 1060 is not an essential element.

Although not shown, a reflection member may be additionally disposed between the light guide plate 1020 and the lower cover 1010 as necessary.

In the present exemplary embodiment, as for the configuration in which the light guide plate 1020 and the LED package array 1030, the LED package array 1030 including a plurality of LED blocks Bh and Bv is disposed on each of the four sides of the light guide plate 1020.

In this case, light emitted from the vertically perpendicular LED package arrays among the four LED package arrays 1030 disposed at the sides of the light guide plate 1020 may overlap with each other after being input to the light guide plate 1020. In addition, in the present exemplary embodiment, the LED package array 1030 is divided into LED blocks Bh and Bv, so the luminance is controlled by the blocks. It is understood that the regions of the light guide plate are virtually divided as indicated by dotted lines according to the divided blocks.

In detail, the LED blocks Bh and Bv include one or more LED packages 1031, and brightness of each LED block included in the LED package array 1030 may be adjusted by a different current injection signal. In the present exemplary embodiment, the LED block Bh disposed in a horizontal direction based on the drawing to the side of the light guide plate 1020 includes three LED packages 1031, and the LED block Bv disposed in a vertical direction includes two LED packages 1031, but the present invention is not limited thereto and the number of LED packages included in each block can be suitably selected as necessary.

The LED packages 1031 included in the LED blocks Bh and Bv preferably emit white light so as to be used as a dimming unit of an LCD TV or the like, so it can use white LED for emitting white light by itself through combination with a fluorescent material. However, each LED block Bh and Bv may include a blue LED, a green LED, and a red LED according to embodiments.

In this manner, light beams emitted from the horizontal block Bh and the vertical LED block Bv overlap with each other, and in this case, the light beams can be uniformly directed in a straight direction by the light guide plate 1020. Thus, because the light beams emitted from the horizontal LED block Bh and the vertical LED block Bv overlap with each other, the edge type backlight unit according to the present exemplary embodiment can implement local dimming.

This will now be described with reference to FIG. 70. FIG. 70 illustrates the principle of the local dimming implemented in the backlight unit according to an exemplary embodiment of the present invention.

First, FIG. 70a shows the case where two LED package arrays disposed at the sides of the light guide plate in the horizontal and vertical directions, respectively, and in this case, one LED package array has two LED blocks.

On the assumption that each LED block operates in a state (0) in which each LED block does not substantially emit light and in a state (1) in which each LED block emits light without considering the number of LED packages included in each LED block, the light guide plate can be divided into four regions and the luminance of each region can be adjusted as shown in FIG. 70a.

Namely, by emitting only one of the two horizontal LED blocks and only one of the two vertical LED blocks, the relative luminance values of the four divided regions of the light guide plate can be represented by ½, 0, 1(½+½), and ½.

A detailed example will now be described with reference to FIG. 70b.

FIG. 70b shows the case where four LED package arrays are disposed at the side of the light guide plate; two in the horizontal direction and two in the vertical direction, in which the respective two LED package arrays disposed in each direction are disposed to face each other with the light guide plate interposed therebetween. In this case, one LED package array includes three LED blocks. Unlike the case of FIG. 70a, each LED block can operate in three mode of a state (0) in which light is not substantially emitted, an emission state (1), and an intermediate emission state (½).

Accordingly, when the emission state of each of the four LED package arrays is as shown in FIG. 70b, the light guide plate is divided into nine separated driving regions, and the relative luminance value of each region corresponds to ½(⅓+⅙), ⅓(⅙+⅙), ⅔(⅙+⅙+⅓), ⅔(⅓+⅓), ½(⅓+⅙), ⅚(⅓+⅙+⅓), ⅔(⅓+⅙), ⅓(⅙+⅙), and ⅔(⅓+⅙+⅙).

In this manner, the backlight unit according to the present exemplary embodiment can individually adjust the luminance of each LED block included in the LED package arrays disposed at the sides of the light guide plate, thus enabling local dimming. In particular, the number of dividedly driven regions may be determined according to the number of LED blocks, and the luminance level can be adjusted variably according to the number of cases of the emission states and the number (two or four) of LED package arrays. In this case, as the number of cases of the emission states and the number of LED package arrays increase, the local dimming can be more finely adjusted.

Thus, unlike the configuration as illustrated in FIG. 68, such a configuration whereby only two LED package arrays 1030 positioned at the side of the light guide plate 1020 and disposed to be perpendicular can be possible.

As for the driving regions for local dimming, even if the number of driving regions are different (e.g., a rectangular shape), as well as the case in which the number of driving regions are the same in the horizontal axis and in the vertical axis, the local dimming can be possible.

In addition, although it may vary depending on embodiments, when the liquid crystal panel is 40 inches in size, it can be divided into 64 (8×8) driving regions so as to be driven.

When the liquid crystal panel is 46 inches in size, it can be preferably divided into 80 (10×8) regions so as to be driven, and when the liquid crystal panel is 52 inches in size, it can be preferably divided into 96 (12×8) regions so as to be driven.

As described above, the backlight unit according to the present exemplary embodiment features that the luminance value is adjusted by the LED blocks, which can be executed by adjusting the size of a current signal injected to the LED blocks. This will now be described in detail with reference to FIG. 71.

Figure 71:
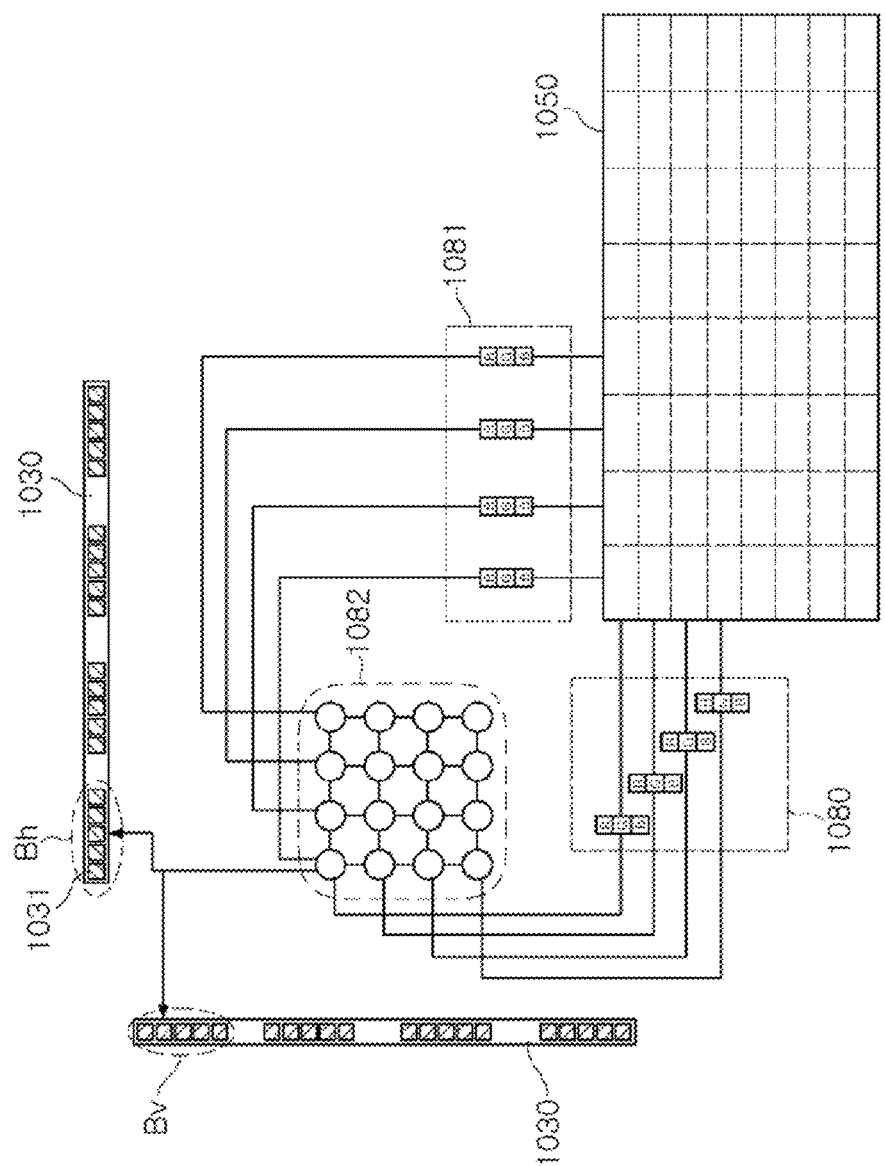
FIG. 71 is a schematic view showing a controller for controlling the luminance of each LED block of the backlight unit according to the exemplary embodiment of the present invention of FIG. 67.

FIG. 71 is a schematic view showing a controller for controlling the luminance of each LED block of the backlight unit according to the exemplary embodiment of the present invention of FIG. 67.

First, a panel image signal transfer unit (C2 in FIG. 67) includes panel information transfer circuits 1080 and 1081 and a panel information combination circuit unit 1082. The panel information transfer circuits 1080 and 1081 receive an image signal of each divided driving region from the liquid crystal panel 1050. In this case, the panel image signal transfer unit includes a vertical axis controller 1080 and a horizontal axis controller 1081, and the received image signal corresponds to an aperture ratio (tilt change of liquid crystal) of the panel according to an electrical signal applied to the liquid crystal panel and R, G, and B color drive signals.

The image signal is integrated in a matrix form in the panel information combination circuit unit 1082 with respect to the horizontal axis and the vertical axis, from which the output power of each of the LED blocks Bh and Bb is determined as indicated by arrows in FIG. 71 through an LED block driving controller (not shown, C1 in FIG. 67).

In this case, as a detailed circuit configuration regarding the panel image signal transfer units and the LED block driving controller constituting the controller, the known circuit configuration connecting the liquid crystal panel and the LED may be used.

In FIG. 71, the respective four horizontal and vertical driving regions, namely, sixteen LED blocks Bh and Bv, are illustrated for the sake of brevity, and in order to control the entire driving regions, the corresponding number of transfer circuit units and the combination circuit unit would be required.

Figure 72:
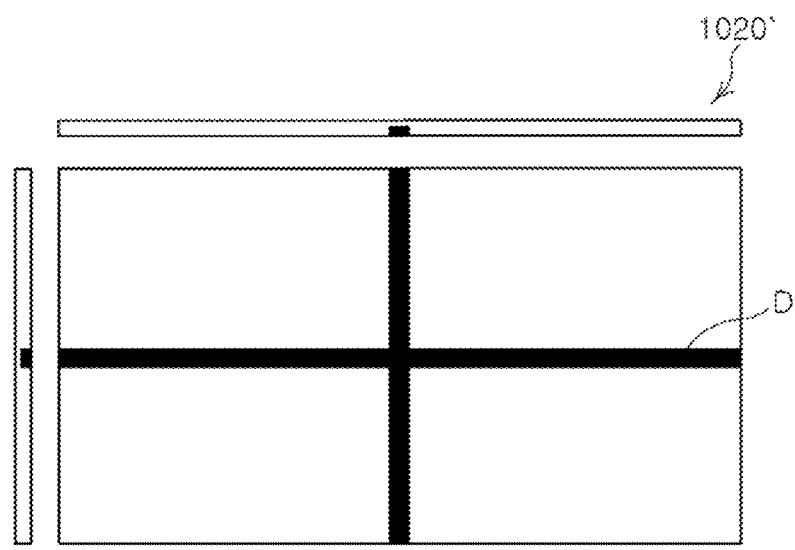
FIG. 72 is a top plan view of a light guide plate that may be employed in a different exemplary embodiment of the present invention of FIG. 67.
Figure 73:
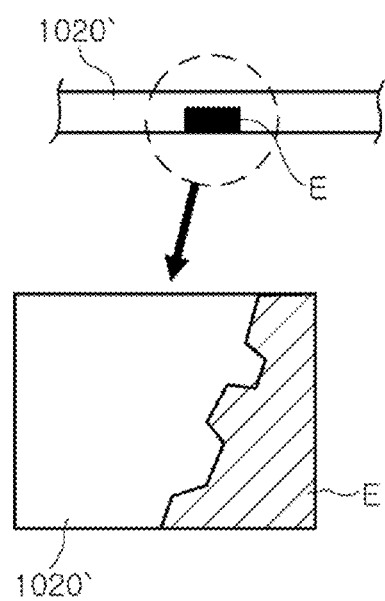
FIG. 73 illustrates an embodiment that can be employed as a light guide plate of FIG. 72.

FIG. 72 is a top plan view of a light guide plate that may be employed in a different exemplary embodiment of the present invention, and FIG. 73 illustrates an embodiment that can be employed as a light guide plate of FIG. 72.

As shown in FIG. 72, a light guide plate 1020' according to the present exemplary embodiment has four regions that can be optically discriminated. Different from the light guide plate which is virtually divided into driving regions in the exemplary embodiment of FIG. 67, the light guide plate 1020' is divided into physically (optically) discriminated regions.

The light guide plate 1020' includes four regions disposed in horizontal and vertical directions which are divided by a separation structure (D) that controls light proceeding, e.g., blocking light proceeding. Accordingly, each region of the light guide plate 1020' divided by the separation structure (D) can be separately driven without mutual interruption, and this can be combined with the individual controlling of each LED block as described above in a former exemplary embodiment to effectively implement local dimming.

In the present exemplary embodiment, the separation structure is a reflection structure made of a material with a high light reflectivity, or may be an irregular (indented) portion (E) formed by making a dent at a boundary point of each separation region as shown in FIG. 73. In addition, a structure in which the light guide plate 1020' itself is separated is also possible.

As described above, as for the backlight unit according to the exemplary embodiments of the present invention, because the backlight unit does not need to have a large thickness like the direct type backlight unit of the related art (namely, in the present invention, light is transmitted to the liquid crystal panel by using the light guide plate), partial driving can be performed and the backlight unit can become thinner. Accordingly, the effect according to the partial driving (e.g., the increase in the contrast ratio according to the local dimming method, the clear picture quality can be sufficiently obtained, and a product can become thinner.

As set forth above, according to exemplary embodiments of the invention, the LED package may be used compatibly as an edge type LED package and a direct type LED package by the lead frame including a side electrode, a bent portion, and a top electrode, and in this case, because the side electrode or the top electrode is formed in an elongated manner to increase a contact area with a substrate, the LED package can be more stably mounted.

In addition, because the LED package includes a contact portion, its substrate-mounting structure takes a larger mounting area to ensure a stable structure, and because heat generated from the contact area is externally released, a heat releasing efficiency can be increased.

Accordingly, the backlight unit using a tandem type structure can employ a local dimming driving method, whereby brightness can be partially changed to improve brightness on a screen image and reduce power consumption.

Moreover, because the backlight unit can compatibly (extensively) use the edge type LED package and the direct type LED package, the freedom of design of the backlight unit can be enhanced.

While the present invention has been shown and described in connection with the exemplary embodiments, it will be apparent to those skilled in the art that modifications and variations can be made without departing from the spirit and scope of the invention as defined by the appended claims.

The invention claimed is:

1. A light emitting diode (LED) package comprising:
a main body mounted on a board, the main body having an opening;
a light emitting diode (LED) that is mounted in the main body and emits light; and
a lead frame exposed to allow the main body to be selectively top-mounted or side-mounted,
wherein the lead frame extends along at least three sides of the main body that intersect with each other,
wherein portions of the lead frame that extend along the at least three sides of the main body define an area that includes the LED,
wherein the lead frame is bent to be dented inwardly toward an inside of the main body to have an inwardly dented portion for receiving the LED therein, and a rear surface of the inwardly dented portion of the lead frame is exposed outside from a rear surface of the main body, and the inwardly dented portion and the LED received therein are exposed outside from a front surface of the main body through the opening, and wherein the lead frame comprises a top electrode electrically connected with the board to allow the LED to be mounted to be parallel to a front surface of the board;
a bent portion integrally formed with the top electrode and bent toward a different side from the top electrode; and
a side electrode formed at an end portion of the bent portion and electrically connected to the board to allow the LED to be mounted to be perpendicular to the board.

2. The LED package of claim 1, wherein the side electrode is mounted at one side of the main body.

3. The LED package of claim 2, wherein the top electrode is formed in an elongated manner on a lower surface of the main body.

4. The LED package of claim 1, wherein the top electrode is mounted at one side of the main body.

5. The LED package of claim 4, wherein the side electrode is formed in an elongated manner on another side of the main body.

6. A light emitting diode (LED) package comprising:
a main body mounted on a board, the main body having an opening;
an LED mounted in the main body;
a lead frame electrically connected with the LED; and
a contact portion formed on a surface of the main body and providing a mounting area to be mounted on the board,
wherein the lead frame extends along at least three sides of the main body that intersect with each other,
wherein portions of the lead frame that extend along the at least three sides of the main body define an area that includes the LED,
wherein the lead frame is bent to be dented inwardly toward an inside of the main body to have an inwardly dented portion for receiving the LED therein, and a rear surface of the inwardly dented portion of the lead frame is exposed outside from a rear surface of the main body, and the inwardly dented portion and the LED received therein are exposed outside from a front surface of the main body through the opening, and wherein the lead frame comprises:
a top electrode electrically connected with the board to allow the LED to be mounted to be parallel to a front surface of the board;
a bent portion integrally formed with the top electrode and bent toward a different side from the top electrode; and
a side electrode formed at an end portion of the bent portion and electrically connected to the board to allow the LED to be mounted to be perpendicular to the board.

7. The LED package of claim 6, wherein the lead frame is exposed to allow the main body to be side-mounted or top-mounted.

8. The LED package of claim 6, wherein the side electrode is mounted at one side of the main body.

9. The LED package of claim 8, wherein the top electrode is formed in an elongated manner on a lower surface of the main body.

10. The LED package of claim 6, wherein the top electrode is mounted at one side of the main body.

11. The LED package of claim 10, wherein the side electrode is formed in an elongated manner on another side of the main body.

12. The LED package of claim 6, wherein the contact portion is formed at a central portion of the main body.

13. The LED package of claim 6, wherein the contact portion is mounted at a side of the main body and has an end bent toward the board.

14. The LED package of claim 6, wherein the contact portion and the lead frame are integrally formed.

15. A backlight unit comprising:
a light guide plate configured to allow a light to proceed to a liquid crystal panel; and
a light emitting diode (LED) package comprising:
a main body mounted on a board, the main body having an opening,
an LED mounted in the main body and generating the light, and
a lead frame exposed to allow the main body to be selectively top-mounted or side-mounted, and being mounted on the light guide plate,
wherein the lead frame extends along at least three sides of the main body that intersect with each other,
wherein portions of the lead frame that extend along the at least three sides of the main body define an area that includes the LED,
wherein the lead frame is bent to be dented inwardly toward an inside of the main body to have an inwardly dented portion for receiving the LED therein, and a rear surface of the inwardly dented portion of the lead frame is exposed outside from a rear surface of the main body, and the inwardly dented portion and the LED received therein are exposed outside from a front surface of the main body through the opening, and wherein the lead frame comprises:
a top electrode electrically connected with the board to allow the LED to be mounted to be parallel to a front surface of the board;
a bent portion integrally formed with the top electrode and bent toward a different side from the top electrode; and
a side electrode formed at an end portion of the bent portion and electrically connected to the board to allow the LED to be mounted to be perpendicular to the board.

16. The backlight unit of claim 15, further comprising:
a contact portion formed on the surface of the main body and providing a mounting area to be mounted on the board.

17. The backlight unit of claim 16, wherein the contact portion and the lead frame are integrally formed.

18. The backlight unit of claim 16, wherein the contact portion is formed at a central portion of the main body.

19. The backlight unit of claim 16, wherein the contact portion is mounted at a side of the main body and has an end portion bent toward the board.

20. The backlight unit of claim 15, wherein a plurality of light guiding plates are integrally formed.

21. The backlight unit of claim 15, further comprising:
a reflection plate disposed at a lower portion of the light guide plate.

22. The backlight unit of claim 15, further comprising:
an optical sheet disposed at an upper portion of the light guide plate.

23. A light emitting diode (LED) package comprising:
a main body, the main body having an opening;
an LED that is mounted in the main body and emits light; and
a lead frame comprising:
a first lead part on which the LED is mounted, and
a side electrode along a first side of the main body that is perpendicular to the first lead part, wherein the side electrode is electrically connected to the first lead part, and is exposed to be electrically connectable to a board such that the main body is side-mountable on the board to perpendicularly dispose the LED to the board, wherein portions of the lead frame that extend along at least three sides of the main body define an area that includes the LED,
wherein the first lead part is bent to be dented inwardly toward an inside of the main body to have an inwardly dented portion for receiving the LED therein, and a rear surface of the inwardly dented portion of the first lead part is exposed outside from a rear surface of the main body, and the inwardly dented portion and the LED received therein are exposed outside from a front surface of the main body through the opening,
wherein the lead frame further comprises a top portion along a second side of the main body, perpendicular to the first side,
wherein the top portion is electrically connected to the first lead part by electrically conductive wiring, and
wherein the top portion is a top electrode exposed to be electrically connectable to the board such that the main body is top-mountable on the board.

24. The LED package of claim 23, wherein:
the lead frame further comprises a bent portion integrally formed with the top electrode and bent toward a different side from the top electrode and from the first side; and
the side electrode is at an end of the top portion.

25. The LED package of claim 24, wherein the side electrode, the bent portion, and the top electrode are integrally formed.

26. The LED package of claim 25, wherein the side electrode is mounted at one side of the main body.

27. The LED package of claim 26, wherein the top electrode is formed in an elongated manner on a lower surface of the main body.

28. The LED package of claim 25, wherein the top electrode is mounted at one side of the main body.

29. The LED package of claim 28, wherein the side electrode is formed in an elongated manner on the first side of the main body.

30. The LED package of claim 23, wherein the side electrode is connected to the first side of the main body and is separated from the first lead part.

31. The LED package of claim 30, wherein the lead frame further comprises another side electrode along the first side of the main body and exposed to be electrically connectable to the board such that the main body is side-mountable on the board to perpendicularly dispose the LED to the board, wherein the other side electrode is separated from the side electrode and is connected to the first lead part.

32. The LED package of claim 30, wherein the lead frame further comprises a second lead part, parallel to the first lead part along a same side of the main body, that is separated from the first lead part and is connected to the side electrode.

* * * * *